(12) United States Patent
Partridge et al.

(10) Patent No.: US 7,369,004 B2
(45) Date of Patent: May 6, 2008

(54) MICROELECTROMECHANICAL OSCILLATOR AND METHOD OF OPERATING SAME

(75) Inventors: Aaron Partridge, Cupertino, CA (US); Bernhard E. Boser, Berkeley, CA (US); Crist Y. Lu, Fremont, CA (US); Markus Lutz, Los Altos, CA (US); Paul Merritt Hagelin, Saratoga, CA (US)

(73) Assignee: SiTime, Corporation, Sunnyvale, CA (US)

( * ) Notice: Subject to any disclaimer, the term of this patent is extended or adjusted under 35 U.S.C. 154(b) by 0 days.

(21) Appl. No.: 11/493,704

(22) Filed: Jul. 26, 2006

(65) Prior Publication Data

US 2007/0290764 A1    Dec. 20, 2007

Related U.S. Application Data

(62) Division of application No. 11/453,314, filed on Jun. 14, 2006.

(51) Int. Cl.
*H03B 5/30* (2006.01)
*H03B 5/40* (2006.01)

(52) U.S. Cl. ............................ 331/156; 331/116 M
(58) Field of Classification Search ........... 331/116 M, 331/154, 156
See application file for complete search history.

(56) References Cited

U.S. PATENT DOCUMENTS

| | | | |
|---|---|---|---|
| 4,415,870 A | 11/1983 | Zumsteg | |
| 4,489,289 A | 12/1984 | Slobodnik et al. | |
| 4,868,524 A | 9/1989 | Costlow et al. | |
| 5,309,116 A | 5/1994 | Stone | |
| 6,557,419 B1 | 5/2003 | Herb et al. | |
| 6,995,622 B2 * | 2/2006 | Partridge et al. | 331/66 |
| 7,248,128 B2 * | 7/2007 | Mattila et al. | 331/175 |

OTHER PUBLICATIONS

"Room Temperature Dual-Mode Oscillator", Torrealba et al., Electronics Letters, Jan. 19, 2006, vol. 42, No. 2, pp. 99-100.
"Cryogenic Dual-Mode Resonator for a Fly-Wheel Oscillator for a Caesium Frequency Standard", Tobar et al., IEEE Transactions on Ultrasonics, Ferroelectrics, and Frequency Control, vol. 49, No. 10, Oct. 2002, pp. 1340-1355.
"Second Generation 50 K Dual-Mode Sapphire Oscillator", Antsie et al, IEEE Transactions on Ultrasonics, Ferroelectrics, and Frequency Control, vol. 53, No. 2, Feb. 2006, pp. 284-266.

(Continued)

*Primary Examiner*—Robert J. Pascal
*Assistant Examiner*—James Goodley
(74) *Attorney, Agent, or Firm*—Patterson & Sheridan, L.L.P.

(57) ABSTRACT

There are many inventions described and illustrated herein. In one aspect, the present inventions relate to a temperature measurement system comprising (1) a first microelectromechanical resonator to generate a first output signal having a frequency that varies with operating temperature, wherein the first microelectromechanical resonator includes a frequency function of temperature; (2) a second microelectromechanical resonator to generate a second output signal having a frequency that varies with operating temperature, wherein the second microelectromechanical resonator includes a frequency function of temperature; and (3) frequency division circuitry, coupled to the first and second microelectromechanical resonators, to determine data which is representative of the operating temperature of the first and/or second microelectromechanical resonator using (i) data which is representative of the frequency of the first output signal and (ii) data which is representative of the frequency of the second output signal. The frequency division circuitry may include circuitry to divide the frequency of the first output signal by the frequency of the second output signal (whether in digital or analog domain).

30 Claims, 88 Drawing Sheets

OTHER PUBLICATIONS

"Improving the Frequency Stability of Microwave Oscillators by Utilizing the Dual-Mode Sapphire-Loaded Cavity Resonator", Tobar et al., Measurement Science and Technology 13 (2002), pp. 1284-1288.

"New Method to Build a High Stability Sapphire Oscillator from the Temperature Compensation of the Difference Frequ3ency Between Modes of Orthogonal Polarization", Tobar et al., IEEE Transactions on Ultrasonics, Ferroelectrics, and Frequency Control, vol. 50, No. 3 Mar. 2003, pp. 214-219.

"Temperature-Insensitive Dual-Mode Resonant—A Review", Vig, IEEE Sensors Journal, vol. 1, No. 1, June. 2001, pp. 62-68.

"Resonator Self-Tempearure-Sending Using a Dual-Harmonic-Mode Crystal Oscillator", Schodowski, 43$^{rd}$ Annual Symposium on Frequency Control, 1989, pp. 2-7.

"A Microcomputer-Compensated Crystal Oscillator Using a Duel-Mode Resonator", Benjaminson et al., 43$^{rd}$ Annual Symposium on Frequency Control, 1989, pp. 20-26.

"Beat Frequency Oscillator R7077", Robinson, Ray, http://www.shirc.mg.ed.au/~robinson/museum/AWA_BFO.html, Oct. 18, 2005, 4 pages.

"Design and Realisation of a 100MHz Synthesis Chain from an X-Band Reference Signal", Lardet-Vieudrin et al., , Joint Meeting 2003 IEEE International Frequency Control Symposium & 17$^{th}$ European Frequency and Time Forum, Tampa, USA, May 5-8, 2003, pp. 560-564.

"Multiple Mode Micromechanical Resonators", Brennen et al., Proc. IEEE Micro Electro Mechanical Systems Workshop (1990), pp. 9-14.

"Aging of Dual Mode Resonator for Microcomputer Compensated Crystal Oscialltor", Kim, Y., IEEE 2005, pp. 171-175.

"Digital Recursive Oscillator with Reduced Frequency versus Temperature Dependency Utilizing a Dual-Mode Crystal Oscillator", Stofanik et al., IEEE 2005, pp. 517-521.

* cited by examiner

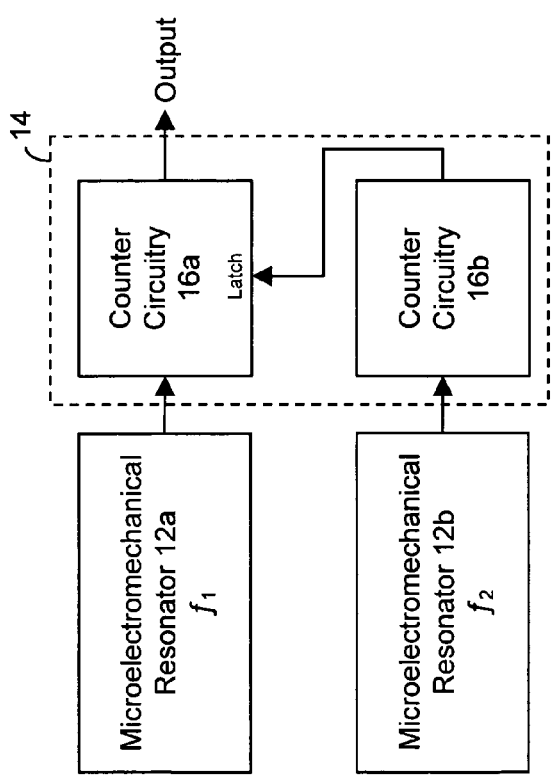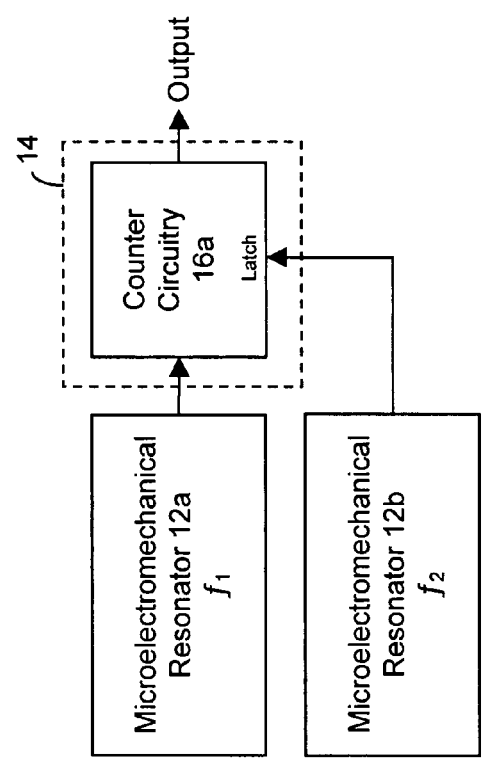
FIGURE 5J

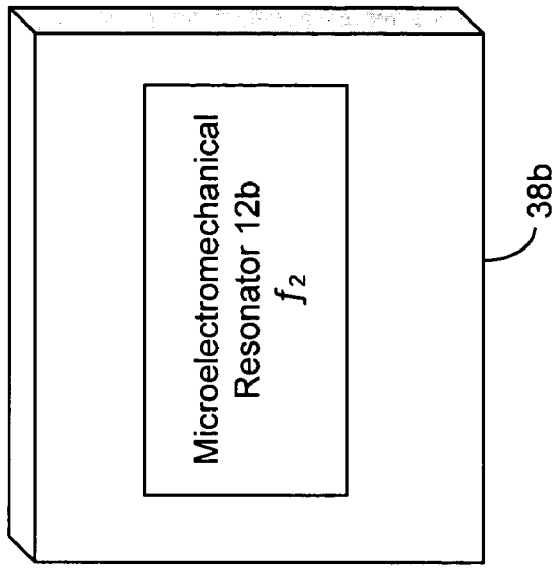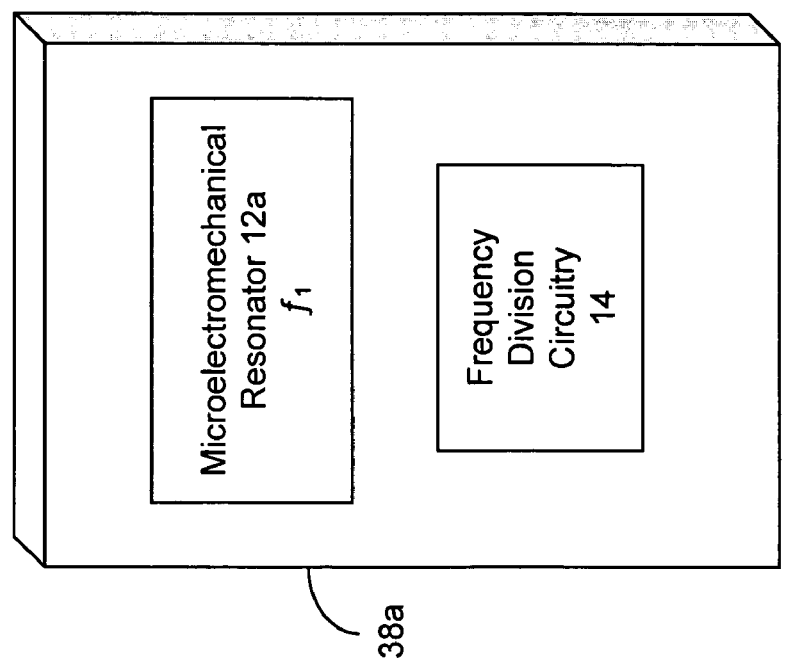
FIGURE 8D

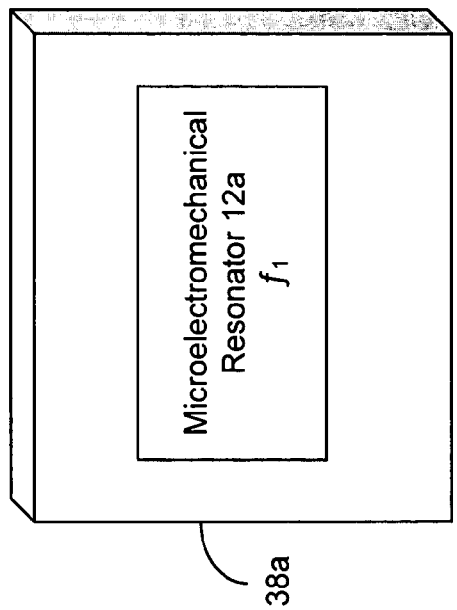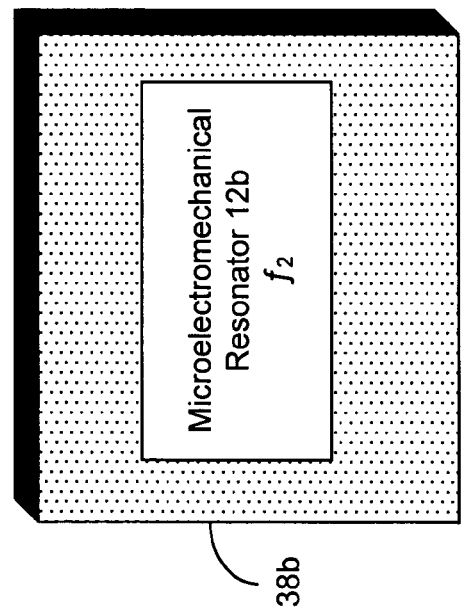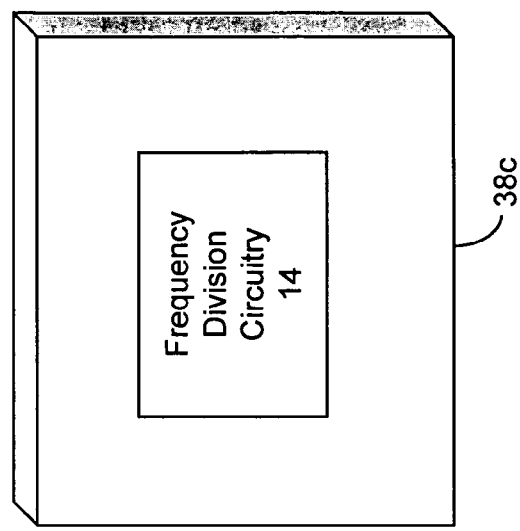
FIGURE 8G

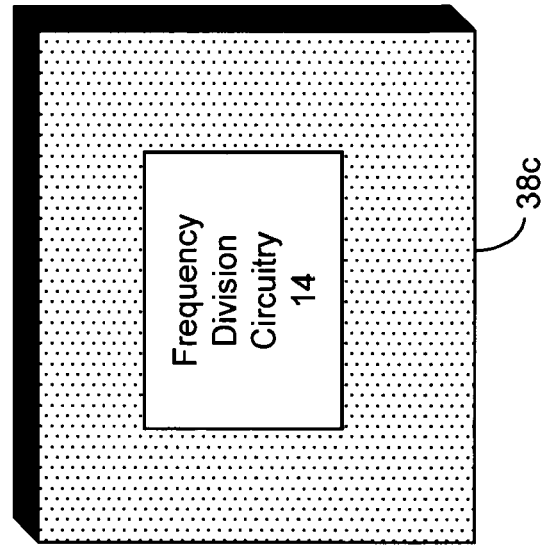
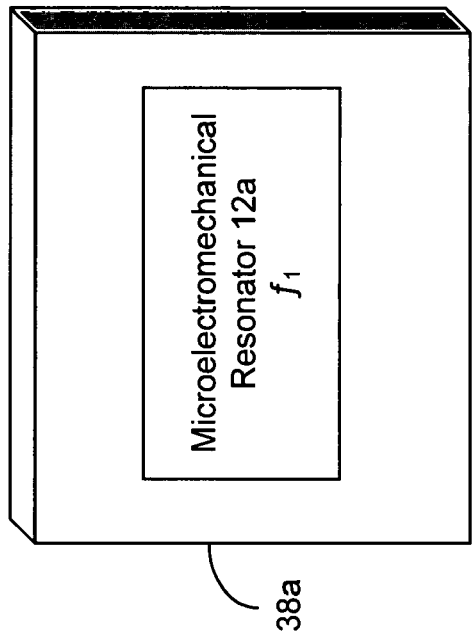
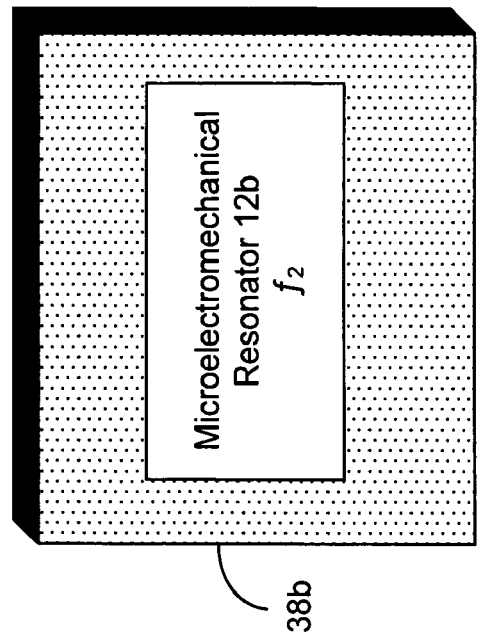
FIGURE 8H

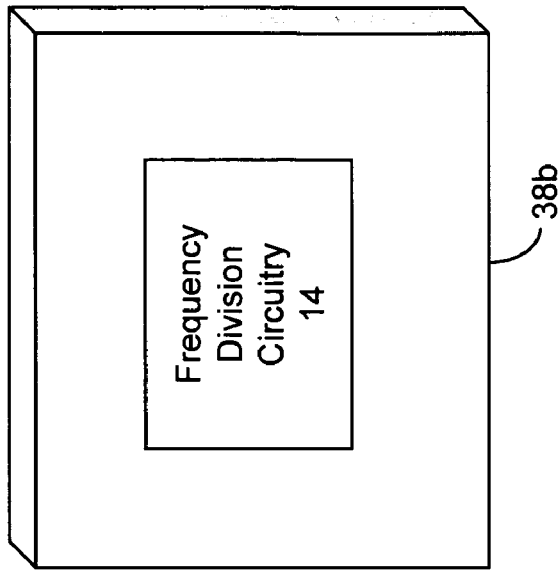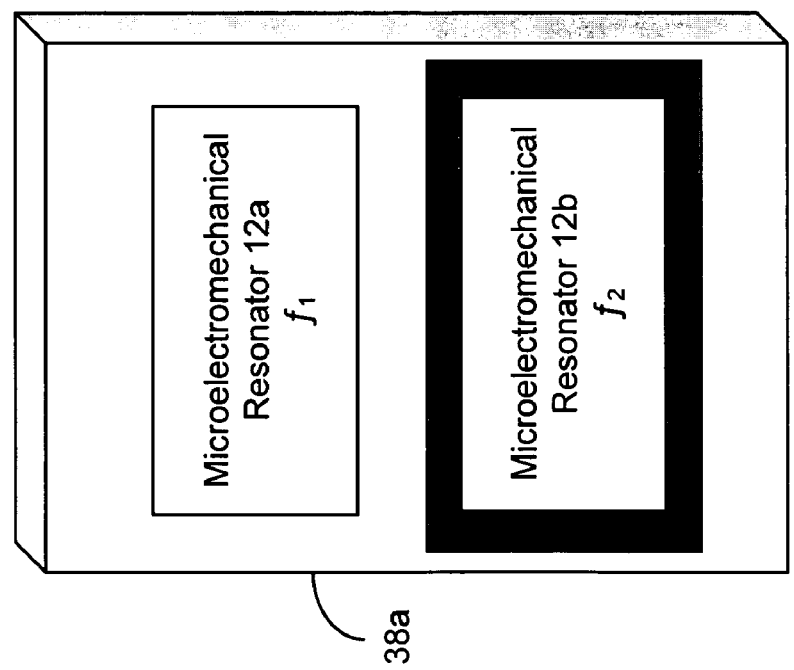
FIGURE 81

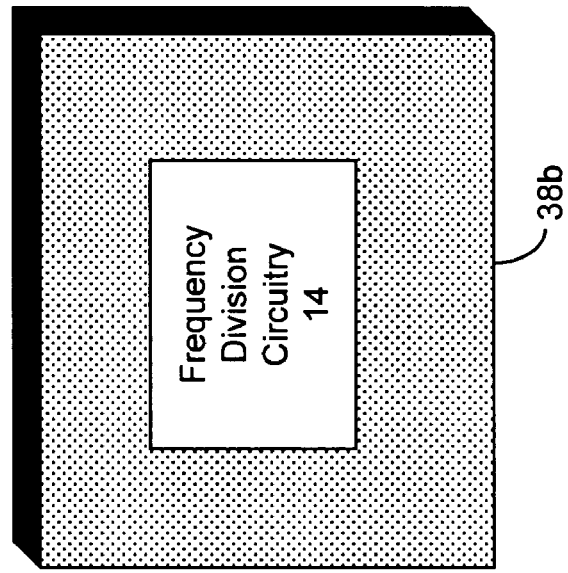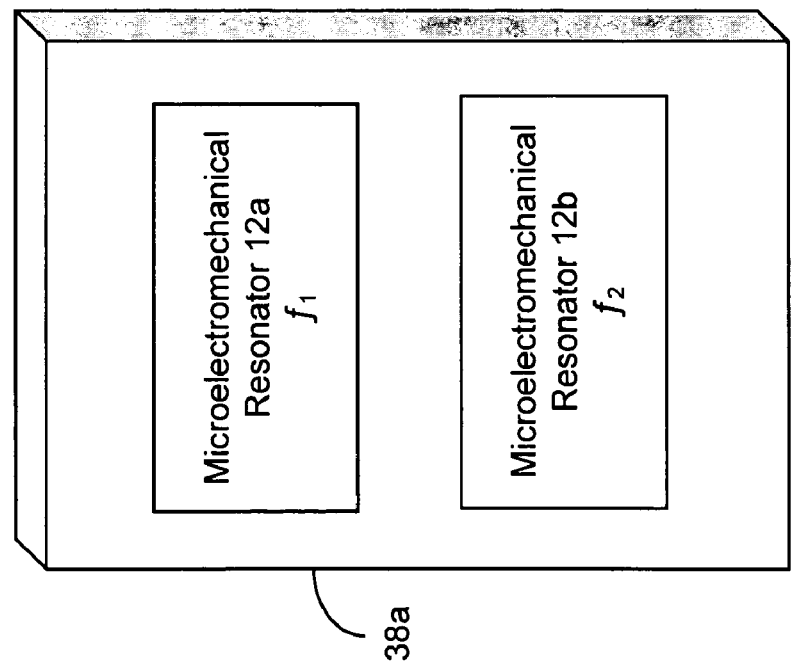
FIGURE 8J

MICROELECTROMECHANICAL OSCILLATOR AND METHOD OF OPERATING SAME

RELATED APPLICATION

This application is a divisional application of application Ser. No. 11/453,314, filed on Jun. 14, 2006 (still pending), the contents of which are incorporated herein by reference.

BACKGROUND

There are many inventions described and illustrated herein. In one aspect, the inventions relate to microelectromechanical and/or nanoelectromechanical (collectively hereinafter "microelectromechanical") structures and devices/systems including same; and more particularly, in one aspect, to temperature measurement systems and/or oscillator systems employing microelectromechanical resonating structures, and methods to control and/or operate same.

Microelectromechanical systems, for example, gyroscopes, oscillators, resonators and accelerometers, utilize micromachining techniques (i.e., lithographic and other precision fabrication techniques) to reduce mechanical components to a scale that is generally comparable to microelectronics. Microelectromechanical systems typically include a microelectromechanical structure fabricated from or on, for example, a silicon substrate using micromachining techniques. The operation and the response of the microelectromechanical structures depend, to a significant extent, on the operating temperature of the structure.

Where the microelectromechanical system is, for example, a resonator, which is fabricated from or on silicon, the performance of the microelectromechanical resonator is dependent on the operating temperature of the resonator. In this regard, temperature fluctuations may result in, for example, changes in (i) microelectromechanical resonator geometry, (ii) microelectromechanical resonator mass, (iii) stresses or strains on the microelectromechanical resonator (for example, changes in stresses/strains due to, among other things, the thermal coefficient of expansion of the resonator, substrate and/or packaging (if any)), and (iv) the material properties of the resonator. Among thermally-induced changes, the elastic sensitivity of silicon to temperature often dominates in many silicon-based microelectromechanical resonator designs, which often results in a resonator frequency shift in the range of about −20 ppm/C to about −30 ppm/C.

As is well understood, the Young's modulus for most materials of interest changes with temperature according to known thermal coefficients. For example, polysilicon has a first-order thermal coefficient of −75 ppm/C. Furthermore, the geometry of a beam structure also changes with temperature, generally expanding with increasing temperature. Again, as an example, polysilicon has a thermal expansion coefficient of 2.5 ppm/C.

For some beam designs and related modeling purposes, and given a material with an isotropic thermal coefficient of expansion, the effect of thermal expansion of the width of the beam is somewhat offset by the effect of thermal expansion of the length of the beam. While it may be possible to compensate for some thermally-induced changes in the resonator based on the coefficient of thermal expansion, the shift in Young's modulus over temperature generally dominates in many resonator designs.

Setting aside electrostatic forces, the resonance frequency (f) of a beam may be characterized under these assumptions by the equation:

$$f = \frac{1}{2\pi}\sqrt{\frac{k_{eff}}{m_{eff}}}$$

where $k_{eff}$ is the effective stiffness of the beam, and $m_{eff}$ is the effective mass of the beam which is often constant over temperature.

The resonance frequency of the microelectromechanical resonator does not typically remain stable over a range of operating temperatures because of, among other things, thermally induced changes to the Young's modulus (or other variables). Such changes tend to change in the mechanical stiffness of the beam which tend to cause considerable drift or change in the frequency of the output of the resonator. (See, for example, FIG. 1).

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to a temperature measurement system, comprising (1) a first microelectromechanical resonator to generate a first output signal having a frequency that varies with operating temperature, wherein the first microelectromechanical resonator includes a frequency function of temperature, and (2) a second microelectromechanical resonator to generate a second output signal having a frequency that varies with operating temperature, wherein the second microelectromechanical resonator includes a frequency function of temperature. The temperature measurement system further includes frequency division circuitry, coupled to the first and second microelectromechanical resonators, to determine data which is representative of the operating temperature of the first and/or second microelectromechanical resonator using (i) data which is representative of the frequency of the first output signal and (ii) data which is representative of the frequency of the second output signal.

The frequency division circuitry, in one embodiment, includes circuitry to divide the frequency of the first output signal by the frequency of the second output signal in a digital or analog domain. The frequency division circuitry may include analog-to-digital converter (ADC) circuitry, counter circuitry, pulse width modulation circuitry, amplitude or threshold detection circuitry and/or frequency to voltage converter circuitry. Indeed, frequency conversion circuitry may be any circuitry and/or architecture, whether now known or later developed, which converts the frequency to a signal which is representative of the frequency. Notably, the signal may be (i) analog or digital, and (ii) current or voltage.

In one embodiment, the frequency division circuitry further includes (1) first counter circuitry, coupled to first microelectromechanical resonator, to generate the data which is representative of the frequency of the first output signal, (2) second counter circuitry, coupled to second microelectromechanical resonator, to generate the data which is representative of the frequency of the second output signal, and (3) analysis circuitry, coupled to the first and second counter circuitry, to divide the data which is representative of the frequency of the first output signal by the data which is representative of the frequency of the second output signal.

In another embodiment, the frequency division circuitry further includes (1) first counter circuitry, coupled to first microelectromechanical resonator, to generate the data which is representative of the frequency of the first output signal, (2) second counter circuitry, coupled to second microelectromechanical resonator, to generate the data which is representative of the frequency of the second output signal, and (3) analysis circuitry, coupled to the first and second counter circuitry, to determine the data which is representative of the operating temperature of the first and/or second microelectromechanical resonators by dividing (i) the data which is representative of the frequency of the first output signal by (ii) the data which is representative of the frequency of the second output signal.

In another embodiment, the frequency division circuitry includes (1) first frequency to voltage converter circuitry, coupled to first microelectromechanical resonator, to generate the data which is representative of the frequency of the first output signal, (2) second frequency to voltage converter circuitry, coupled to second microelectromechanical resonator, to generate the data which is representative of the frequency of the second output signal, and (3) analog to voltage divider circuitry, coupled to the first and second frequency to voltage converter circuitry, to determine the data which is representative of the operating temperature of the first and/or second microelectromechanical resonator using (i) the data which is representative of the frequency of the first output signal and (ii) the data which is representative of the frequency of the second output signal.

The temperature measurement system may also include processor circuitry, coupled to the frequency division circuitry, to determine the operating temperature of the first microelectromechanical resonator and/or the second microelectromechanical resonator using the data which is representative of the operating temperature of the first and/or second microelectromechanical resonators. The processor circuitry may determine the operating temperature of the first microelectromechanical resonator and/or the second microelectromechanical resonator using a look-up table and/or a mathematical relationship.

Notably, the first microelectromechanical resonator and the second microelectromechanical resonator may be the same physical structure. Moreover, the first microelectromechanical resonator and the second microelectromechanical resonator may include different crystalline orientations or directions in or on the same substrate.

In another aspect, the present inventions are directed to a temperature measurement system, comprising (1) a first microelectromechanical resonator to generate a first output signal having a frequency that varies with operating temperature, wherein the first microelectromechanical resonator includes a frequency function of temperature, (2) a second microelectromechanical resonator to generate a second output signal having a frequency that varies with operating temperature, wherein the second microelectromechanical resonator includes a frequency function of temperature. The temperature measurement system of this aspect also includes frequency division circuitry, coupled to the first and second microelectromechanical resonators, wherein the frequency division circuitry includes (1) circuitry to generate (i) data which is representative of the frequency of the first output signal and (ii) data which is representative of the frequency of the second output signal, and (2) analysis circuitry. The analysis circuitry may determine data which is representative of the operating temperature of the first and/or second microelectromechanical resonators by dividing (i) the data which is representative of the frequency of the first output signal by (ii) the data which is representative of the frequency of the second output signal.

In this aspect, processor circuitry, coupled to the frequency division circuitry, determines the operating temperature of the first and/or second microelectromechanical resonator using the data which is representative of the operating temperature of the first and/or second microelectromechanical resonators. The processor circuitry may determine the operating temperature of the first microelectromechanical resonator and/or the second microelectromechanical resonator using a look-up table and/or a mathematical relationship The frequency division circuitry, in one embodiment, includes circuitry to divide the frequency of the first output signal by the frequency of the second output signal in a digital or analog domain. The frequency division circuitry may include analog-to-digital converter (ADC) circuitry, counter circuitry, pulse width modulation circuitry, amplitude or threshold detection circuitry and/or frequency to voltage converter circuitry. Indeed, frequency conversion circuitry may be any circuitry and/or architecture, whether now known or later developed, which converts the frequency to a signal which is representative of the frequency. The output signal of the frequency division circuitry may be (i) analog or digital, and (ii) current or voltage.

Notably, the first microelectromechanical resonator and the second microelectromechanical resonator may be the same physical structure. Moreover, the first microelectromechanical resonator and the second microelectromechanical resonator may include different crystalline orientations or directions in or on the same substrate.

In yet another aspect, the present inventions are directed to a temperature measurement system as in either of the previously mentioned aspects (see above) wherein the first and second microelectromechanical resonators are disposed on and/or in the same substrate and the frequency division circuitry and the processor circuitry are disposed on or in the same substrate. Indeed, in one embodiment, the first and second microelectromechanical resonators, the frequency division circuitry and the processor circuitry are disposed on or in the same substrate.

The frequency division circuitry, in one embodiment, includes circuitry to divide the frequency of the first output signal by the frequency of the second output signal in a digital or analog domain. The frequency division circuitry may include analog-to-digital converter (ADC) circuitry, counter circuitry, pulse width modulation circuitry, amplitude or threshold detection circuitry and/or frequency to voltage converter circuitry. Indeed, frequency conversion circuitry may be any circuitry and/or architecture, whether now known or later developed, which converts the frequency to a signal which is representative of the frequency. Notably, the signal may be (i) analog or digital, and (ii) current or voltage.

In one embodiment, the frequency division circuitry further includes (1) first counter circuitry, coupled to first microelectromechanical resonator, to generate the data which is representative of the frequency of the first output signal, (2) second counter circuitry, coupled to second microelectromechanical resonator, to generate the data which is representative of the frequency of the second output signal, and (3) analysis circuitry, coupled to the first and second counter circuitry, to divide the data which is representative of the frequency of the first output signal by the data which is representative of the frequency of the second output signal.

In another embodiment, the frequency division circuitry further includes (1) first counter circuitry, coupled to first microelectromechanical resonator, to generate the data which is representative of the frequency of the first output signal, (2) second counter circuitry, coupled to second microelectromechanical resonator, to generate the data which is representative of the frequency of the second output signal, and (3) analysis circuitry, coupled to the first and second counter circuitry, to determine the data which is representative of the operating temperature of the first and/or second microelectromechanical resonators by dividing (i) the data which is representative of the frequency of the first output signal by (ii) the data which is representative of the frequency of the second output signal.

In another embodiment, the frequency division circuitry includes (1) first frequency to voltage converter circuitry, coupled to first microelectromechanical resonator, to generate the data which is representative of the frequency of the first output signal, (2) second frequency to voltage converter circuitry, coupled to second microelectromechanical resonator, to generate the data which is representative of the frequency of the second output signal, and (3) analog to voltage divider circuitry, coupled to the first and second frequency to voltage converter circuitry, to determine the data which is representative of the operating temperature of the first and/or second microelectromechanical resonator using (i) the data which is representative of the frequency of the first output signal and (ii) the data which is representative of the frequency of the second output signal.

Notably, where the temperature measurement system of this aspect includes processor circuitry, the processor circuitry may determine the operating temperature of the first microelectromechanical resonator and/or the second microelectromechanical resonator using a look-up table and/or a mathematical relationship.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many other embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

FIGS. 5J-5M are block diagram representations of exemplary temperature measurement systems, according to various embodiments, including two microelectromechanical resonators and frequency division circuitry wherein the frequency division circuitry includes counter circuitry arranged and/or configured in various embodiments, according to certain aspects of the present inventions;

FIGS. 8A-8D illustrate three-dimensional block diagram representations of a plurality of exemplary embodiments of the microelectromechanical oscillator having microelectromechanical resonators and/or frequency division circuitry integrated on/in a common and/or different substrates, according to certain aspects of the present inventions;

FIGS. 8E-8K illustrate three-dimensional block diagram representations of a plurality of exemplary embodiments of the microelectromechanical oscillator having microelectromechanical resonators (i) integrated on/in a common and/or different substrates and (ii) fabricated from different materials, according to certain aspects of the present inventions;

DETAILED DESCRIPTION

Figure 1:
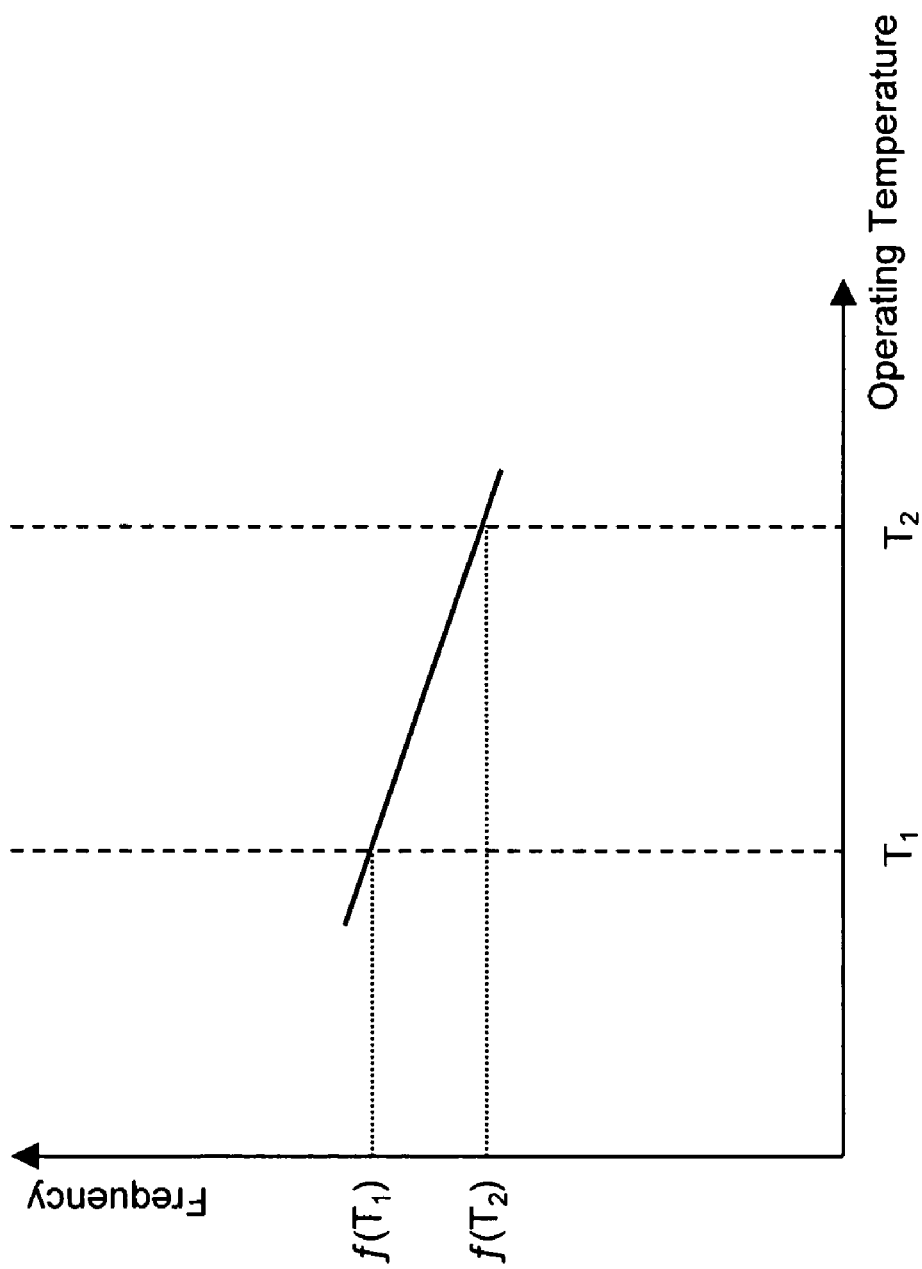
FIG. 1 is a graphical illustration of the change of frequency of the output signal of a microelectromechanical resonator over a given operating temperature range of $T_1$ to $T_2$.

There are many inventions described and illustrated herein. In one aspect, the present inventions relate to temperature measurement systems which employ a plurality of microelectromechanical resonators, and methods to control and/or operate same. The temperature measurement systems of the present inventions may be configured to provide and/or generate one or more output signals that is/are dependent on or representative of the operating temperature of one, some or all of the plurality of microelectromechanical resonators (hereinafter collectively "which are representative of the operating temperature of the plurality of microelectromechanical resonators"). Notably, the operating temperature of the plurality of microelectromechanical resonators may be the same or substantially the same.

In one embodiment, the present inventions include a temperature measurement system having two or more microelectromechanical resonators, each resonator having a "frequency function of temperature" (resulting from or caused by, for example, a change in Young's modulus over temperature of the microelectromechanical resonator (i.e., E(T) varies over temperature), a change in dimension of the microelectromechanical resonator over temperature, a change in mass of the microelectromechanical resonator over temperature, a change in stress/strain conditions of the microelectromechanical resonator, the substrate and/or the housing). The temperature measurement system also includes frequency division circuitry which generates at least one output signal which is representative of the operating temperature of one, some or all of microelectromechanical resonators. In this regard, the frequency division circuitry divides the frequency of the output signal of one of the microelectromechanical resonators by the frequency of the output signal of the other microelectromechanical resonator. In this way, the frequency division circuitry generates at least one output signal which is representative of the operating temperature of the microelectromechanical resonators.

The frequency division circuitry may be implemented as digital and/or analog circuitry, and/or in the analog and/or digital domains. In addition thereto, or in lieu thereof, the frequency division circuitry may be implemented as microelectromechanical components. There are many types, designs, architectures and/or configurations of frequency division circuitry; all such circuitry, whether now known of later developed, are intended to fall within the scope of the present inventions.

In certain embodiments, the temperature measurement system also includes processor circuitry to correlate or associate the output of the frequency division circuitry with a particular operating temperature. In this regard, the processor circuitry (for example, a microprocessor, microcontroller, state machine, discrete logic, programmable gate array and/or an appropriately programmed computer) may receive the output of the frequency division circuitry and, based thereon, estimate, calculate, determine and/or provide an operating temperature of, for example, the plurality of microelectromechanical resonators, the temperature of the system and/or portions thereof. Notably, the output of the processor circuitry may or may not be associated with units (for example, Celsius or Fahrenheit) but may be one or more values where the relative units are determined and/or interpreted by other circuitry. The relationship or association to units may be linear or non-linear.

The processor circuitry may estimate the operating temperature using, for example, a look-up table including empirical, actual and/or mathematical modeling data. The data in the look-up table may be employed to extrapolate and/or determine an operating temperature. For example, where the look-up table includes empirical data, such empirical data may be obtained from one or more temperature measurement systems and then employed for all "similar" temperature measurement systems (for example, temperature measurement systems having the same or substantially the same designs and/or layouts (for example, microelectromechanical resonators designs or layouts) and/or temperature measurement systems derived from a given fabrication "lot" or "lots", i.e., microelectromechanical resonators and/or circuitry from the same wafer(s)).

In another embodiment, the processor circuitry may calculate an operating temperature using, among other things, the output of the frequency division circuitry. The processor circuitry may calculate the operating temperature using a mathematical relationship and/or model of the response of the temperature measurement system (or portion thereof) over temperature (for example, a predetermined operating temperature range). There are many techniques to calculate an operating temperature using the output of the frequency division circuitry; all such techniques and implementations thereof, whether now known or later developed, are intended to fall within the scope of the present inventions.

In one embodiment, the processor circuitry may provide an output signal which is representative of the operating temperature to a user interface, for example, a display or other transducer (for example, an audio transducer). In this way, the user may observe and/or obtain information of the operating temperature of the temperature measurement system (or portion thereof. In another embodiment, the processor circuitry may provide an output signal representative of the operating temperature to other circuitry (for example, circuitry that employs the temperature data to adjust its operating parameters and/or characteristics) which may be integrated on the same die or external thereto.

In addition thereto, or in lieu thereof, the data which is representative of the operating temperature may be provided to processor circuitry, in a feedback loop, which controls, manages and/or adjusts the drive and/or sense circuitry of one or more of the microelectromechanical resonators or other (different) microelectromechanical-type elements or structures, for example, microelectromechanical gyroscopes or accelerometers that are, for example, disposed on or in the same substrate. In this way, the output signal of the oscillator system may include a more controlled, predetermined and/or defined frequency (for example, substantially stable frequency) via control or adjustment of the drive and/or sense circuitry of one or more of the microelectromechanical resonators.

For example, in one embodiment, the data which is representative of the operating temperature may be applied to a microelectromechanical resonator(s) (and/or the drive and sense circuitry therefor) to adjust, correct and/or control the operation of the system to accommodate and/or compensate for changes in the operating conditions and/or environment. The processor circuitry, in one embodiment, employs a look-up table and/or a predetermined or mathematical relationship to adjust, correct and/or control the operation of microelectromechanical resonator(s) (and/or the drive and sense circuitry therefore) to compensate and/or correct for changes in the operating temperature of the system or portions thereof.

In another aspect, the present inventions are an oscillator system including a temperature measurement system. In this aspect of the present inventions, the oscillator system includes circuitry that generates (1) at least one output signal having a predetermined frequency that is substantially stable (i.e., constant, substantially constant and/or essentially constant) over temperature (for example, over a given or predetermined temperature range) and/or (2) at least one signal having a substantially stable frequency over a range of temperatures (for example, a predetermined operating temperature range) and is "shaped" to have a desired turn-over frequency. The data which is representative of the operating temperature may be employed by that circuitry to enhance the stability of the output signal frequency over a range of temperatures (for example, a predetermined operating temperature range). Notably, "substantially stable frequency" may be considered in view of, among other things, a particular application over a particular, given or predetermined range of temperatures.

In one embodiment, the signal or clock (hereinafter collectively "clock") alignment circuitry (for example, one or more phase locked loops (PLLs), delay locked loops (DLLs), digital/frequency synthesizer, for example, a direct digital synthesizer ("DDS") which adjusts (for example, increase or decrease) and/or controls the frequency of an output signal of a microelectromechanical resonator-based oscillator system) may generate the one or more output signals having the constant, substantially constant and/or essentially constant frequency over temperature (for example, a predetermined operating temperature range), using the output signal of one or more of the microelectromechanical resonators (which may have a frequency that varies with temperature). In certain embodiments, the clock alignment circuitry may also employ the data which is representative of the operating temperature to enhance the stability of the frequency of the output signal over a range of temperatures (for example, a predetermined operating temperature range).

For example, the data which is representative of the operating temperature may be employed by the clock alignment circuitry to adjust the parameters, references (for example, frequency and/or phase), values and/or coefficients of the clock alignment circuitry to generate and/or provide a predetermined, adjusted, corrected and/or controlled output having, for example, a desired, selected and/or predetermined frequency and/or phase (i.e., the function of clock alignment circuitry). The clock alignment circuitry, in one embodiment, may employ a look-up table and/or a predetermined or mathematical relationship to adjust and/or control operating characteristics of the clock alignment circuitry to compensate and/or correct for changes in the operating temperature of the microelectromechanical-based oscillator system (or portions thereof).

In another embodiment of the oscillator system, the processor circuitry of the temperature measurement system may provide data to the clock alignment circuitry to adjust the operating or performance characteristics of the clock alignment circuitry. In this regard, the processor circuitry calculates and/or determines any adjustments to the parameters, references (for example, frequency and/or phase), values and/or coefficients of the clock alignment circuitry. In response, the clock alignment circuitry implements such adjustments to generate and/or provide a predetermined, adjusted, corrected and/or controlled output having, for example, a desired, selected and/or predetermined frequency and/or phase (i.e., the function of clock alignment circuitry).

Notably, the microelectromechanical resonators may employ any type of microelectromechanical resonator design, architecture and/or control, whether now known or later developed; and all such microelectromechanical resonator designs, architectures and/or control techniques are intended to fall within the scope of the present inventions. The microelectromechanical resonators may be separate structures or the same structure. That is, the microelectromechanical resonators may be components or portions of the same physical structure that resonate in multiple, different modes of operation, for example, in-plane and out-of-plane, or in two different angles with respect to an anisotropic substrate. Again, all microelectromechanical resonator designs, structures, architectures and/or control techniques, whether now known or later developed, are intended to fall within the scope of the present inventions.

Figure 2:
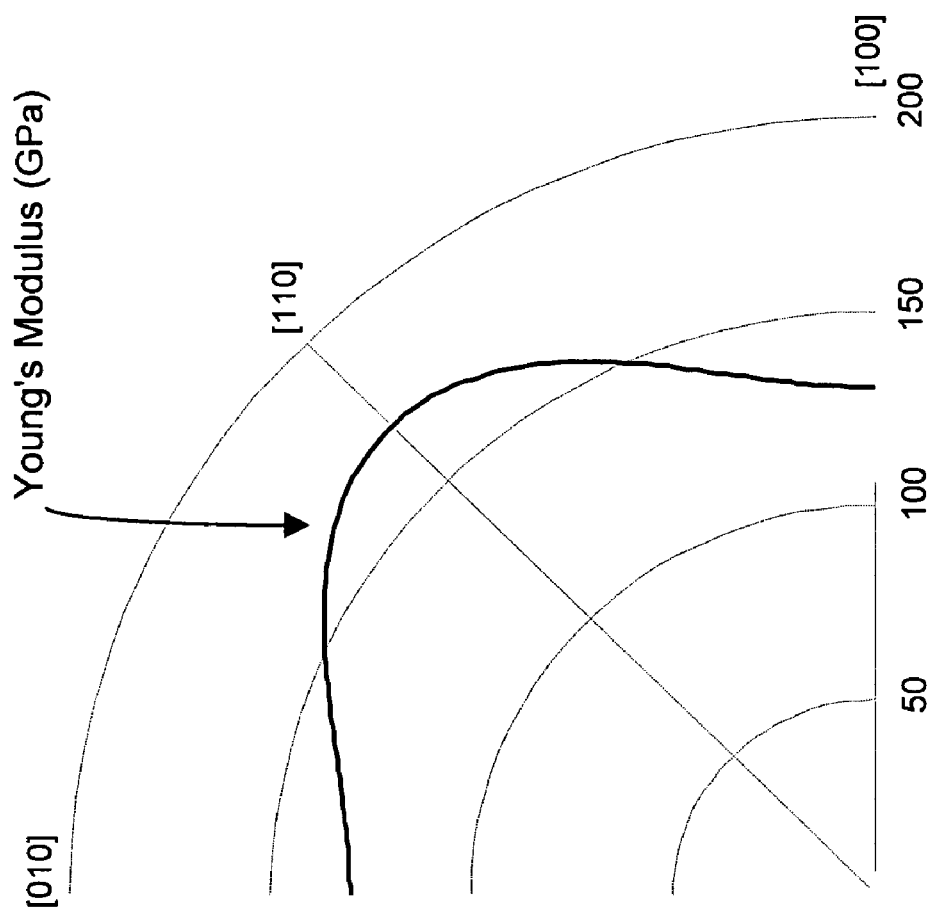
FIG. 2 is a graphical illustration of Young's modulus (E) versus crystalline orientation of the microelectromechanical structure disposed in the (100) plane of monocrystalline silicon.

Further, the microelectromechanical resonators may be disposed (1) on/in the same substrate and fabricated from the same material, (2) on/in different substrates from the same material, (3) on/in the same substrate but from different materials, and/or (4) on/in different substrates of different materials. For example, where the resonators are disposed on the same substrate and in the same material (for example, monocrystalline silicon) or in/on different substrates of the same material, the resonators may be fabricated in/on the substrate in different orientations or directions. In this way, although the resonators are fabricated from or in the same material having the same or substantially the same mechanical properties, the Young's modulus of each resonator structure may be different and may vary or change differently over temperature (i.e., dE/dT of one resonator structure is different from the dE/dT of the other resonator structure, or E(T) of one resonator structure is different from E(T) of the other resonator structure, where E(T) is the function of Young's modulus over temperature) due to the different crystalline orientations (for example, where the material is silicon, the strain field of one of the resonators may be predominantly oriented in the <100> direction in the (100) plane, and the strain field of the other resonator may be disposed in the <110> direction on the (100) plane (stated differently, the two strain fields are oriented at an angle of 45° with respect to each other in the (100) plane)). (See, for example, FIG. 2). Resonator designs that incorporate strain energy in multiple directions and/or multiple materials are also possible and indeed may be advantageous. For example, a pair of resonator structures may have strain fields that are not oriented purely in <100> and <110> directions, thereby forming resonators with intermediate "aggregate" material properties.

Notably, where the microelectromechanical resonators are disposed on/in the same substrate and fabricated from different materials, and/or on/in different substrates from different materials, the Young's modulus of each resonator structure may be different and may also vary or change differently over temperature (i.e., dE/dT of one resonator structure is different from the dE/dT of the other resonator structure, or E(T) of one resonator is different from E(T) of the other resonator) due to the differences in the properties, for example, mechanical properties, of the different materials. As such, the crystalline orientations (if any) of the microelectromechanical resonators may or may not be different.

Further, at least one resonator may be created from a composite material, for example, a combination of silicon, silicon nitride, and/or silicon dioxide. The relative amounts of materials and their location in the resonator device may be adjusted to advantageously influence the frequency function of temperature of each.

With reference to FIG. 3, in one aspect, the present inventions are directed to temperature measurement system 10 having microelectromechanical resonators 12a and 12b and frequency division circuitry 14. The output signal of microelectromechanical resonator 12a includes a resonant frequency $f_1$ that varies over temperature. The output signal of resonator 12b includes a resonant frequency $f_2$ that varies over temperature. The microelectromechanical resonator 12a includes a Young's modulus which changes over operating temperature (i.e., non-zero dE/dT or varying E(T)) in a manner and/or rate that is different from the manner and/or rate of the Young's modulus change over temperature of microelectromechanical resonator 12b. (See, for example, FIGS. 4A-4E). The resonant frequency $f_1$ and resonant frequency $f_2$ may be the same or different frequencies.

Notably, in most applications or implementations, circuitry is employed or associated with microelectromechanical resonator 12 to, for example, amplify and/or condition the output signals and/or drive the resonators. (See, for example, FIGS. 9A, 9B, 10A-10E and 11A). As such, the output signals of microelectromechanical resonators 12 may be sensed, amplified and/or conditioned by resonator drive and sense circuitry before provided to frequency division circuitry 14. Indeed, those drawings which illustrate microelectromechanical resonator(s) 12 without resonator drive and sense circuitry may be interpreted as including suitable resonator drive and sense circuitry.

The frequency division circuitry 14 generates one or more output signals which are representative of the operating temperature of the plurality of microelectromechanical resonators using the output signals of microelectromechanical resonators 12a and 12b. The frequency division circuitry 14 includes circuitry that divides the frequency of the output signal of one resonator 12a by the frequency of the output signal of another resonator 12b (and/or vice versa).

Figure 5A:
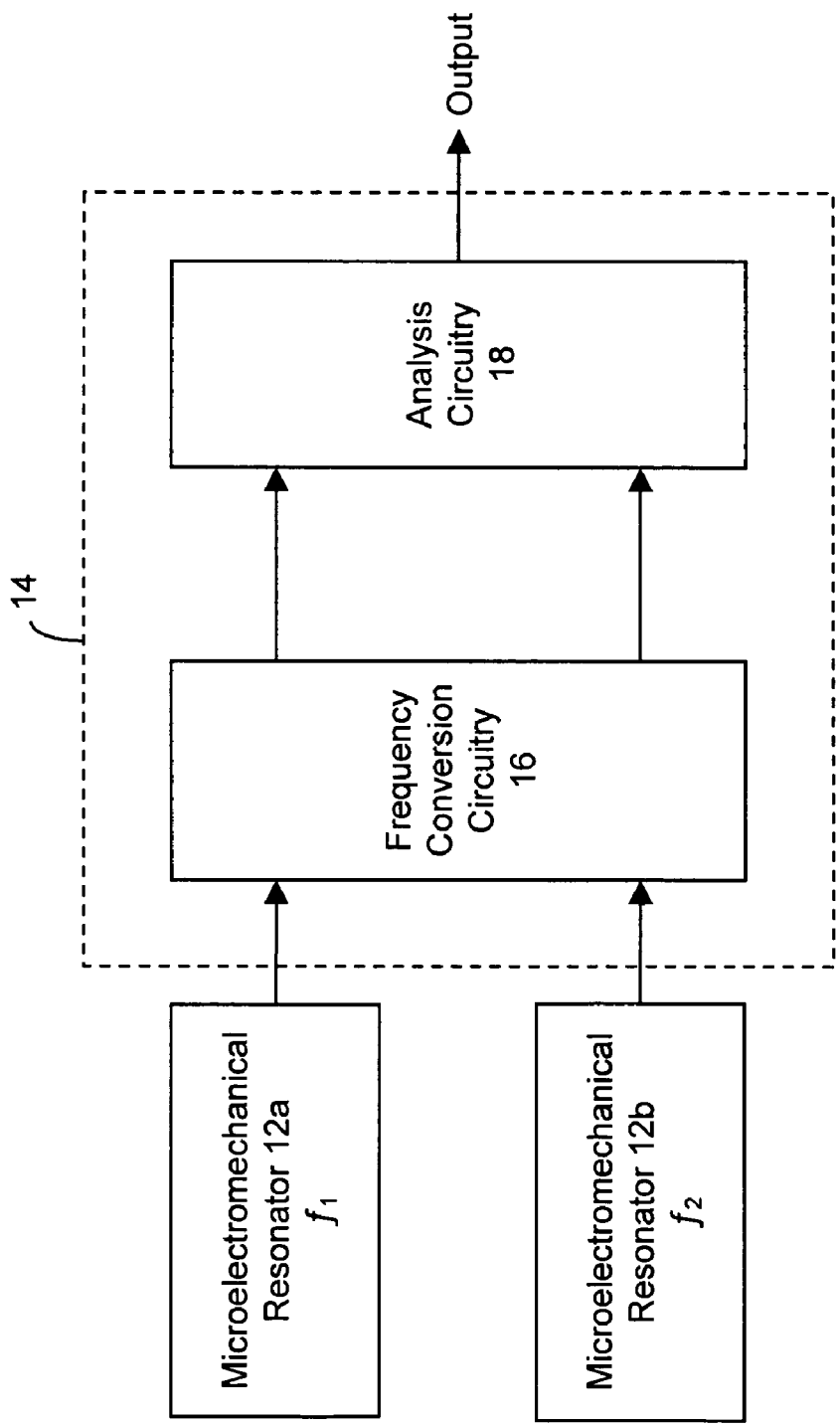
FIGS. 5A and 5B are block diagram representations of exemplary temperature measurement systems according to various embodiments, including two microelectromechanical resonators, frequency division circuitry and analysis circuitry, wherein the frequency division circuitry (for example, analog-to-digital converter circuitry, counter circuitry, pulse width modulation circuitry, amplitude or threshold detection circuitry and/or frequency to voltage converter circuitry) may be shared between the resonators (FIG. 5A) or dedicated to a particular resonator (FIG. 5B), according to certain aspects of the present inventions.
Figure 5B:
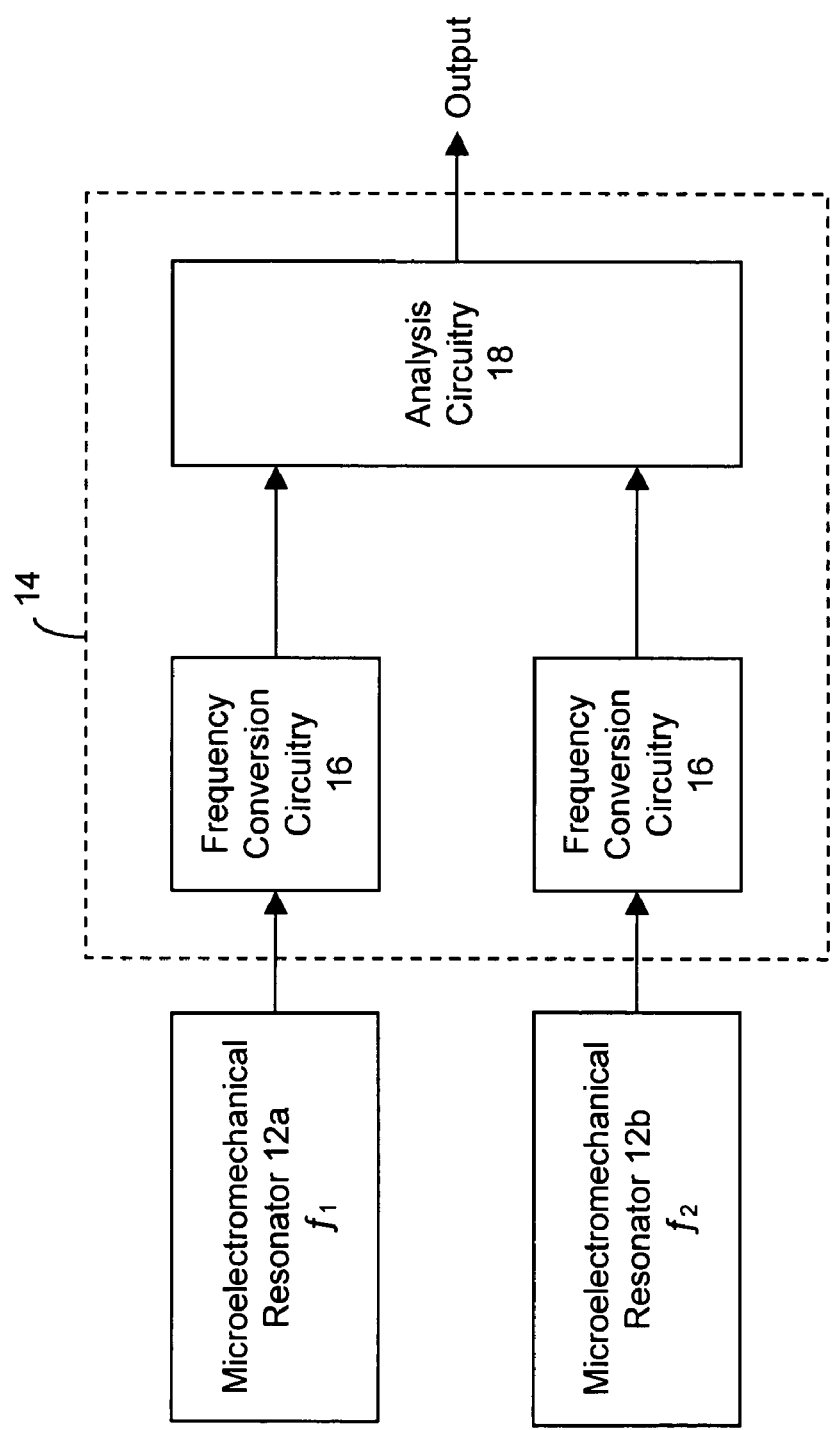

The frequency division circuitry 14 may divide the signals in the digital and/or analog domains and, may include digital and/or analog circuitry. For example, with reference to FIG. 5A, in one embodiment, frequency division circuitry 14 includes frequency conversion circuitry 16 and analysis circuitry 18. The frequency conversion circuitry 16 receives the output signals of microelectromechanical resonators 12a and 12b and generates an analog and/or digital representation of the frequency of the output signal of microelectromechanical resonators 12. The frequency conversion circuitry 16 may be shared (see, for example, FIG. 5A) or dedicated circuitry (see, for example, FIG. 5B). In one embodiment, frequency conversion circuitry 16 may be an analog-to-digital converter (ADC) circuitry, counter circuitry, pulse width modulation circuitry, amplitude or threshold detection circuitry and/or frequency to voltage converter circuitry. Indeed, frequency conversion circuitry 16 may be any circuitry and/or architecture, whether now known or later developed, which converts the frequency to a signal which is representative of the frequency. Notably, the signal may be (i) analog or digital, and (ii) current or voltage.

Figure 5C:
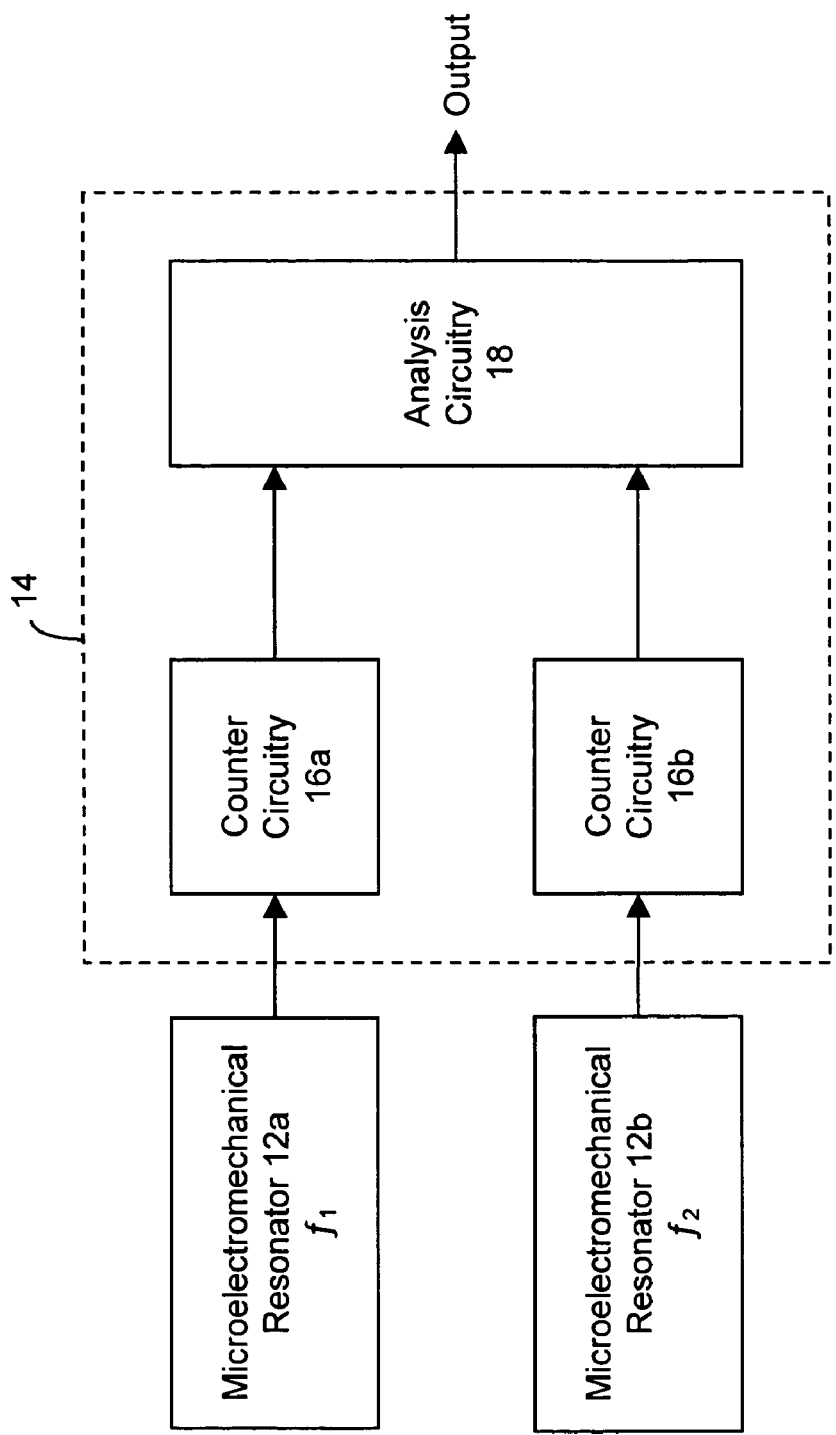
FIGS. 5C-5I are block diagram representations of exemplary temperature measurement systems according to various embodiments, including two microelectromechanical resonators and frequency division circuitry wherein the frequency division circuitry includes counter circuitry (arranged and/or configured in various embodiments) and analysis circuitry, according to certain aspects of the present inventions.

For example, with reference to FIG. 5C, in one embodiment, frequency division circuitry 14 includes counter circuitry 16a, counter circuitry 16b and analysis circuitry 18. In this embodiment, counter circuitry 16a and 16b receive the output signals of microelectromechanical resonators 12a and 12b, respectively. The counter circuitry 16a generates a digital representation of the frequency of the output signal of microelectromechanical resonator 12a. Similarly, counter circuitry 16b generates a digital representation of the frequency of the output signal of microelectromechanical resonator 12b.

In this embodiment, analysis circuitry 18 divides the outputs of counter circuitry 16a and 16b to generate a value which is representative of the operating temperature(s) of microelectromechanical resonators 12. That is, analysis circuitry 18 divides the digital representation of the frequency of the output signal of microelectromechanical resonator 12a (i.e., the output of counter circuitry 16a) by the digital representation of the frequency of the output signal of microelectromechanical resonator 12b (i.e., the output of counter circuitry 16b). The output of analysis circuitry 18 is a signal which is representative of the operating temperature of microelectromechanical resonators 12.

Figure 5D:
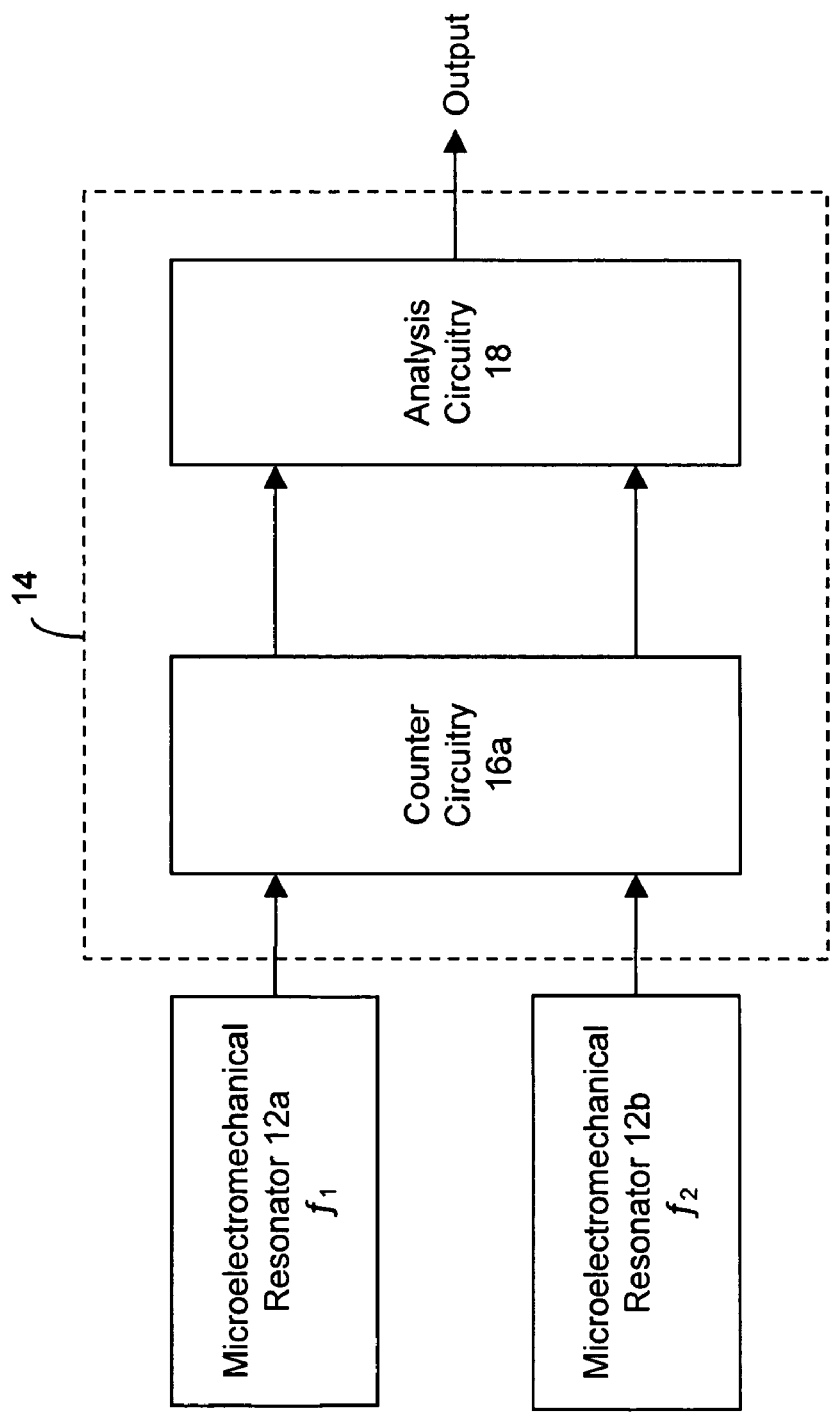

Notably, as mentioned above, frequency conversion circuitry 16 may include "dedicated" circuitry for each resonator 12 (for example, counter circuitry 16a and 16b in FIG. 5C) or time "shared" circuitry (for example, counter circuitry 16a in FIG. 5D). Indeed, the embodiments described herein may be implemented similarly. For example, where frequency conversion circuitry 16 employs ADC circuitry to generate a representation of the frequency of the output signal of microelectromechanical resonators 12, one ADC circuitry may be employed (and time shared or time multiplexed) or more than one ADC may be employed (wherein ADC circuitry is employed to generate a digital representation of the frequency of the output signal of an associated microelectromechanical resonator 12).

The analysis circuitry 18 may include digital and/or analog circuitry and, in this embodiment, may divide the output signals of counter circuitry 16a and 16b in the digital and/or analog domains. For example, in one embodiment, analysis circuitry 18 may be one or more counters, a processor, state machine, programmable gate array ("PGA") and/or ROM having a look-up table (wherein the particular ROM location (and output thereof) is determined by the output of counter circuitry 16a and 16b). Notably, any circuitry which "divides" output signals of counter circuitry 16a and 16b (whether in the digital or analog domains) now known or later developed is intended to fall within the scope of the present inventions.

Figure 5E:
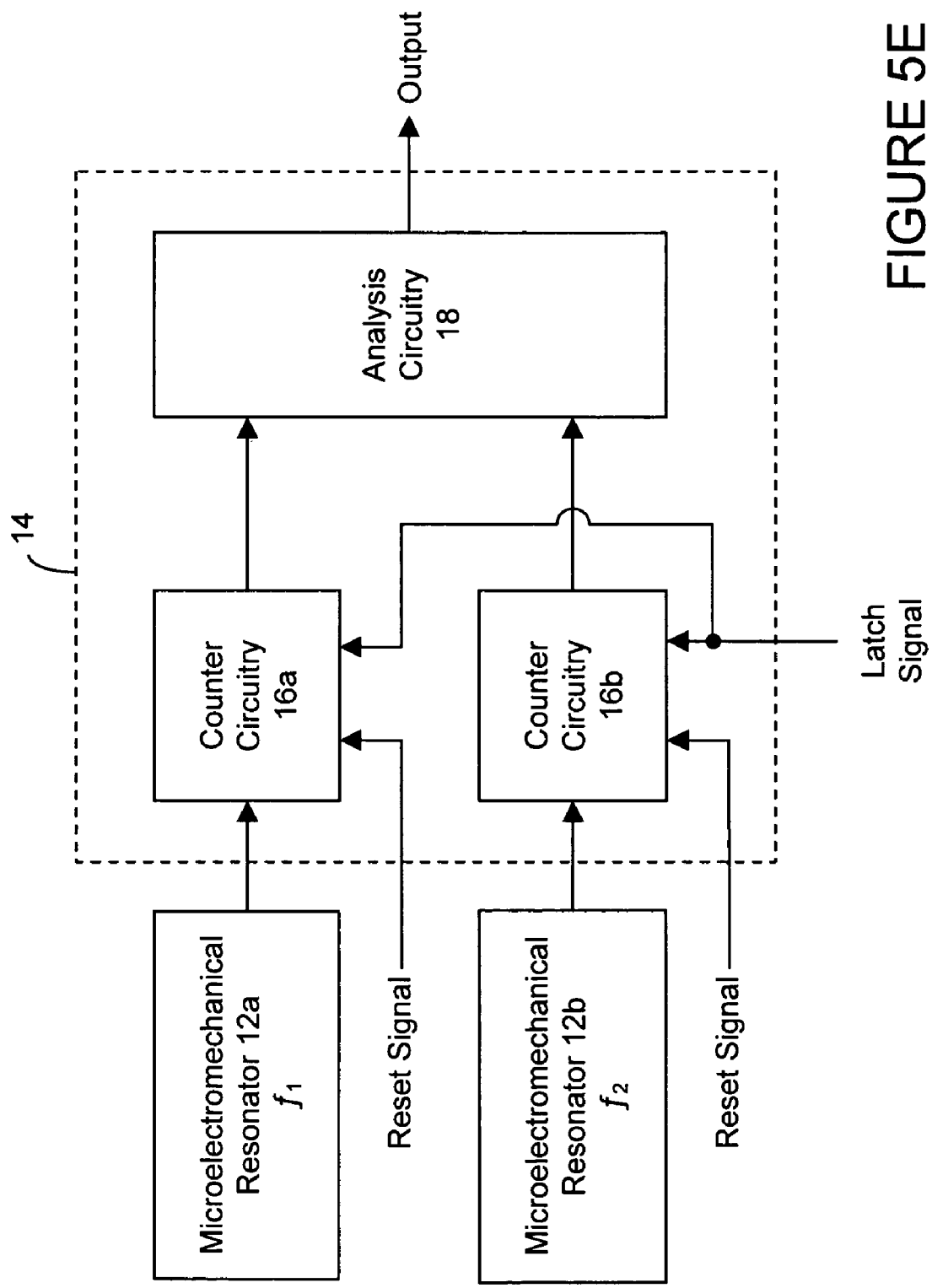

The counter circuitry 16a and 16b may include one or more counters that are responsive to the output of microelectromechanical resonators 12a and 12b. Further, counter circuitry 16a and 16b may be responsive to control signals, for example, latch and/or reset signals, to facilitate acquisition of the frequency of the output signal of microelectromechanical resonators 12a and 12b, respectively. (See, for example, FIG. 5E). Any counter architecture whether now known or later developed is intended to fall within the scope of the present invention.

Figure 5F:
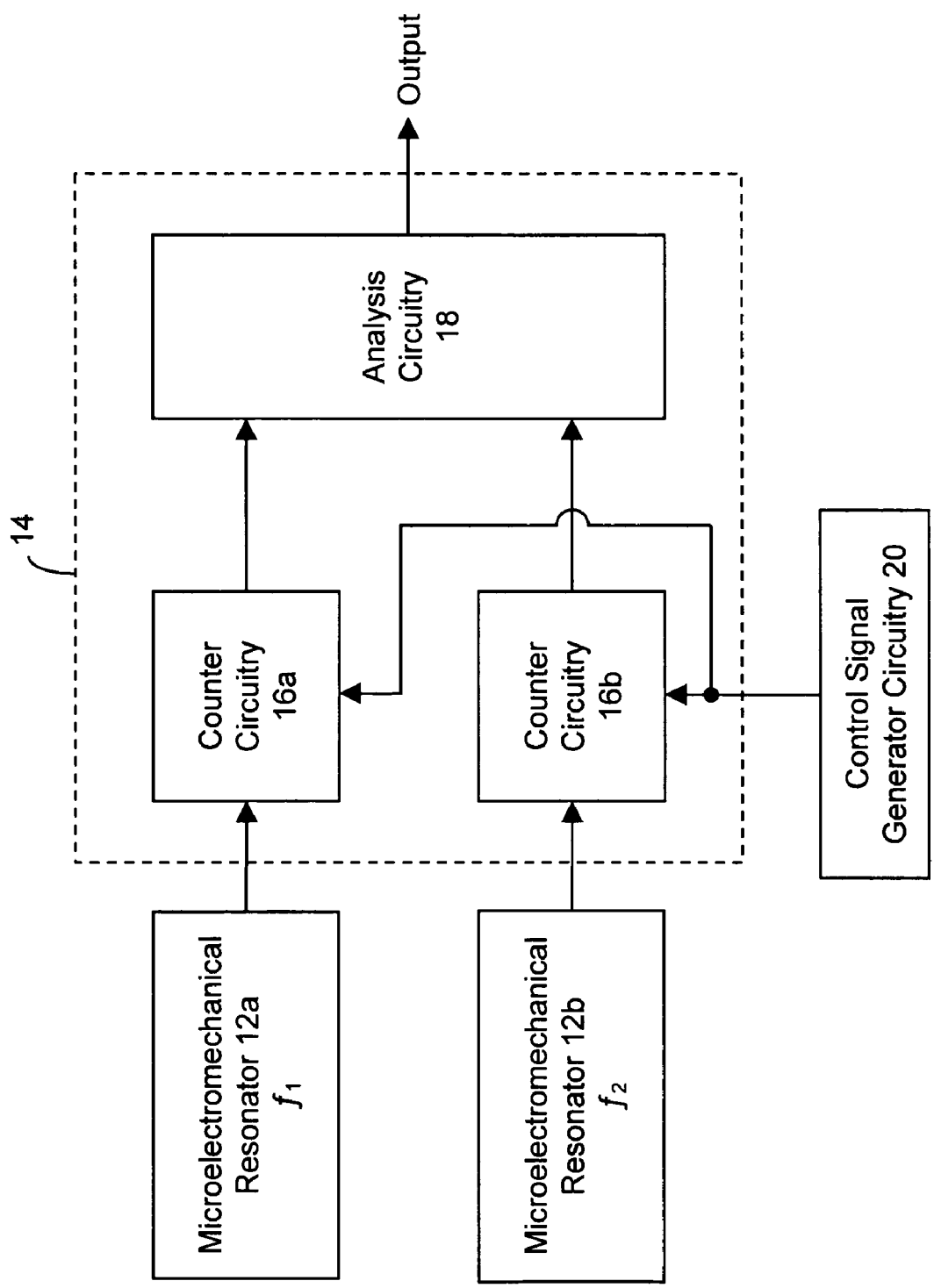

The control signals, for example, latch and/or reset signals, may be intermittent, repetitive and/or periodic signals. The control signals may be provided by internal/integrated (resident on the die) and/or external circuitry. In one embodiment, the control signals are generated by control signal generator circuitry 20, such as, a processor or controller (collectively "processor") or clock generator. (See, for example, FIG. 5F).

In one embodiment, the control signals generated by control signal generator circuitry 20 may be periodic wherein the period changes under certain circumstance (for example, where the operating temperature is changing (for example, changing faster than a predetermined rate). The control signals may be relatively periodic under certain circumstances and non-periodic under other circumstances (for example, during normal operation versus at start-up or initialization). In this way, the data provided to analysis circuitry 18 may accommodate different circumstances and, as such, analysis circuitry 18 may generate output signals, which are representative of the operating temperature of microelectromechanical resonators 12a and/or 12b, to accommodate different circumstances.

Notably, control signal generator circuitry 20 may or may not be affected by changes in temperature. Moreover, circuitry 20 may be incorporated into other circuitry, for example, analysis circuitry 18. In this regard, analysis circuitry 18, in addition to generating one or more values which are representative of the operating temperature(s) of microelectromechanical resonators 12 (for example, by dividing the digital representations of the frequency of output signals microelectromechanical resonators 12), may generate certain control signals to facilitate acquisition (for example, the digitizing and/or sampling) of frequency of the output signals resonators 12 by counter circuitry 16a and 16b.

Figure 5G:
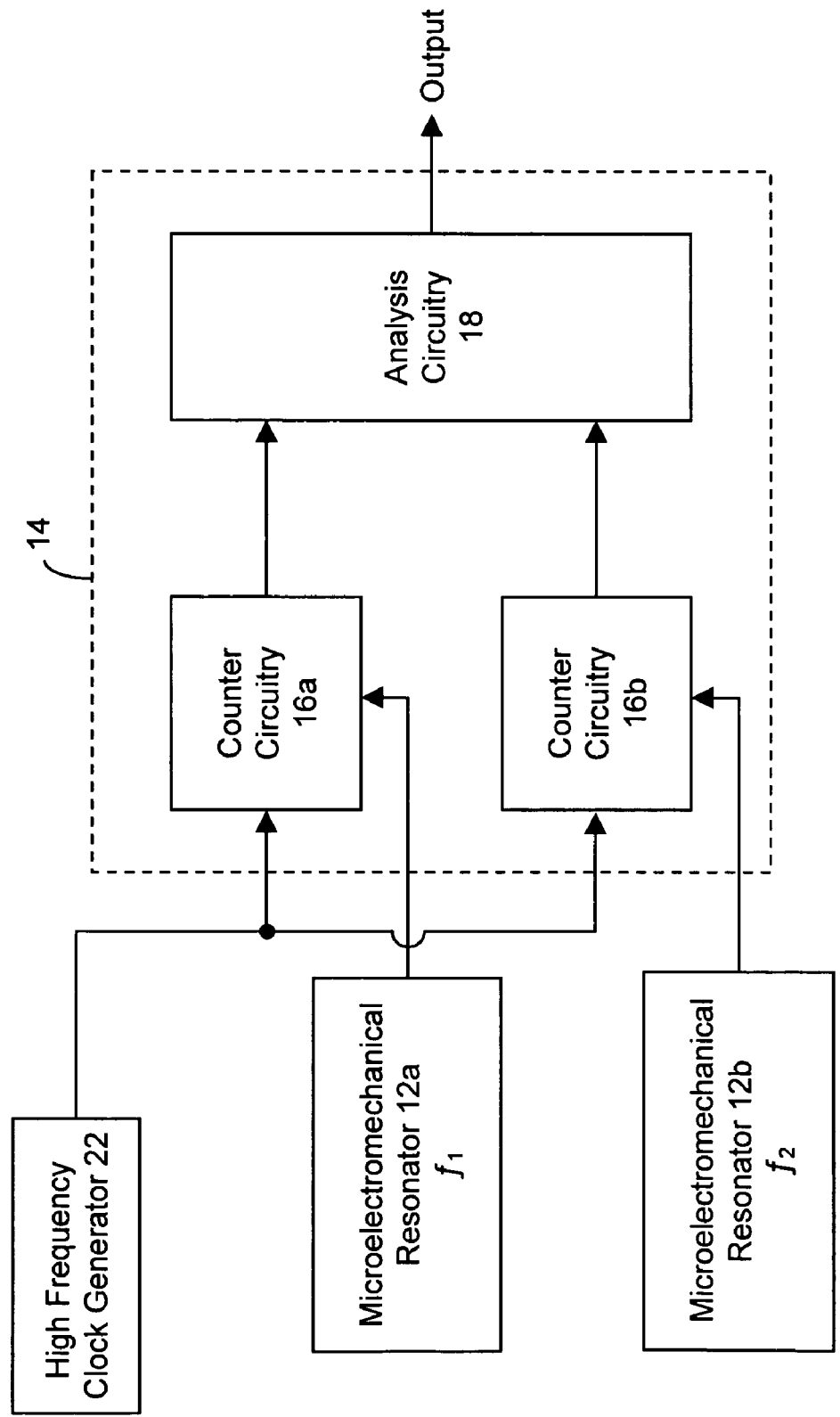

As mentioned above, frequency division circuitry 14 may employ many different types of architectures and techniques—all of which are intended to fall within the scope of the present inventions. For example, with reference to FIG. 5G, frequency division circuitry 14 may include counter circuitry 16a and 16b which receive a high frequency clock signal (generated by high frequency clock generator 22) at the count input. In this embodiment, the output signals of microelectromechanical resonators 12a and 12b are employed as a control signal (for example, latch and/or reset signal) for counter circuitry 16a and 16b, respectively. As such, in operation, counter circuitry 16a and 16b each count (in an ascending or a descending manner) according to the input frequency of the high frequency clock signal. The counter circuitry 16a and 16b latch a value in response to the frequency of the output signals of microelectromechanical resonators 12. The count values latched in response to the output signals of microelectromechanical resonators 12 are provided to analysis circuitry 18. In this embodiment, analysis circuitry 18 may divide the count values to determine the operating temperature of microelectromechanical resonators 12.

Notably, the degree of accuracy of the temperature data may be adjusted, increased and/or enhanced by, for example, increasing the number of counts measured by the counter circuitry 16 relative to the control signal (for example, the latch control signal) for one or more of counter circuitry 16. For example, with reference to FIGS. 5H and 5I, in these embodiments, the frequency of the output signal of microelectromechanical resonators 12 is adjusted and/or controlled thereby adjusting/controlling the number of counts measured/determined by counter circuitry 16 relative to the control signal. For example, with reference to FIG. 5E, where 1/m is a greater than 1, counter circuitry 16a provides a count (based on the frequency of the output signal of high frequency clock generator 22) which is greater because counter circuitry 16a measures more transitions of the frequency division of the control signal (i.e., frequency division of the output signal of microelectromechanical resonator 12a).

Figure 5H:
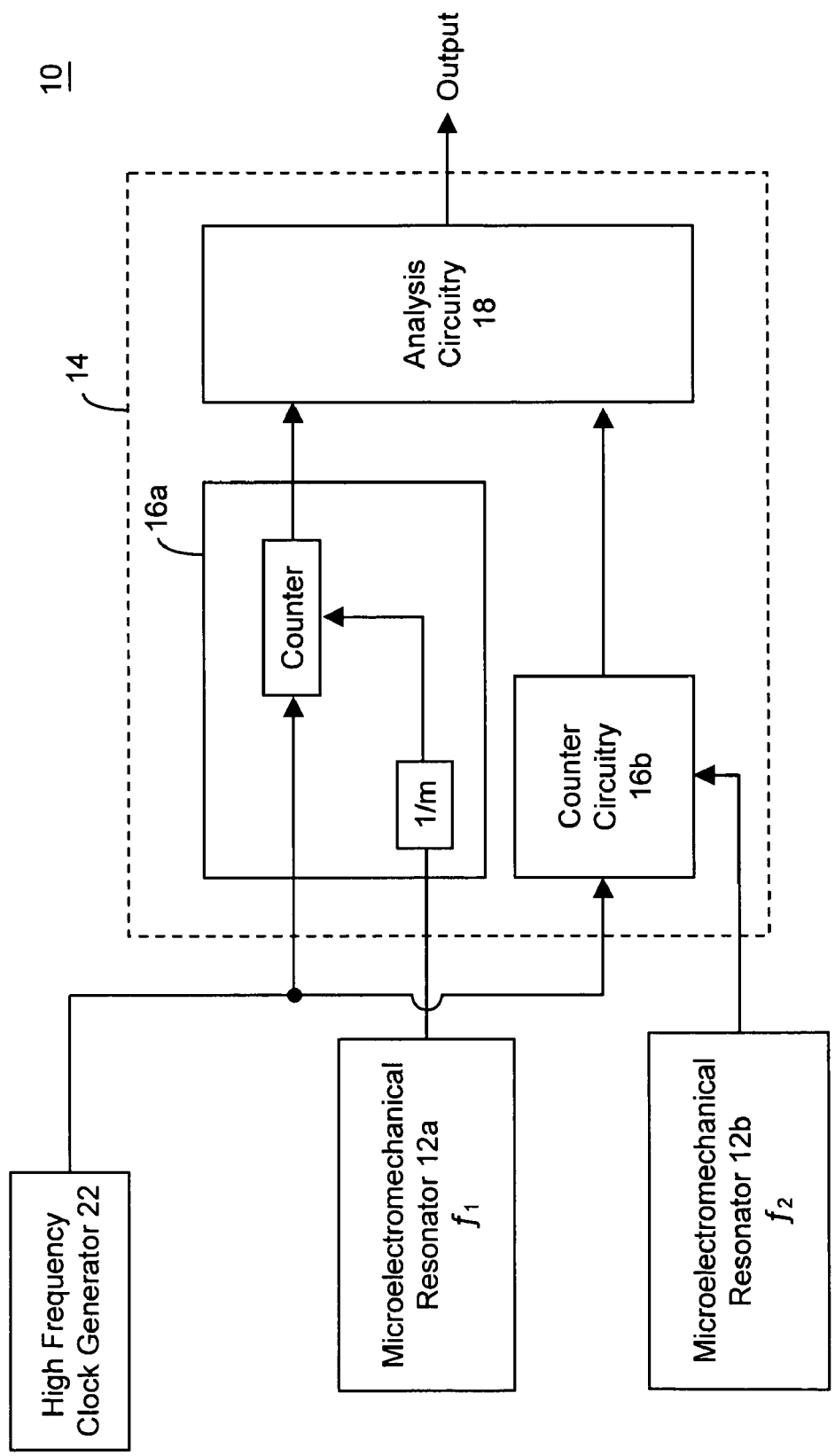
Figure 5I:
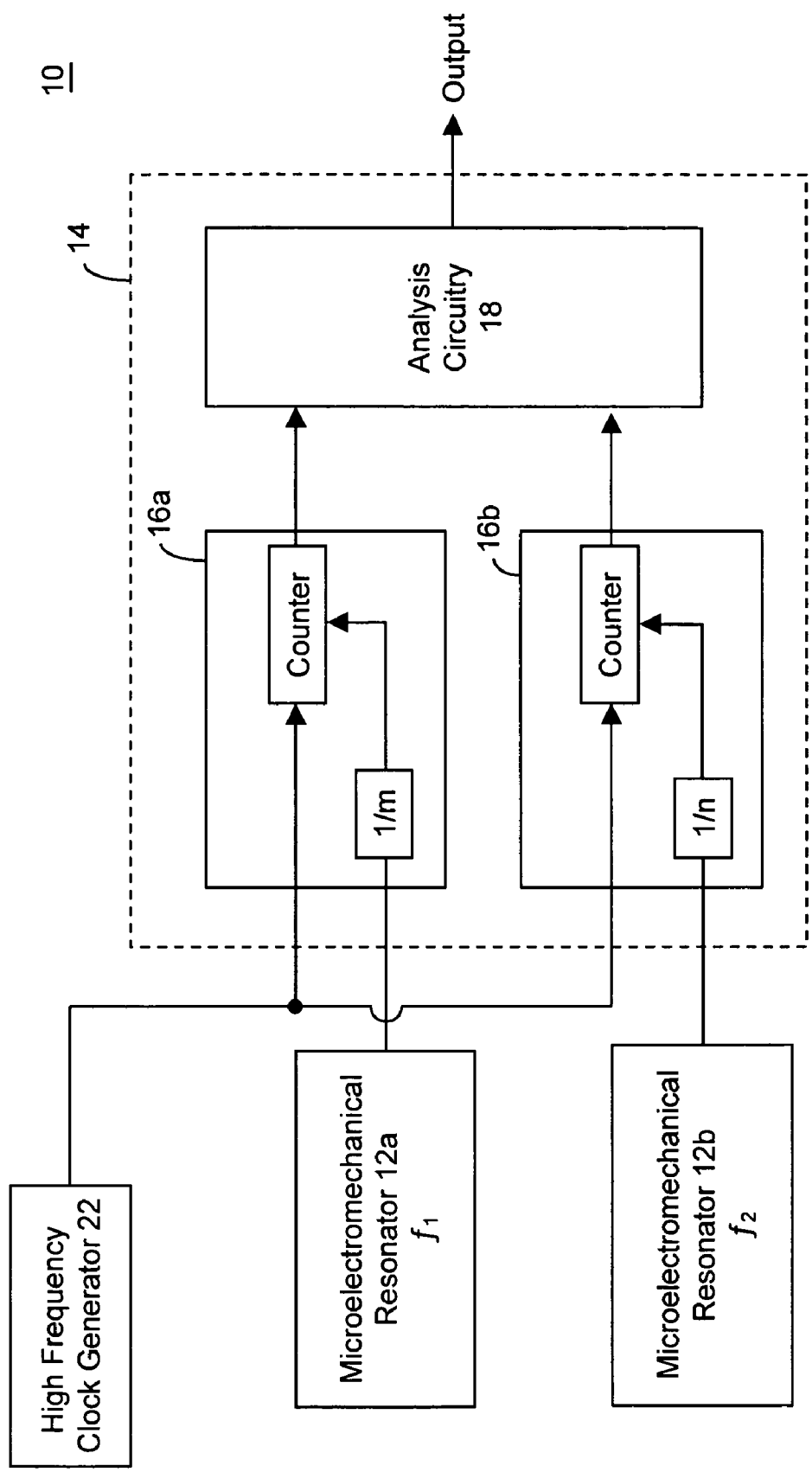

Similarly, with reference to FIG. 5I, where 1/m and 1/n are greater than 1, counter circuitry 16a and counter circuitry 16b provide a greater count (based on the frequency of the output signal of high frequency clock generator 22) due to the frequency division of the control signal (i.e., frequency division of the output signals of microelectromechanical resonators 12a and 12b).

Notably, the "1/m" and "1/n" operations may be implemented using counter circuitry. Moreover, the values of "m" and/or "n" may be stored in a resident memory (for example, a latch) at fabrication, during test, start-up/power-up, initialization, re-initialization and/or during normal operation (in situ). Indeed, the values of "m" and/or "n" may be provided via external circuitry or a user.

In one embodiment, the values of "m" and/or "n" may be selected or implemented according to operating conditions. For example, at start-up, during initialization or re-synchronization, it may be advantageous to employ a technique that facilitates rapid acquisition of temperature related data. In this regard, the values of "m and/or "n" may be set to smaller values (relative to normal operation) in order to accelerate acquisition of temperature related data; in this way, the system may rapidly attain an suitable, predetermined or functional operating condition. Thereafter, the values of "m and/or "n" may be re-set to larger values in order to enhance the degree of accuracy of the temperature related data.

With reference to FIG. 5J, in yet another embodiment, frequency division circuitry 14 may include counter circuitry 16a and 16b. In this embodiment, counter circuitry 16a and 16b are configured such that the output of counter circuitry 16b is employed as a control signal (for example, the latch control signal) for counter circuitry 16a. Accordingly, in operation, counter circuitry 16b generates a latch control signal in response to a predetermined number of counts of the output signal of microelectromechanical resonator 12b (which is based on the frequency of the output signal). The counter circuitry 16a, in response to the control signal (for example, latch control signal), generates an output signal (i.e., a count value) that is representative of the frequency of the output signal of microelectromechanical resonator 12a divided by the frequency of the output signal of microelectromechanical resonator 12b.

Figure 5K:
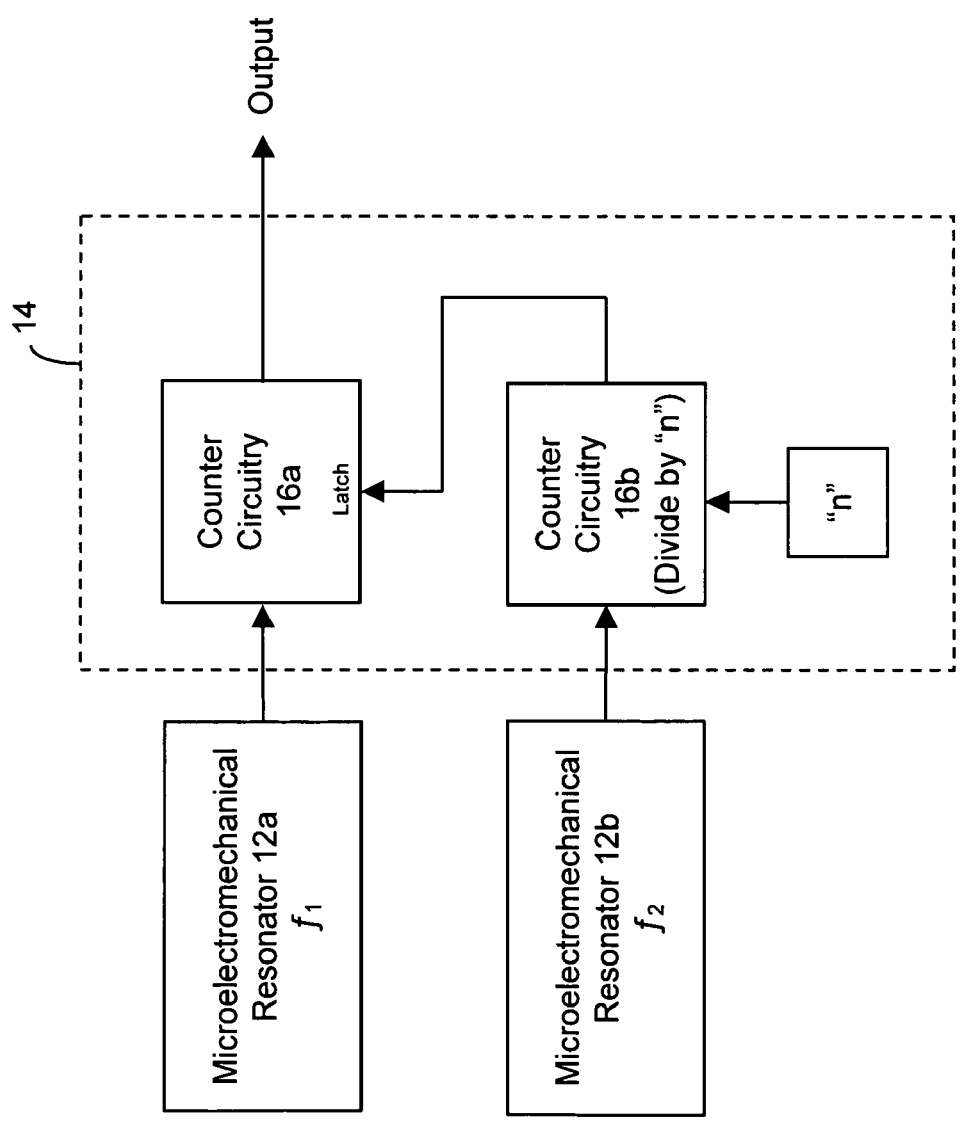
Figure 5L:
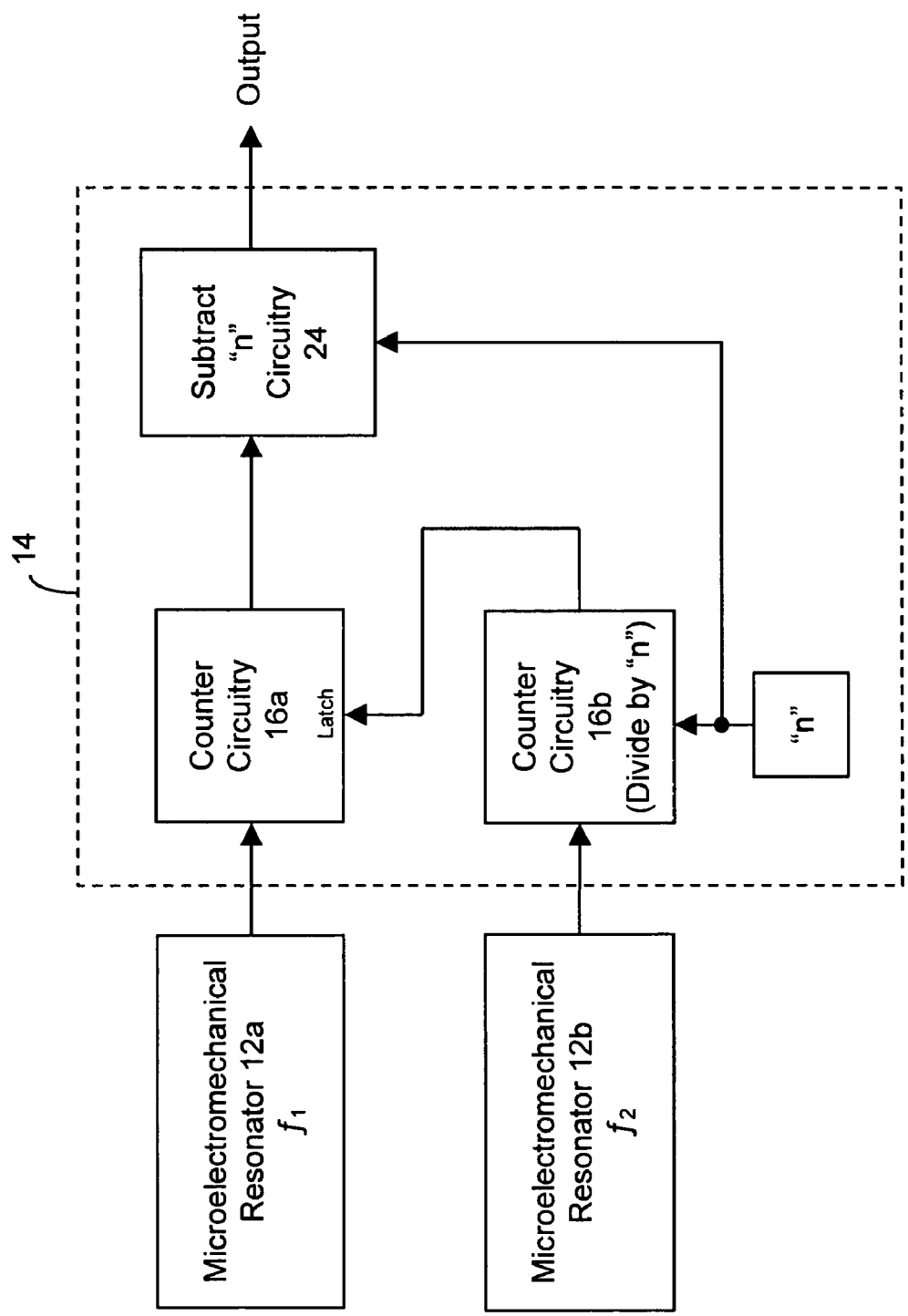
Figure 5M:
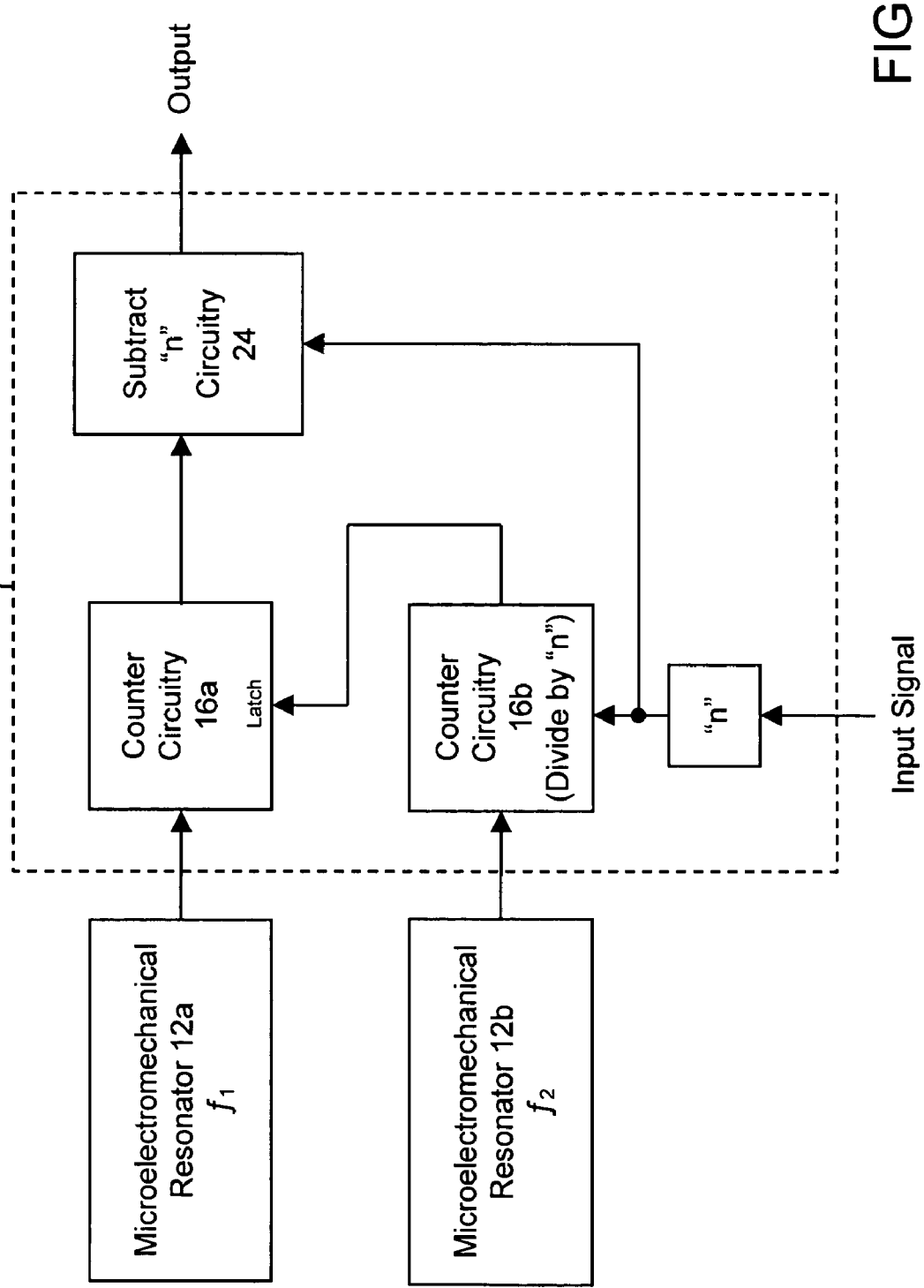

Notably, similar to the discussion above with respect to FIGS. 5H-5I, the degree of accuracy of the temperature data may be adjusted, increased and/or enhanced by, for example, increasing the number of counts measured by the counter circuitry 16a relative to a control signal (for example, the latch and/or reset control signal) generated by counter circuitry 16b. For example, with reference to FIGS. 5K-5M, in these embodiments, the frequency of the output signal of microelectromechanical resonators 12 is adjusted and/or controlled thereby adjusting/controlling the number of counts to be measured/determined by counter circuitry 16b before generating the control signal. For example, with reference to FIG. 5K, where "n" is a greater than 1, counter circuitry 16b provides or generates a control signal after a count of transitions of the output signal of microelectromechanical resonator 12b divided by m (based on the frequency of the output signal of microelectromechanical resonator 12b). The counter circuitry 16a, in response to the control signal, generates an output signal (i.e., a count value) that is representative of the frequency of the output signal of microelectromechanical resonator 12a divided by the frequency of the output signal of microelectromechanical resonator 12b divided by In one embodiment, it may be advantageous to normalize the impact of "n" from the output of frequency division circuitry 14. With reference to FIG. 5L, the output of counter circuitry 16a is provided to circuitry 24 normalizes "n" from the count value of output of counter circuitry 16a.

As mentioned above, "n" may be stored in a resident memory (for example, a latch) at fabrication, during test, start-up/power-up, initialization, re-initialization and/or during normal operation (in situ). Indeed, "n" (and/or "m") may be provided to frequency division circuitry 14 via external circuitry and/or a user. (See, for example, FIG. 5M).

With reference to FIGS. 5I and 5K-5M, where m and n are greater than 1, counter circuitry 16a and counter circuitry 16b provide a greater count (based on the frequency of the output signal of high frequency clock generator 22) due to the frequency division of the control signal (i.e., frequency division of the output signals of microelectromechanical resonators 12a and 12b).

Figure 5N:
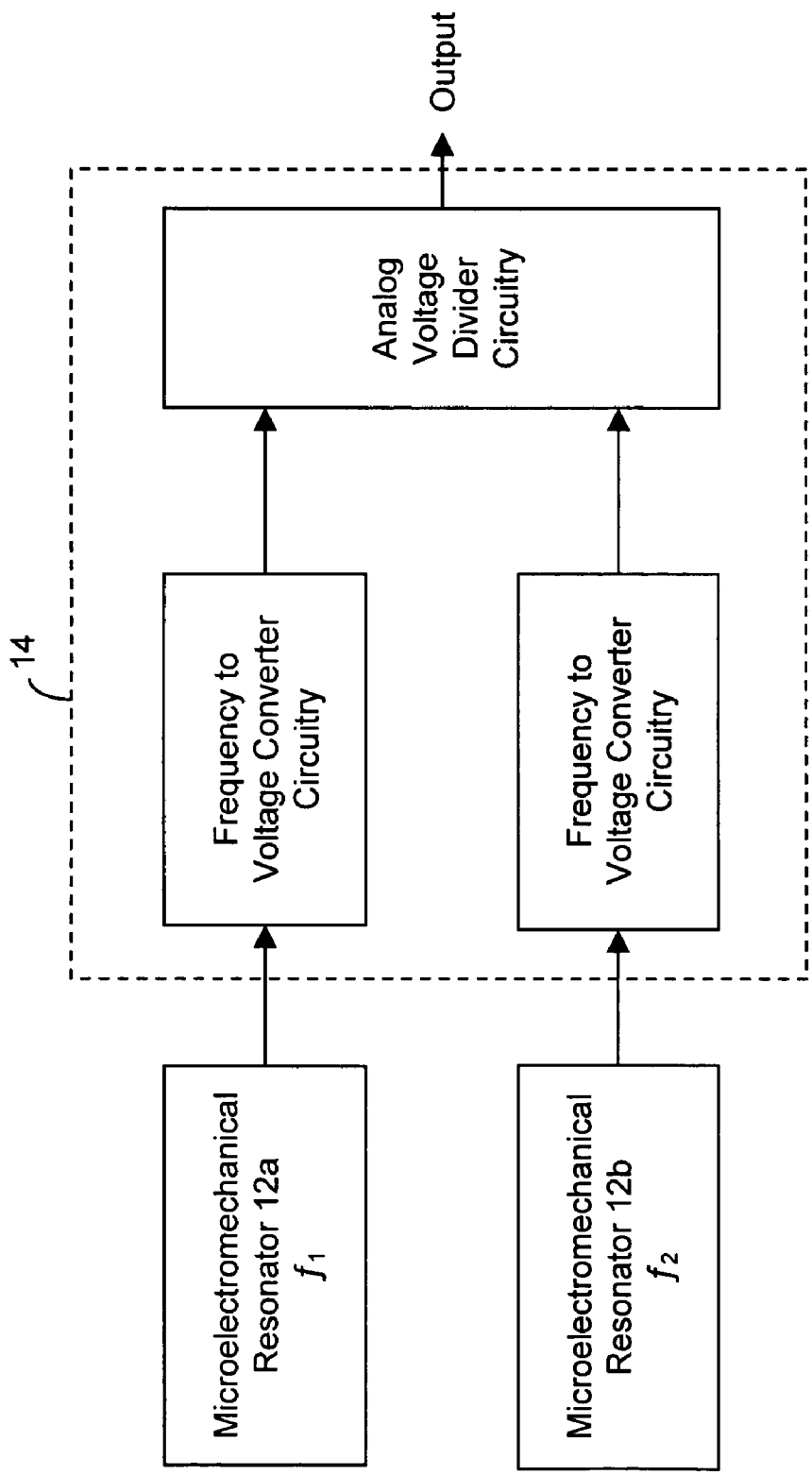
FIG. 5N is a block diagram representation of an exemplary temperature measurement system including two microelectromechanical resonators and frequency division circuitry wherein the frequency division circuitry is implemented using analog circuitry, according to certain aspects of the present inventions.

As noted above, in addition to or in lieu thereof, frequency division circuitry 14 may be implemented via analog circuitry and generate one or more signals which are representative of the operating temperature of the plurality of microelectromechanical resonators. (See, for example, FIG. 5N). Briefly, in this exemplary embodiment, the output signals of resonators 12a and 12b may be provided to frequency to voltage converter circuitry which output a voltage which is representative of the frequency of the output signals of resonators 12a and 12b. The analog voltage divider circuitry may employ the voltages which are representative of the frequency of the output signals of resonators 12a and 12b to generate an output which is representative of the operating voltage of resonators 12a and 12b. Notably, analog implementations of frequency division circuitry 14 may be voltage (see, for example, FIG. 5N) and/or current based.

Figure 6A:
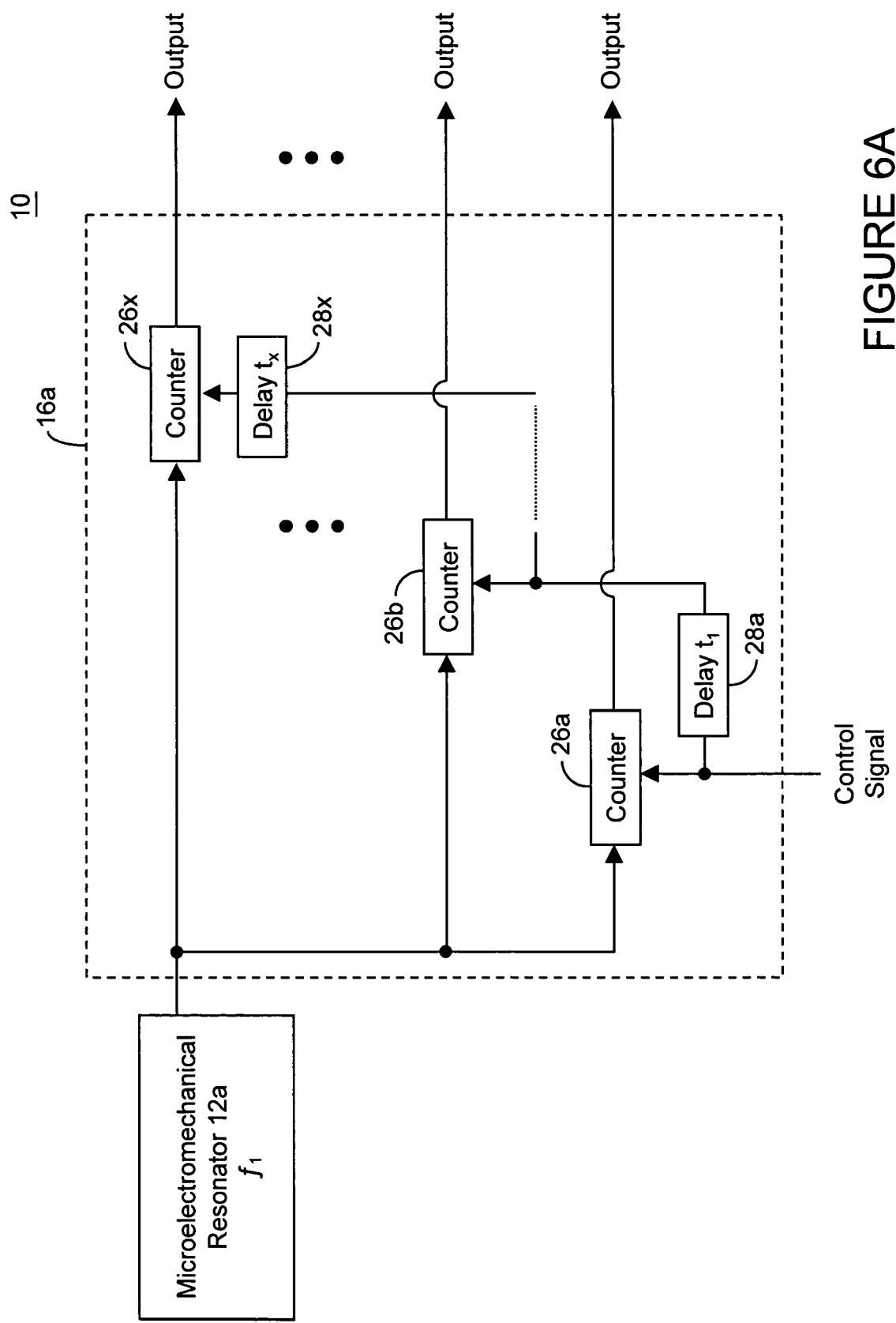
FIGS. 6A-6C are block diagram representations of exemplary temperature measurement systems according to various embodiments, wherein the counter circuitry of the frequency division circuitry includes, among other things, a plurality of counters and time delay elements, according to certain aspects of the present inventions.

In certain implementations, it may be advantageous to increase the rate at which temperature measurement data is acquired and/or analyzed. With reference to FIG. 6A, in one embodiment, counter circuitry 16a may include a plurality of counters 26 and one or more delay elements or circuits 28. The counters 26a-26x receive the output signal of microelectromechanical resonator 12a and count, for example, in an ascending or a descending manner, based on the frequency of the output signal of microelectromechanical resonator 12a. The counters 26a-26x latch and output a count value in response to a control signal. The control signals for each counter 26a-26x are staggered in time relative to one another. In this way, analysis circuitry 18 receives a plurality of outputs, which are representative of the frequency of the output signal of microelectromechanical resonator 12a, wherein each output is representative of the frequency of the output signal of microelectromechanical resonator 12 at different points in time. This may enhance the temporal response and/or the resolution.

Notably, counter circuitry 26b may also be configured as illustrated in FIG. 6A. In this way, each counter circuitry 26 provides multiple, time displaced output signals from which the operating temperatures of microelectromechanical resonators 12 may be obtained, generated and/or calculated by, for example, analysis circuitry 18.

Figure 6B:
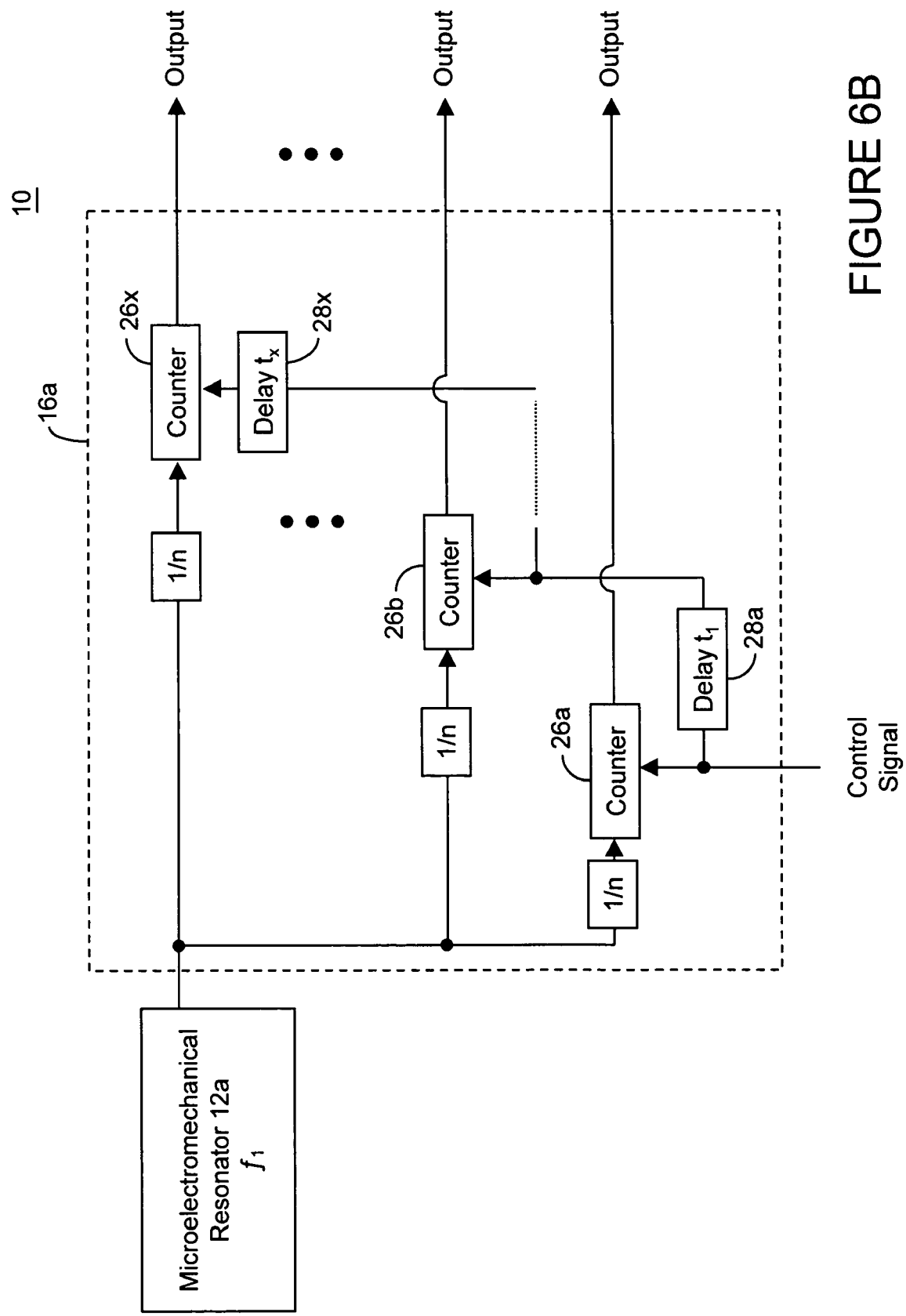
Figure 6C:
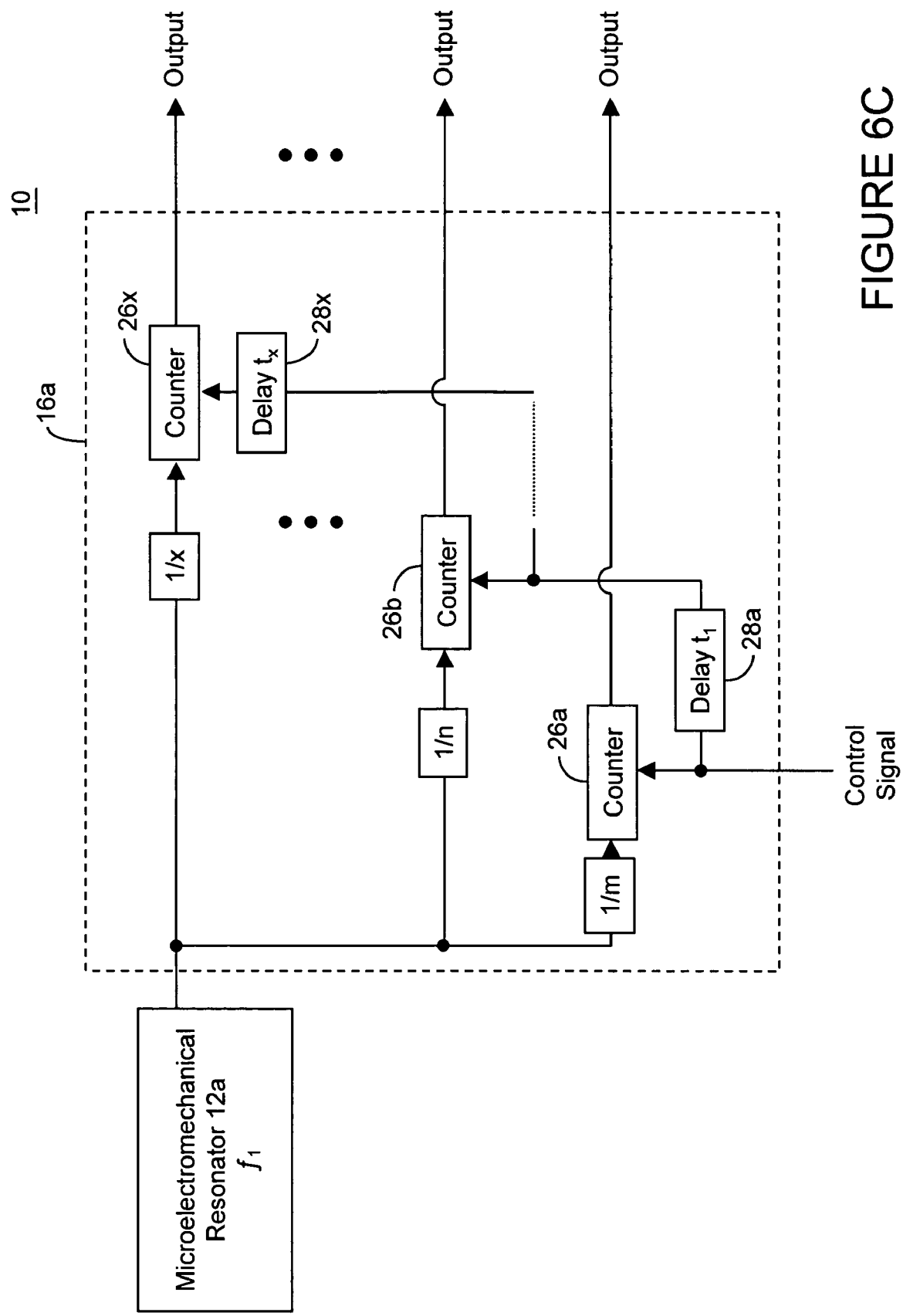

The control signal may be generated using any of the embodiments discussed herein, including for example, control signal generator circuitry 20 and/or counter circuitry 26b. Moreover, all permutations and combinations of enhancing the degree of accuracy of the temperature data are intended to fall within the scope of the present inventions. (See, for example, FIGS. 6B and 6C). For the sake of brevity, such permutations and combinations will not be discussed in detail.

As mentioned above, the temperature measurement system may also include processor circuitry to correlate or associate the output of the frequency division circuitry with an operating temperature of microelectromechanical resonators. For example, with reference to FIG. 3B, in one exemplary embodiment, temperature measurement system 10 includes processor circuitry 30 which receives the output of frequency division circuitry 14 and, based thereon, determines, estimates, calculates and/or provides an operating temperature of the operating of system 10 and/or portions thereof (for example, temperature of the plurality of microelectromechanical resonators 12). The processor circuitry may be, for example, a microprocessor, microcontroller, state machine, discrete logic (for example, CMOS logic), PGA and/or a look-up table architecture (for example, a ROM having a look-up table whose output is designated by the output or outputs of frequency division circuitry 14).

In one embodiment, processor circuitry 30 estimates the operating temperature using, for example, a look-up table including empirical, actual and/or mathematical modeling data. The data in the look-up table may be employed to extrapolate and/or determine an operating temperature. For example, where the look-up table includes empirical data, such empirical data may be obtained from one or more temperature measurement systems and then employed for all "similar" temperature measurement systems (for example, temperature measurement systems having the same or substantially the same designs and/or layouts (for example, microelectromechanical resonator designs or layouts) and/or temperature measurement systems derived from a given fabrication "lot" or "lots", i.e., microelectromechanical resonators and/or circuitry from the same wafer(s)).

In another embodiment, processor circuitry 30 may calculate an operating temperature using the output(s) of frequency division circuitry 14. For example, processor circuitry 30 may calculate the operating temperature using a mathematical relationship or model of the response of the temperature measurement system 10 (or portion thereof) over temperature. There are many techniques to calculate an operating temperature using the output(s) of frequency division circuitry 14; all such techniques, and implementations thereof, whether now known or later developed, are intended to fall within the scope of the present inventions.

Figure 3A:
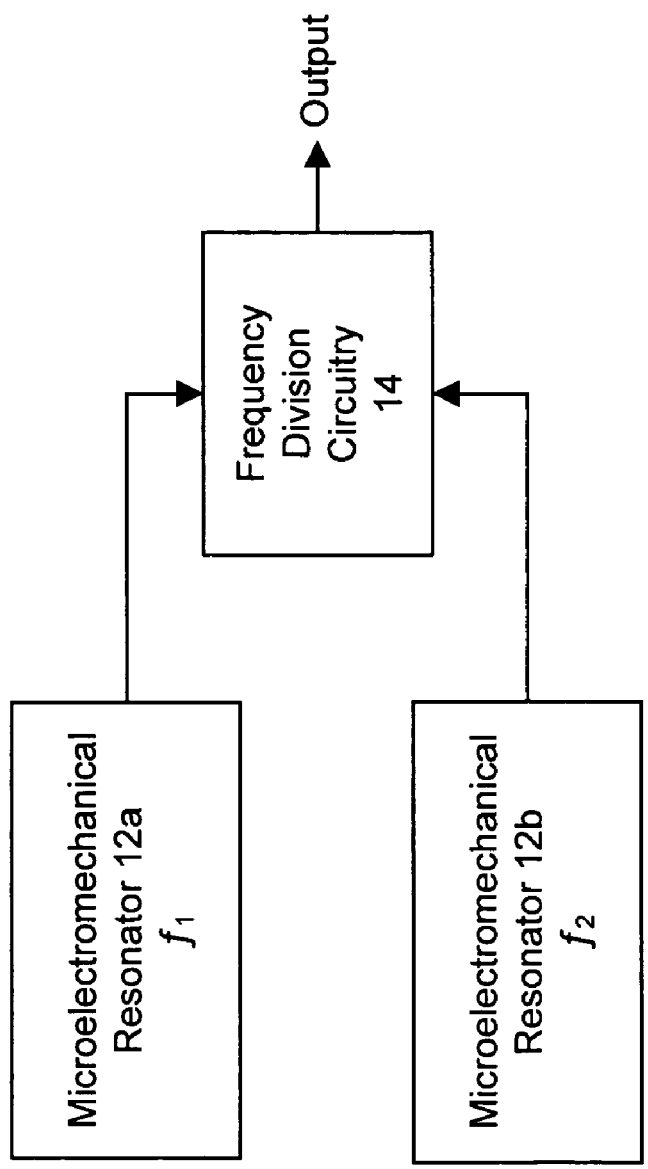
FIG. 3A is a block diagram representation of an exemplary temperature measurement system, including two microelectromechanical resonators and frequency division circuitry, according to certain aspects of the present inventions.
Figure 3B:
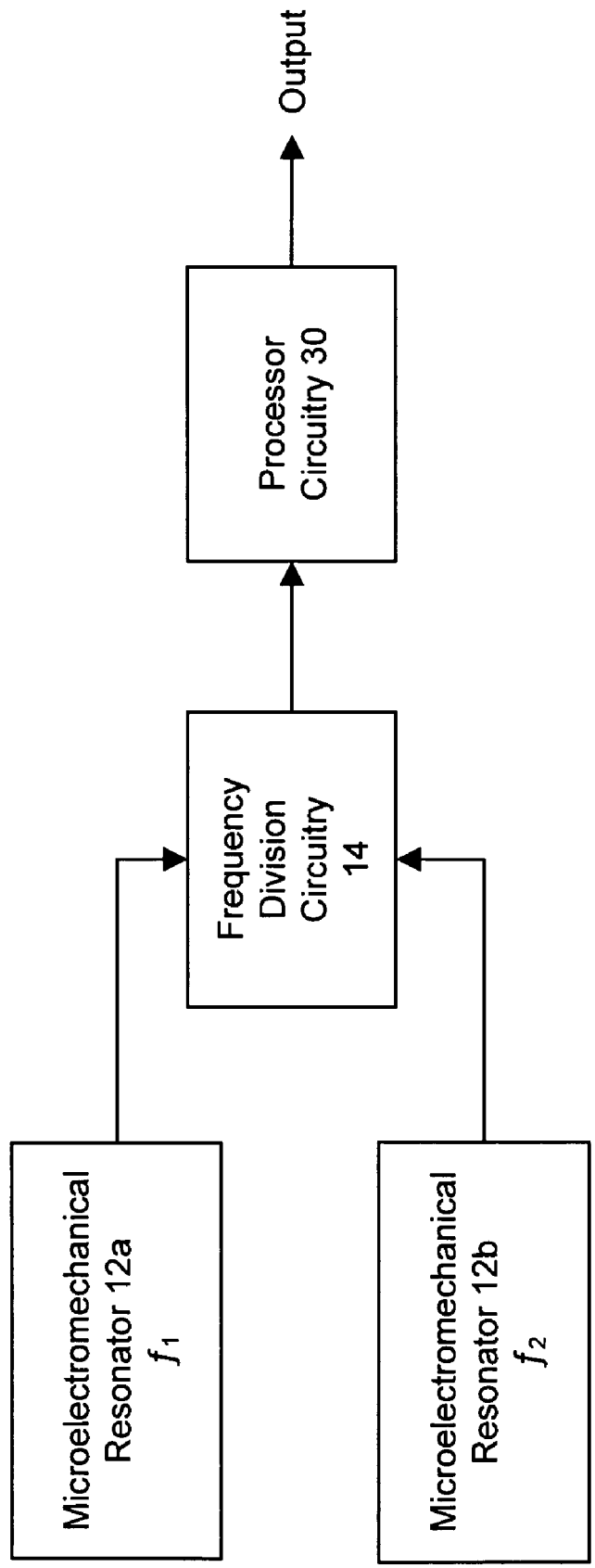
FIG. 3B is a block diagram representation of an exemplary temperature measurement system, including two microelectromechanical resonators and frequency division circuitry and processor circuitry, according to certain aspects of the present inventions.
Figure 3C:
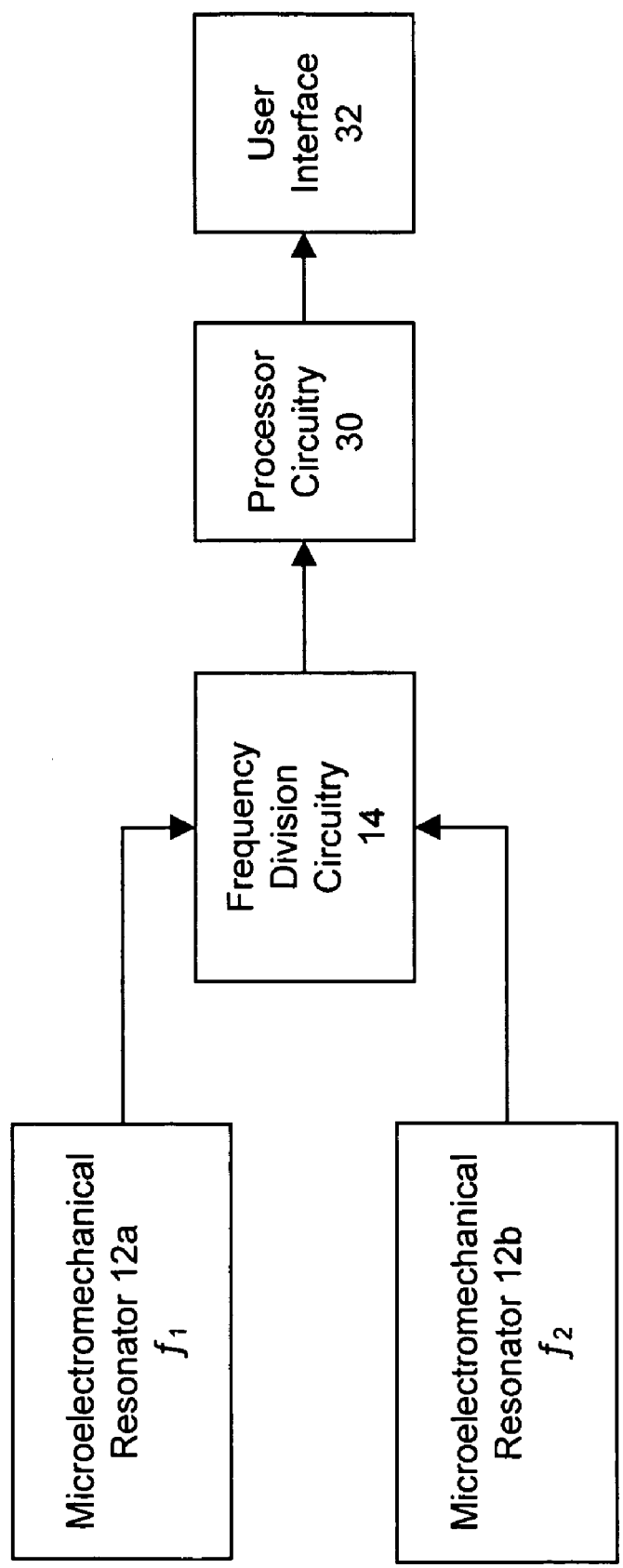
FIG. 3C is a block diagram representation of an exemplary temperature measurement system, including two microelectromechanical resonators and frequency division circuitry, processor circuitry and a user interface, according to certain aspects of the present inventions.
Figure 3D:
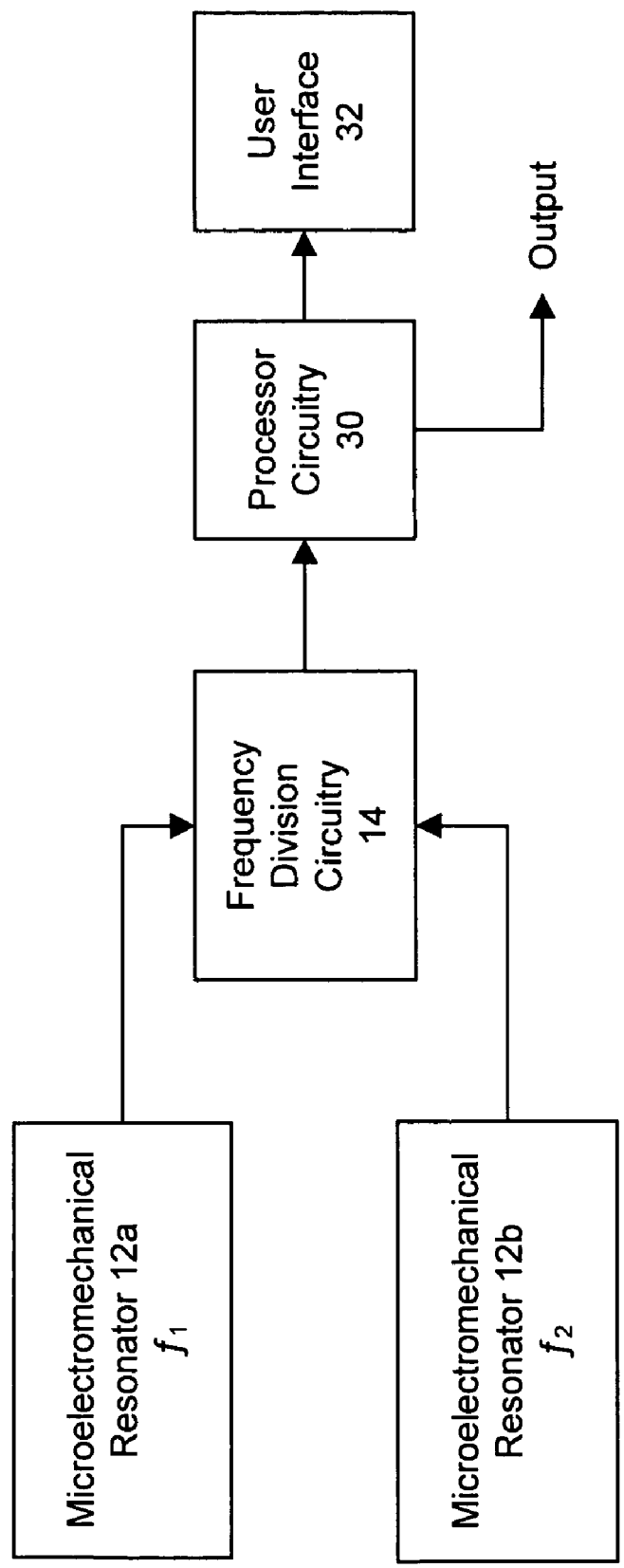
FIG. 3D is a block diagram representation of an exemplary temperature measurement system, including two microelectromechanical resonators and frequency division circuitry, processor circuitry and a user interface, wherein the processor circuitry includes an output to provide the data which is representative of the operating temperature of the system to integrated or external circuitry, according to certain aspects of the present inventions.

With reference to FIG. 3C, in one embodiment, processor circuitry 30 may provide an output signal that is representative of the operating temperature to user interface 32 (for example, a display or transducer (for example, an audio transducer)). In this way, the user may have information of the operating temperature via user interface 32. In addition thereto, or in lieu thereof, processor circuitry 30 may provide the output signal to other circuitry (for example, circuitry that is integrated and/or external relative to processor circuitry 30). (See, for example, FIGS. 3B and 3D).

Figure 3E:
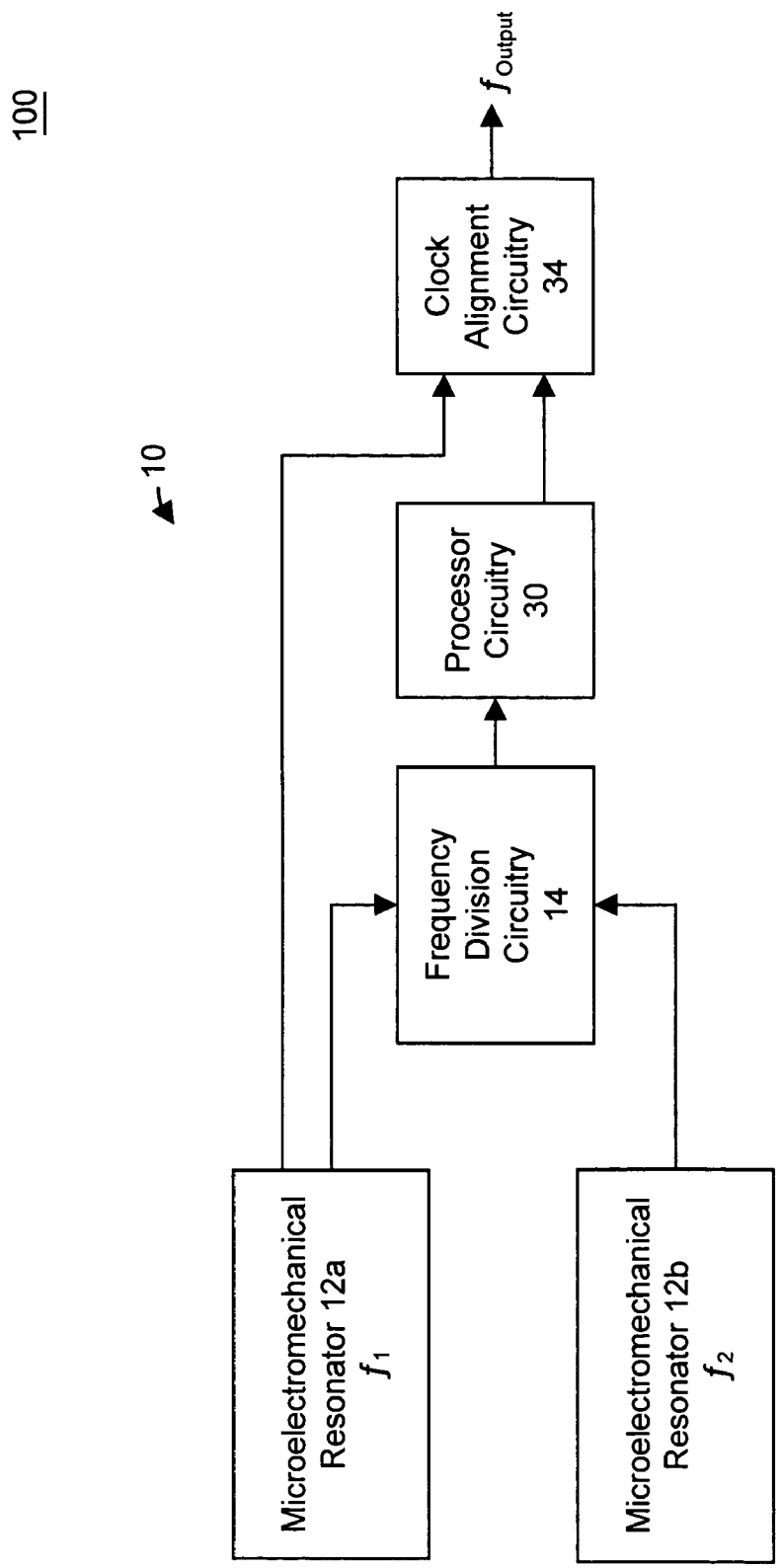
FIGS. 3E and 3F are block diagram representations of exemplary temperature measurement systems, including two microelectromechanical resonators and frequency division circuitry, processor circuitry and clock alignment circuitry, according to certain aspects of the present inventions.
Figure 3F:
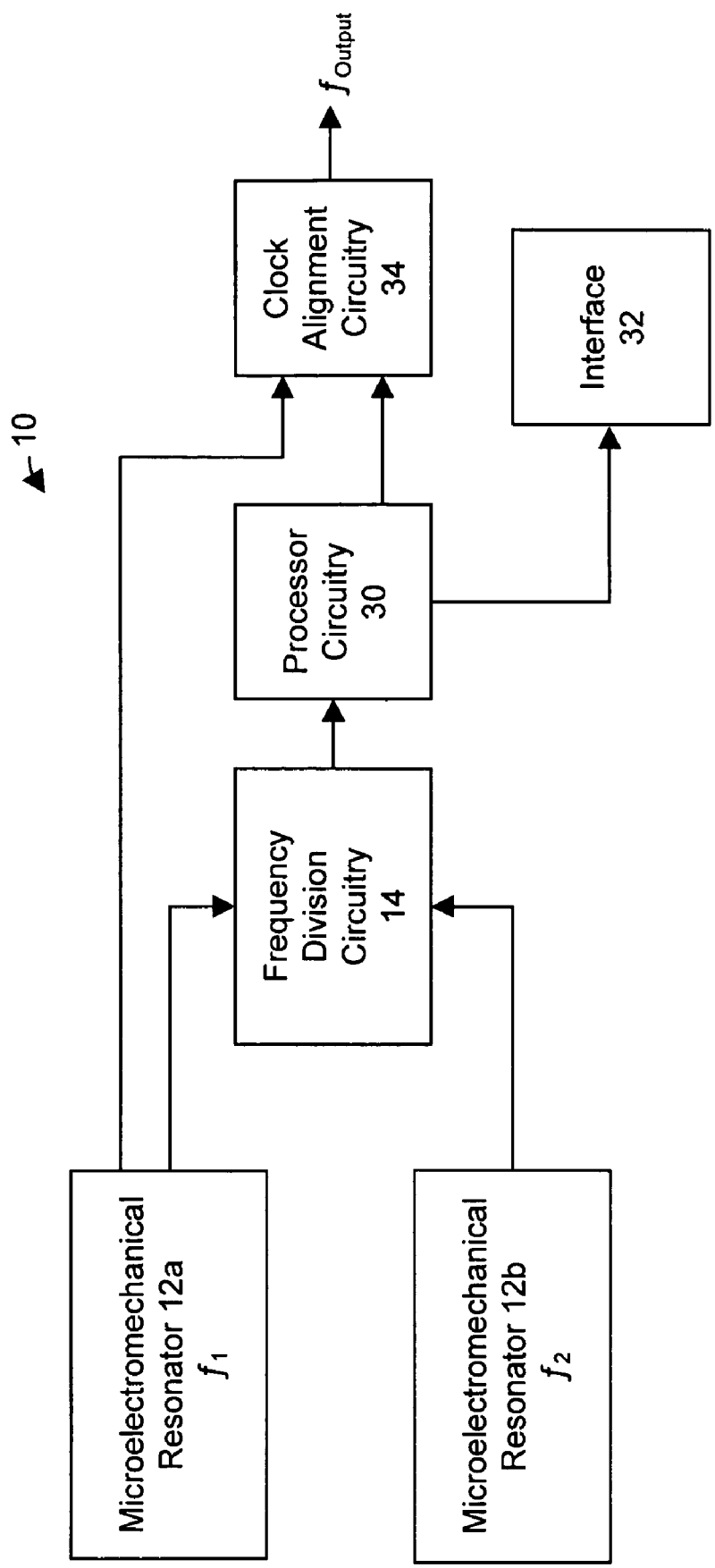

With reference to FIG. 3E, in another aspect, the present inventions are directed to an oscillator system 100 including temperature measurement system 10 (for example, any of the exemplary embodiments above) and clock alignment circuitry 34 to generate and/or output one or more signals having, for example, a desired, selected and/or predetermined frequency and/or phase. In this embodiment of oscillator system 100, clock alignment circuitry 34 receives one or more of the output signals of microelectromechanical resonators 12 (having a frequency that may vary with temperature) and, using the data which is representative of the operating temperature, generates an output signal ($f_{output}$) having a predetermined characteristics (for example, frequency and/or phase). In this embodiment, clock alignment circuitry 34 may employ the data which is representative of the operating temperature to adjust the parameters, references (for example, frequency and/or phase), values and/or coefficients employed by clock alignment circuitry 34 in order to generate and/or provide a predetermined, adjusted, corrected and/or controlled output having, for example, a desired, selected and/or predetermined frequency and/or phase (i.e., the function of clock alignment circuitry).

The clock alignment circuitry 34 may be, for example, FLL(s), PLL(s), DLL(s), and/or digital/frequency synthesizer(s) (for example, DDS(s)). The operation and implementation of FLL(s), PLL(s), DLL(s), and/or digital/frequency synthesizer(s) are well known to those skilled in the art.

The FLL(s), PLL(s), DLL(s) and/or digital/frequency synthesizer(s) may be cascaded in series so that a particular, precise and/or selectable frequency and phase are obtained. Indeed, any FLL, PLL (whether fractional or integer), DLL (whether fractional or integer) and/or digital/frequency synthesizers, as well as configuration thereof or alternatives therefor, whether now known or later developed, is intended to fall within the scope of the present inventions. Indeed, any clock or signal alignment circuitry 34, whether now known or later developed, may be employed to generate an output signal having precise and stable characteristics (for example, frequency and/or phase).

Moreover, the PLL, DLL, digital/frequency synthesizer and/or FLL may also compensate using multiplication and/or division to adjust, correct, compensate and/or control the characteristics (for example, the frequency, phase and/or jitter) of the output signal of microelectromechanical resonators 12. The multiplication or division (and/or phase adjustments) by clock alignment circuitry 34 may be in fine or coarse increments. For example, clock alignment circuitry 34 may include an integer PLL, a fractional PLL and/or a fine-fractional-N PLL to precisely select, control and/or set the output signal of oscillator system 100. In this regard, the output of frequency division circuitry 14 may be provided to the input of the fractional-N PLL and/or the fine-fractional-N PLL (hereinafter collectively "fractional-N PLL"), which may be pre-set, pre-programmed and/or programmable (in memory, for example, fuses, anti-fuses, DRAM, SRAM, EEPROM, latch and/or register) to provide an output signal having a desired, selected and/or predetermined frequency and/or phase.

Notably, the parameters, references (for example, frequency and/or phase), values and/or coefficients employed by clock alignment circuitry 34 may be externally provided to clock alignment circuitry 34 either before or during operation of oscillator system 100. In this regard, a user or external circuitry/devices/systems may provide information representative of the parameters, references, values and/or coefficients to set, change, enhance and/or optimize the performance of clock alignment circuitry 34 and/or oscillator system 100.

As mentioned above, the data which is representative of the operating temperature may be employed by clock alignment circuitry 34 to adjust the parameters, references (for example, frequency and/or phase), values and/or coefficients employed by clock alignment circuitry 34 in order to generate and/or provide a predetermined, adjusted, corrected and/or controlled output having, for example, a desired, selected and/or predetermined frequency and/or phase (i.e., the function of clock alignment circuitry). For example, clock alignment circuitry 34, in one embodiment, may include control or processing circuitry which, in response to the data which is representative of the operating temperature, may adjust the parameters, references (for example, frequency and/or phase), values and/or coefficients employed by clock alignment circuitry 34. That circuitry may employ a look-up table and/or a predetermined or mathematical relationship to adjust and/or control the operating characteristics of clock alignment circuitry 34 to compensate and/or correct for changes in the operating temperature of the microelectromechanical-based oscillator system (or portions thereof). (See, for example, U.S. Pat.

No. 6,995,622). Indeed, any control or processing circuitry whether now known or later developed is intended to fall within the scope of the present invention.

The output signal of clock alignment circuitry 34 may be single ended differential. The "shape" of the output signal (for example, square, pulse, sinusoidal or clipped sinusoidal) may be predetermined and/or programmable. In this regard, information which is representative of the "shape" of the output signal may be stored or programmed in memory (which is resident in, for example, clock alignment circuitry 34 during fabrication, test, calibration and/or operation. In this way, clock alignment circuitry 34 may access a resident memory to obtain such information during start-up/power-up, initialization, re-initialization and/or during normal operation of oscillator system 100 and/or clock alignment circuitry 34.

Notably, in the illustrative embodiment of FIG. 3E, clock alignment circuitry 34 employs the output signal of microelectromechanical resonator 12a. In addition or in lieu thereof, clock alignment circuitry 34 may employ the output signal of microelectromechanical resonator 12b. Further, clock alignment circuitry 34 may be implemented in any of the embodiments described herein, for example, those embodiments directed to temperature management system 10. All permutations and/or combinations of these embodiments are intended to fall within the scope of the present inventions. (See, for example, FIG. 3F). For the sake of brevity, such permutations and/or combinations will not be discussed in detail.

Figure 7A:
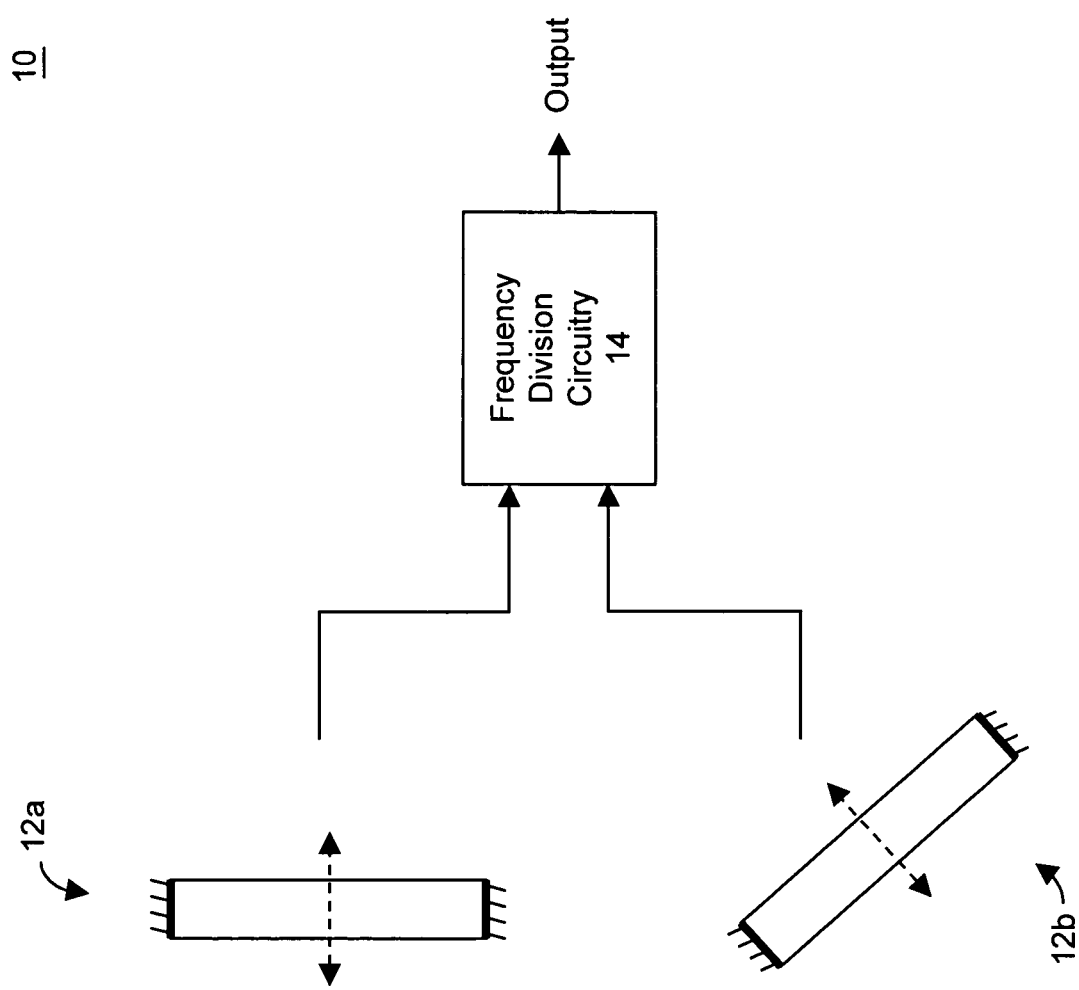
FIG. 7A is a block diagram representation of an exemplary microelectromechanical oscillator system according to an embodiment of one aspect of the present inventions, wherein one or more of the microelectromechanical resonators include a resonating beam (which is anchored at both ends)
Figure 7B:
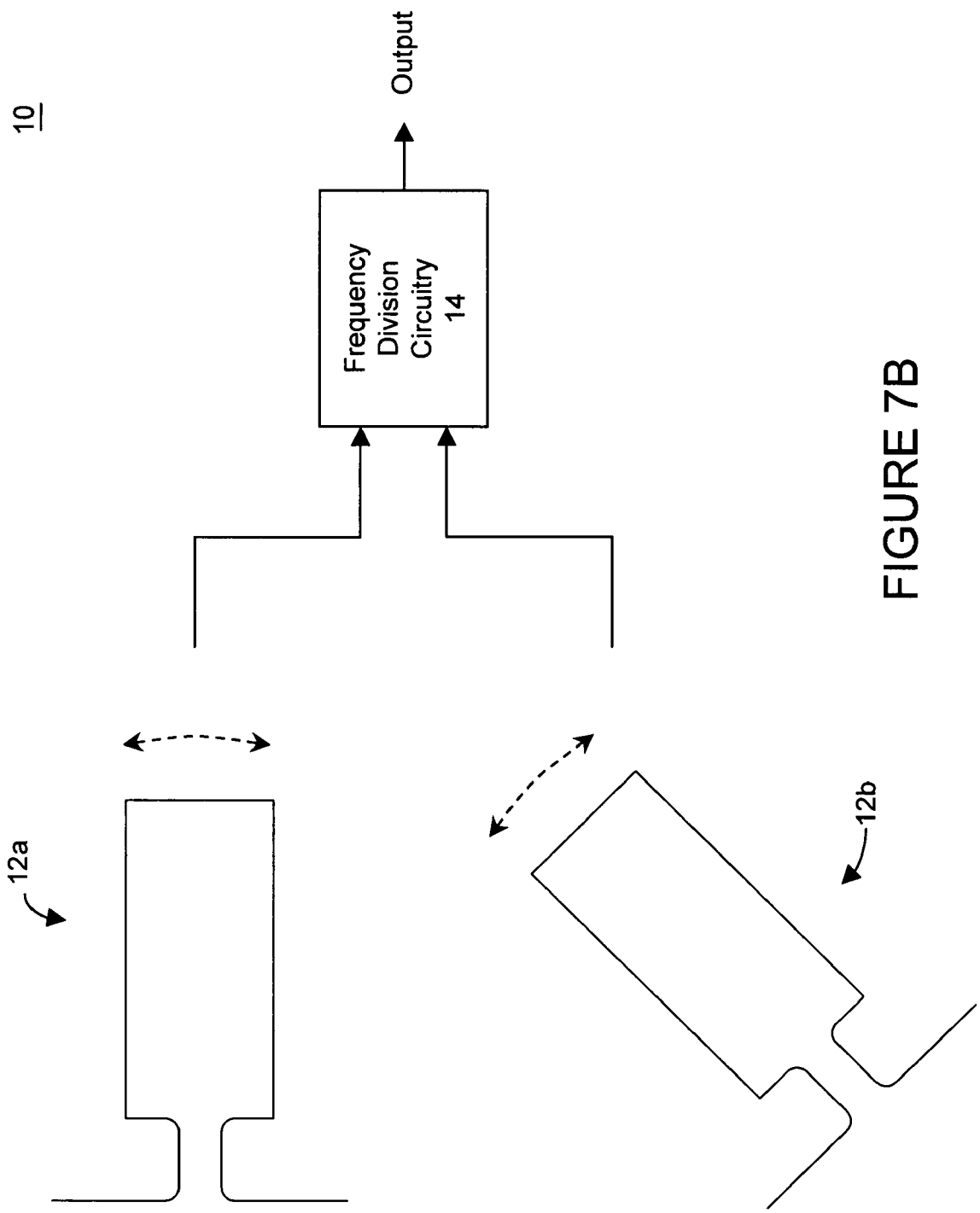
FIG. 7B is a block diagram representation of an exemplary microelectromechanical oscillator system according to another embodiment of one aspect of the present inventions, wherein one or more of the microelectromechanical resonators are illustrated as "paddle" like resonating beams which include layouts which are rotated relative to each other to provide different changes in Young's modulus over temperature due to the different layout orientations.
Figure 7C:
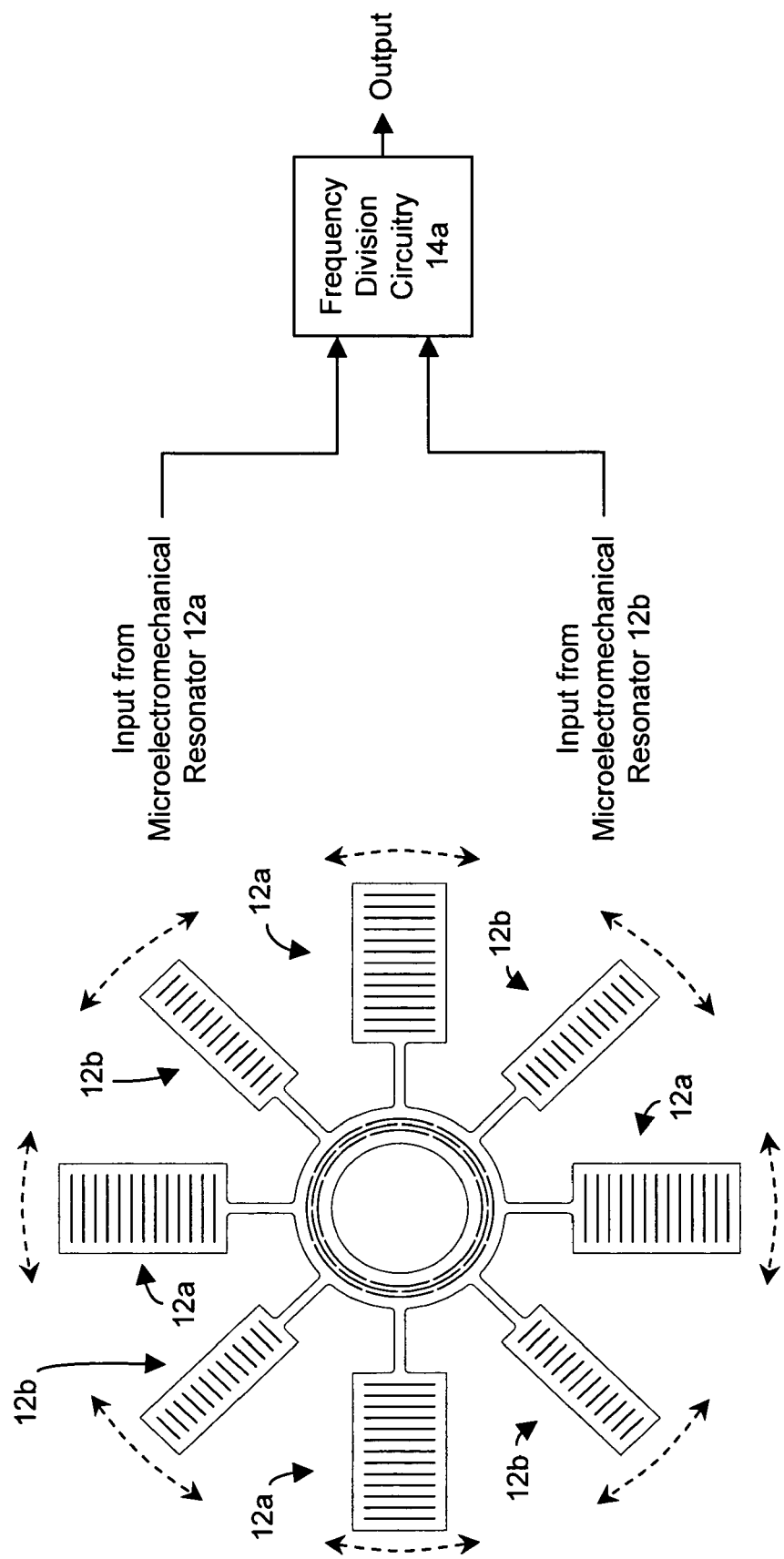
FIG. 7C is a block diagram representation of an exemplary microelectromechanical oscillator system according to another embodiment of one aspect of the present inventions, wherein the microelectromechanical resonators are illustrated as "paddle" like resonating beams which are coupled to a common structure and include layouts which are rotated relative to each other to provide different changes in Young's modulus over temperature due to the different layout orientations.
Figure 7D:
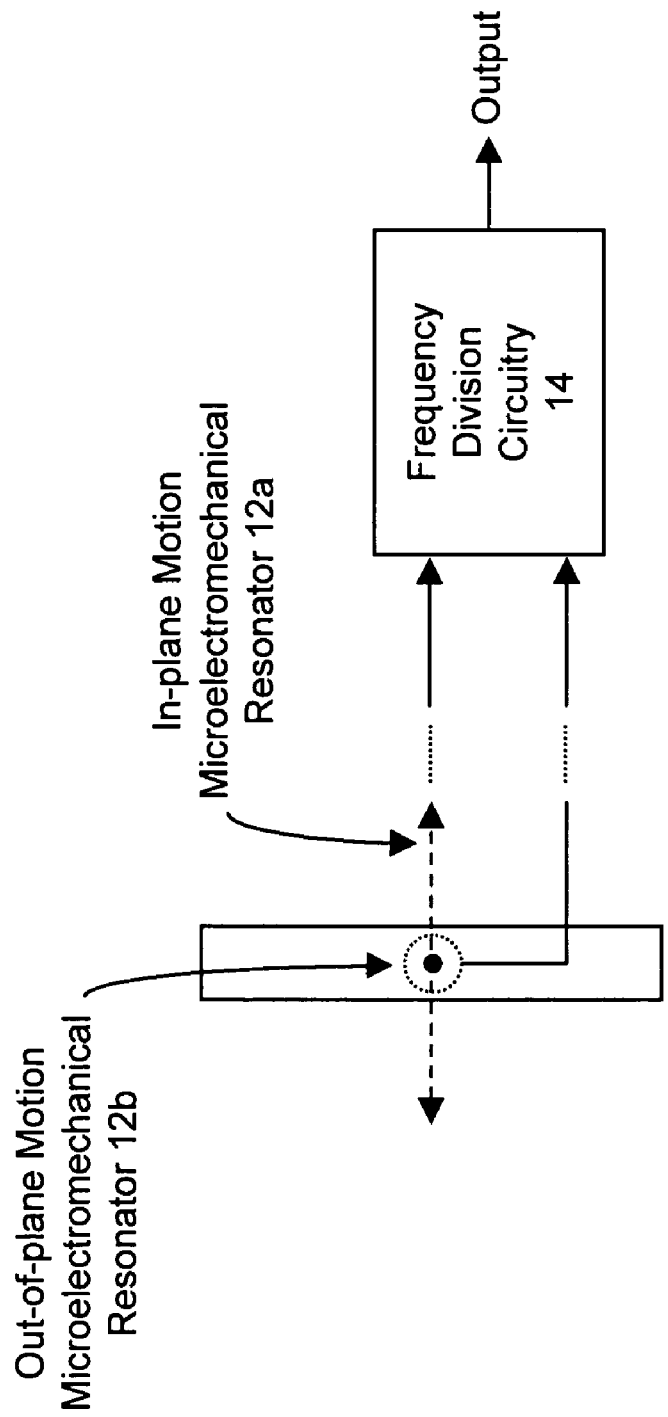
FIG. 7D is a block diagram representation of an exemplary microelectromechanical oscillator system according to an embodiment of one aspect of the present inventions, wherein the microelectromechanical resonators are the same resonating beam of the same physical structure which resonate in multiple, different Eigen-modes of operation, for example, in-plane and out-of-plane or combinations of lateral or rotational modes that exhibit different temperature coefficients.

The microelectromechanical resonators 12 may employ any type of microelectromechanical resonator design, architecture and/or control, whether now known or later developed; and all such microelectromechanical resonator designs, architectures and/or control techniques are intended to fall within the scope of the present inventions. (See, for example, FIGS. 7A-7C). For example, microelectromechanical resonators 12 may include a resonating beam which is anchored at both ends. (See, for example, FIG. 7A). Moreover, microelectromechanical resonators 12 may include a paddle-like design. (See, for example, FIG. 7B). Indeed, microelectromechanical resonators 12 may be components or portions of the same physical structure (see, for example, FIG. 7C) and/or microelectromechanical resonators 12 may be the same component or portion of the same physical structure that resonate in multiple, different modes of operation, for example, in-plane and out-of-plane (see, for example, FIG. 7D). Again, all microelectromechanical resonator designs, structures, architectures and/or control techniques, whether now known or later developed, are intended to fall within the scope of the present inventions.

Further, microelectromechanical resonators 12 may be fabricated and/or packaged using any fabrication and/or packaging techniques whether now known or later developed. Indeed, all such fabrication and/or packaging techniques are intended to fall within the scope of the present inventions.

In one exemplary embodiment, in the context of monocrystalline silicon, the strain field of microelectromechanical resonator 12a may be predominantly oriented in the <110> direction in the (100) plane, and the strain field of microelectromechanical resonator 12b may be disposed in the <100> direction on the (100) plane (stated differently, the two strain fields are oriented at an angle of 45° with respect to each other in the (100) plane)). (See, for example, FIGS. 7B and 7C). As such, Young's modulus of microelectromechanical resonators 12a and 12b are different, and the manner and/or rate of change of Young's modulus of microelectromechanical resonators 12a and 12b differ over operating temperature (i.e., E(T) differs). (See, for example, FIG. 2).

Figure 8A:
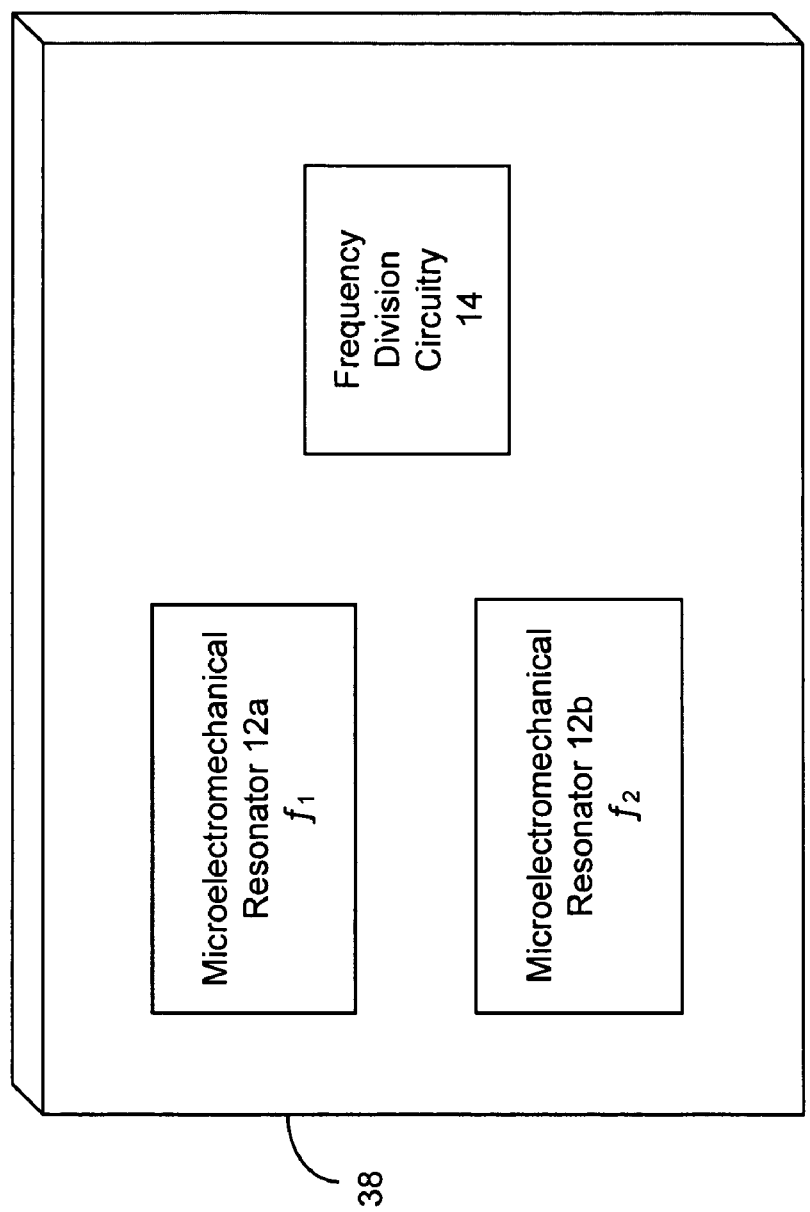
Figure 8B:
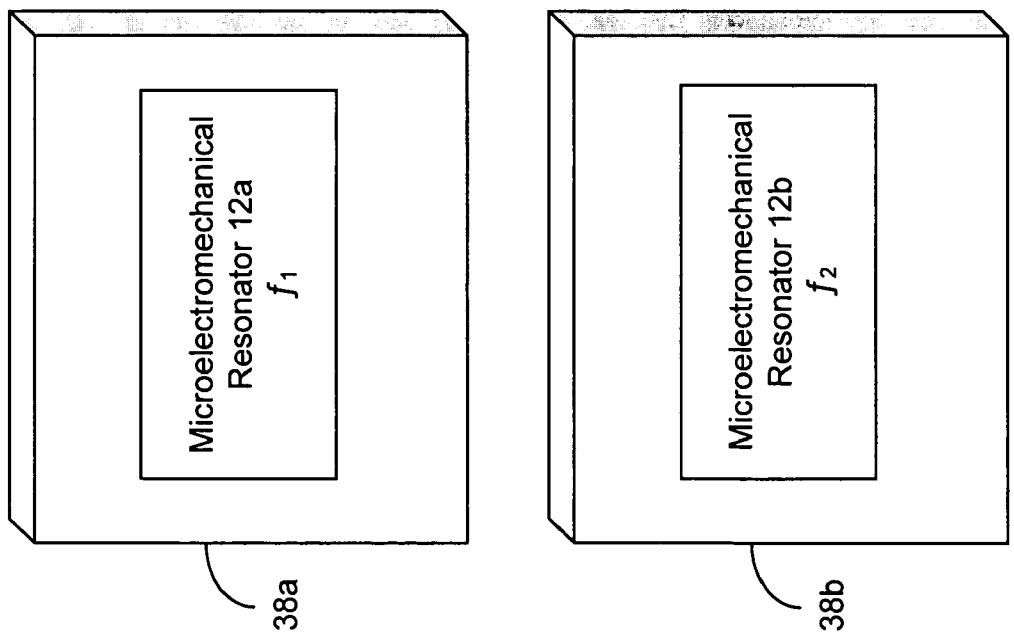
Figure 8C:
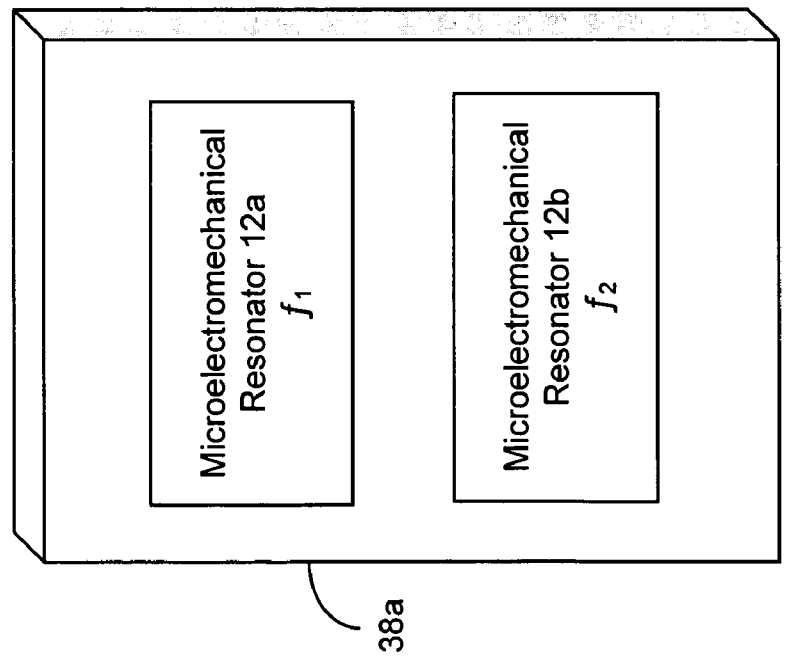

The microelectromechanical resonators 12 may be disposed on/in the same substrate or on/in different substrates. Moreover, frequency division circuitry 14 may be disposed on/in the same substrates as one or more microelectromechanical resonators 12, or on/in a different substrate. In particular, microelectromechanical resonators 12 and/or frequency division circuitry 14 may be integrated on/in the same substrate 38 (see, for example, FIG. 8A), on/in different substrates 38a, 38b and 38c (see, for example, FIG. 8B), on/in different substrates 38a and 38b (see, for example, FIGS. 8C and 8D). All permutations and combinations thereof are intended to fall within the scope of the present inventions.

Figure 8E:
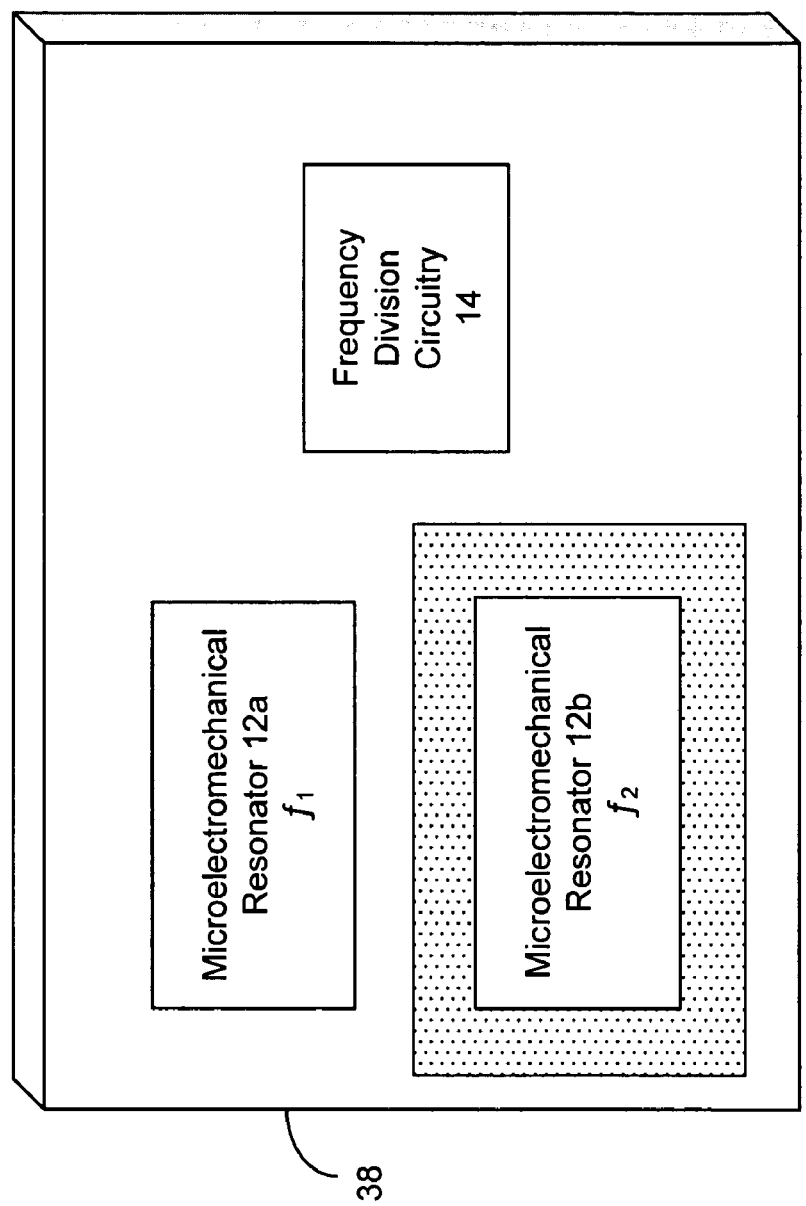
Figure 8F:
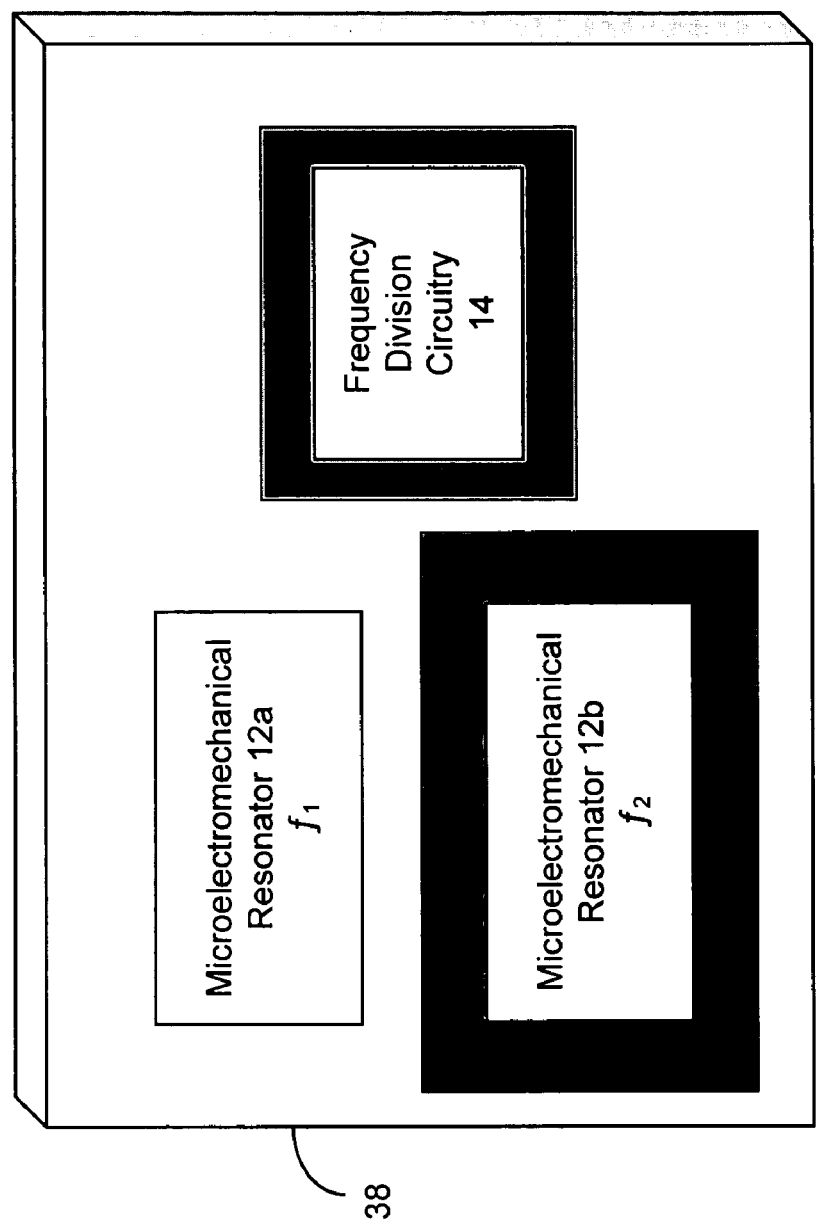
Figure 8K:
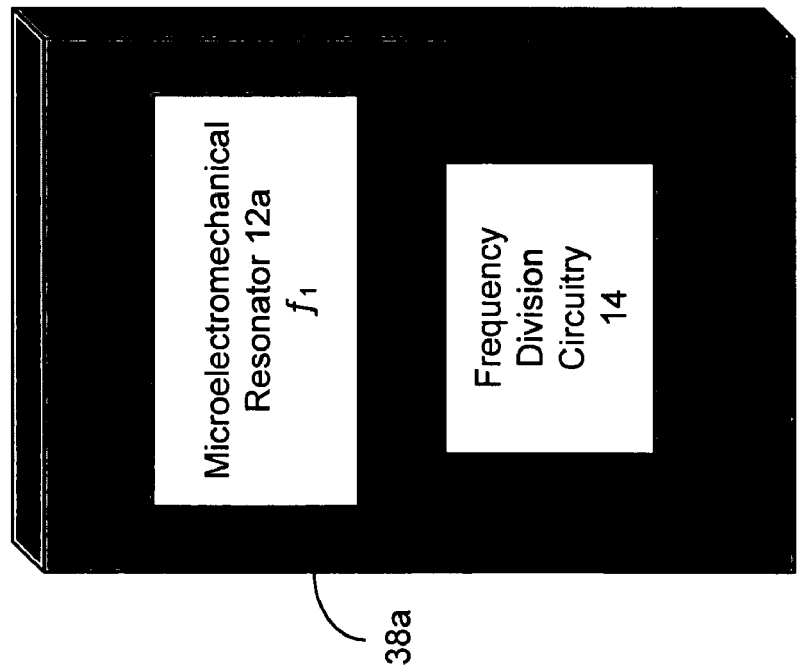

Moreover, microelectromechanical resonators 12 may be fabricated, in whole or in part, in/from the same materials or different materials. (See, for example, FIGS. 8E-8K). For example, microelectromechanical resonators 12 may be integrated on/in the same substrate 38 and in/from different materials (see, for example, FIGS. 8E, 8F and 8I) such as a substrate having monocrystalline silicon and polycrystalline silicon wherein microelectromechanical resonator 12a is fabricated in/on monocrystalline silicon and microelectromechanical resonator 12b is fabricated in/on polycrystalline silicon. Further, microelectromechanical resonators 12 may be integrated on/in different substrates 38a and 38b and in/from different materials (see, for example, FIGS. 8G and 8H). Moreover, frequency division circuitry 14 and one or more microelectromechanical resonators 12 may also be fabricated in/from the same or different materials (see, for example, FIGS. 8J and 8K). All permutations and combinations thereof are intended to fall within the scope of the present inventions. Moreover, as mentioned above, any fabrication and packaging technique and/or process may be implemented.

Indeed, "different" materials may also be provided by employing a starting or base material(s) which includes a first portion (wherein microelectromechanical resonator 12a is fabricated in/on) having a first dopant(s) and/or first doping concentrations and a second portion (wherein microelectromechanical resonator 12b is fabricated in/on) having a dopant(s) and/or doping concentrations which are different from the first dopant(s) and/or first doping concentrations. In this regard, the same starting material(s) may be doped with an impurity at differing amounts/ratios or differing impurity types thereby providing "different" materials. For example, microelectromechanical resonator 12a may be fabricated in or from an undoped monocrystalline silicon and microelectromechanical resonator 12 may be fabricated in or from a monocrystalline silicon which is doped with phosphorus, arsenic, antimony, and/or boron.

Notably, in those instances where microelectromechanical resonators 12 and/or frequency division circuitry 14 (and/or clock alignment circuitry, discussed below) are fabricated in/on separate substrates, the various signals may be provided using electrical interconnects (not illustrated) connecting bond pads (not illustrated) located in/on substrates and/or flip-chip techniques. Where microelectromechanical resonators 12 and/or frequency division circuitry 14 are fabricated in/on the same substrate, the various signals may be provided using interconnections disposed in/on the substrates. The present inventions may employ any interconnect or interconnection technique/architecture whether now known (for example, micro-pads, BGA and/or wire bonding) or later developed. All such techniques/architectures are intended to fall within the scope of the present inventions.

Notably, temperature measurement system 10 and/or oscillator system 100 may include circuitry and/or elements disposed between microelectromechanical resonators 12 and frequency division circuitry 14. For example, with reference to FIG. 9A, system 10 may include resonator drive and sense circuitry 40 to drive an associated microelectromechanical resonator 12 and senses an output signal therefrom. The resonator drive and sense circuitry 40, as well as drive and sense electrodes (not illustrated), may be conventional well-known drive and sense circuitry. Indeed, drive and sense circuitry 40 may be any microelectromechanical drive and sense circuitry whether now known or later developed. For example, drive and sense circuitry 40 may be configured to provide a single-ended output signal or differential output signals.

Notably, drive and sense circuitry 40 may be integrated on the same substrate in which the associated microelectromechanical resonator 12 resides (or is fabricated in). In addition, or in lieu thereof, drive and sense circuitry 40 may be integrated on a substrate that is physically separate from (and electrically connected with) the substrate in which the associated microelectromechanical resonator 12 resides.

In addition, drive and sense electrodes (not illustrated), may be of a conventional, well known type or may be any type and/or shaped electrode whether now known or later developed. Further, the physical electrodes and/or other portions of microelectromechanical resonator 12 may include, for example, capacitive, piezoresistive, piezoelectric, inductive, magnetorestrictive and/or thermal transduction mechanisms. Indeed, all physical transduction mechanisms whether now known or later developed for microelectromechanical systems are intended to fall within the scope of the present inventions.

Figure 9A:
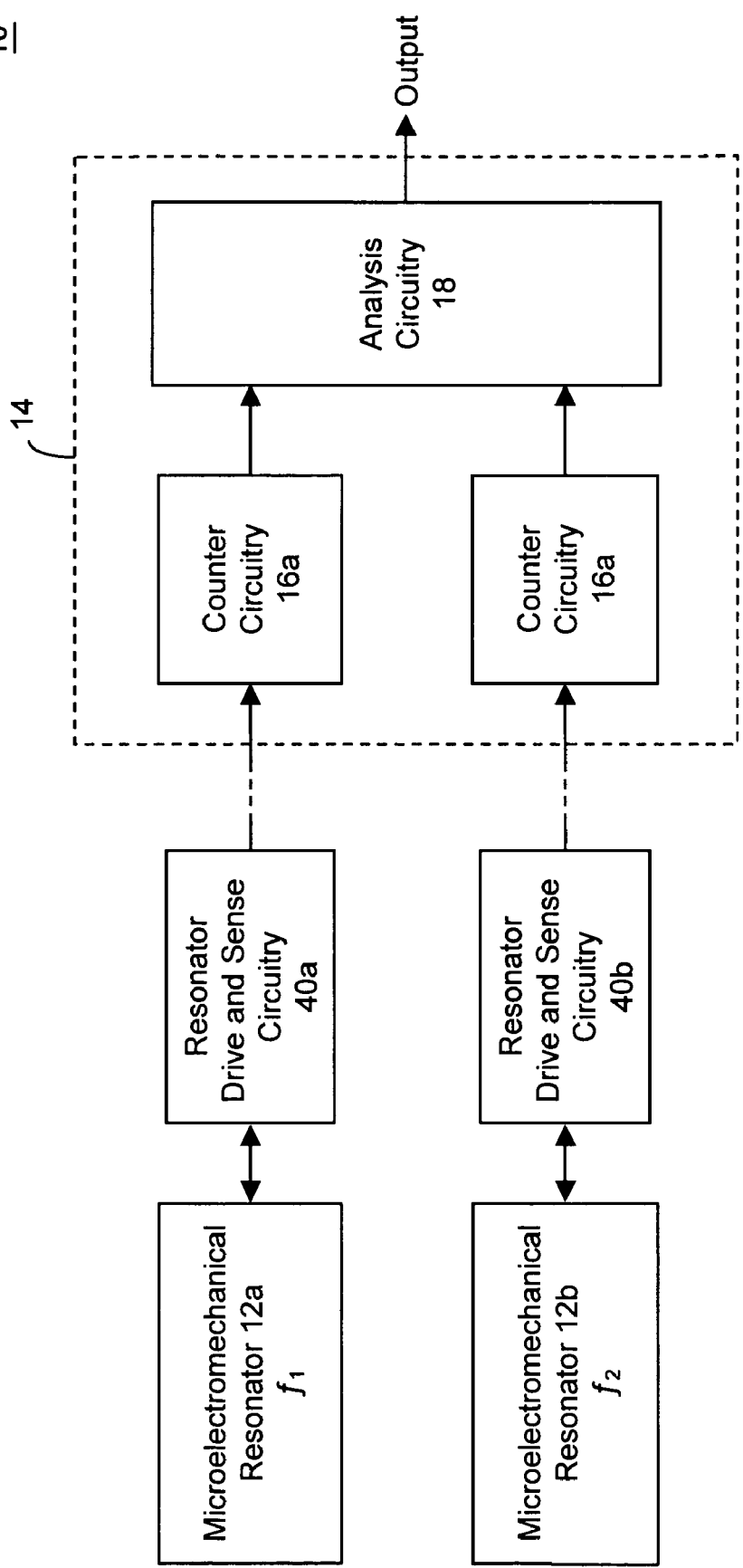
FIG. 9A is a block diagram representation of an exemplary temperature measurement system having two microelectromechanical resonators, resonator drive and sense circuitry, and frequency division circuitry (according to one exemplary counter circuitry embodiment) to provide, generate and/or output a signal which is representative of an operating temperature, according to certain aspects of the present inventions.
Figure 9B:
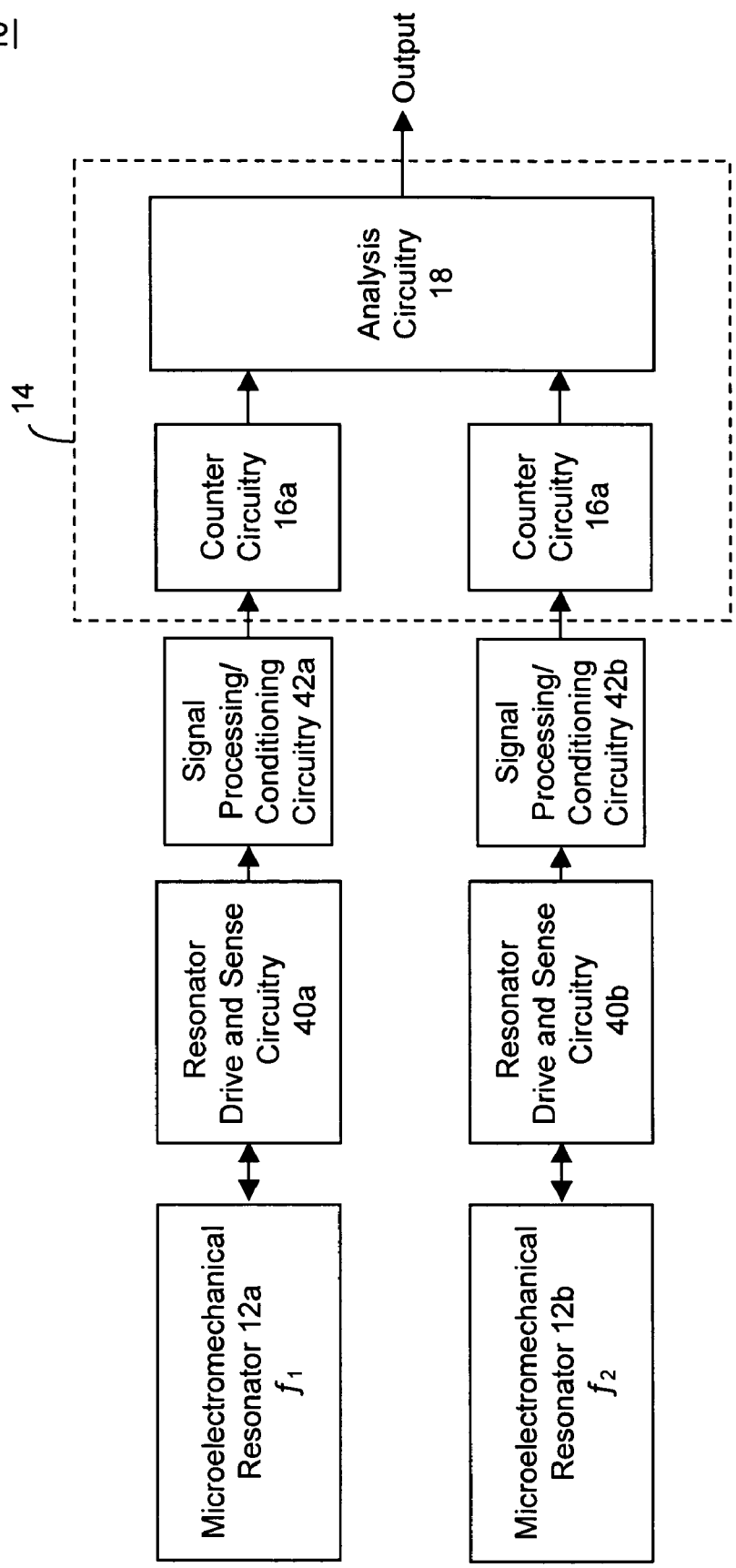
FIG. 9B is a block diagram representation of an exemplary temperature measurement system having two microelectromechanical resonators, resonator drive and sense circuitry, and frequency division circuitry (according to one exemplary counter circuitry embodiment), in conjunction with signal processing/conditioning circuitry, according to certain aspects of the present inventions.

With reference to FIG. 9B, in another embodiment, temperature measurement system 10 (and/or oscillator system 100) includes signal processing/conditioning circuitry 42a and 42b which performs preprocessing of the output signals of microelectromechanical resonator 12 (and drive and sense circuitry 40). For example, signal processing/conditioning circuitry 42a and 42b may amplify and/or clip the output of microelectromechanical resonator 12 (and drive and sense circuitry 40). The amplified and/or clip signal may thereafter be provided to frequency division circuitry 14. Notably, signal processing/conditioning circuitry 42a and 42b may be included in temperature measurement system 10 (and/or oscillator system 100) without departing from the scope of the present inventions.

Figure 10A:
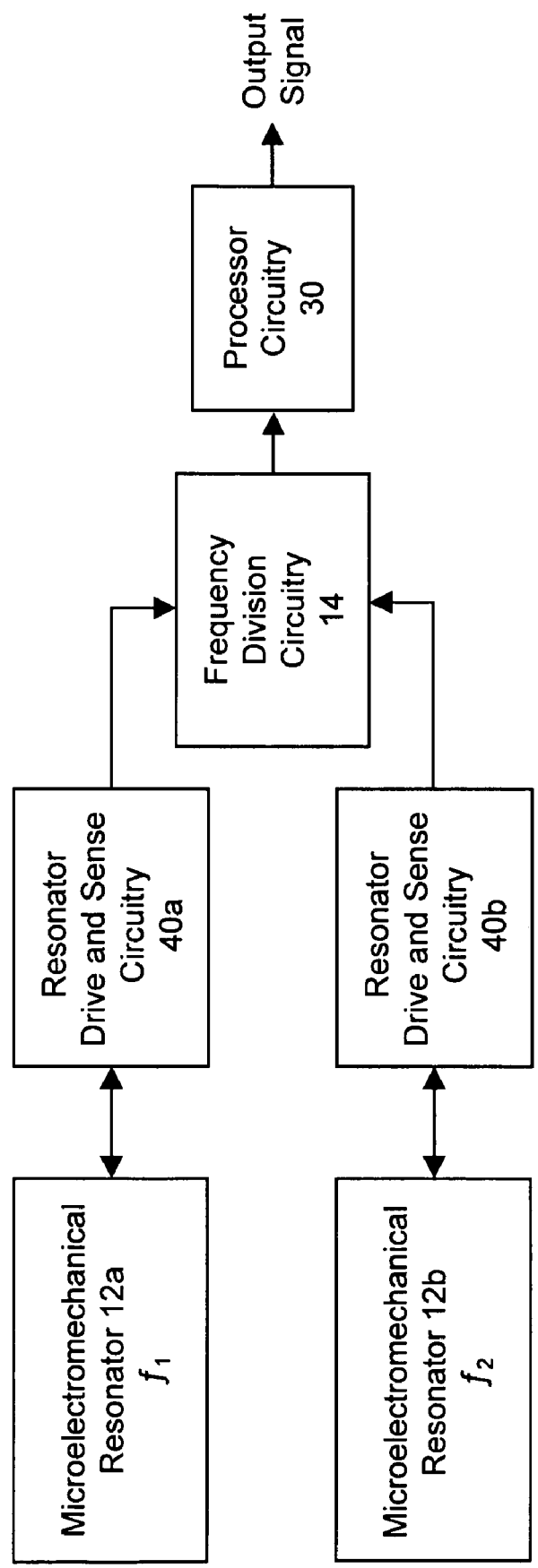
FIG. 10A is a block diagram representation of an exemplary temperature measurement system having two microelectromechanical resonators, frequency division circuitry and processor circuitry to provide, generate and/or output a signal which is representative of an operating temperature, according to certain aspects of the present inventions.
Figure 10B:
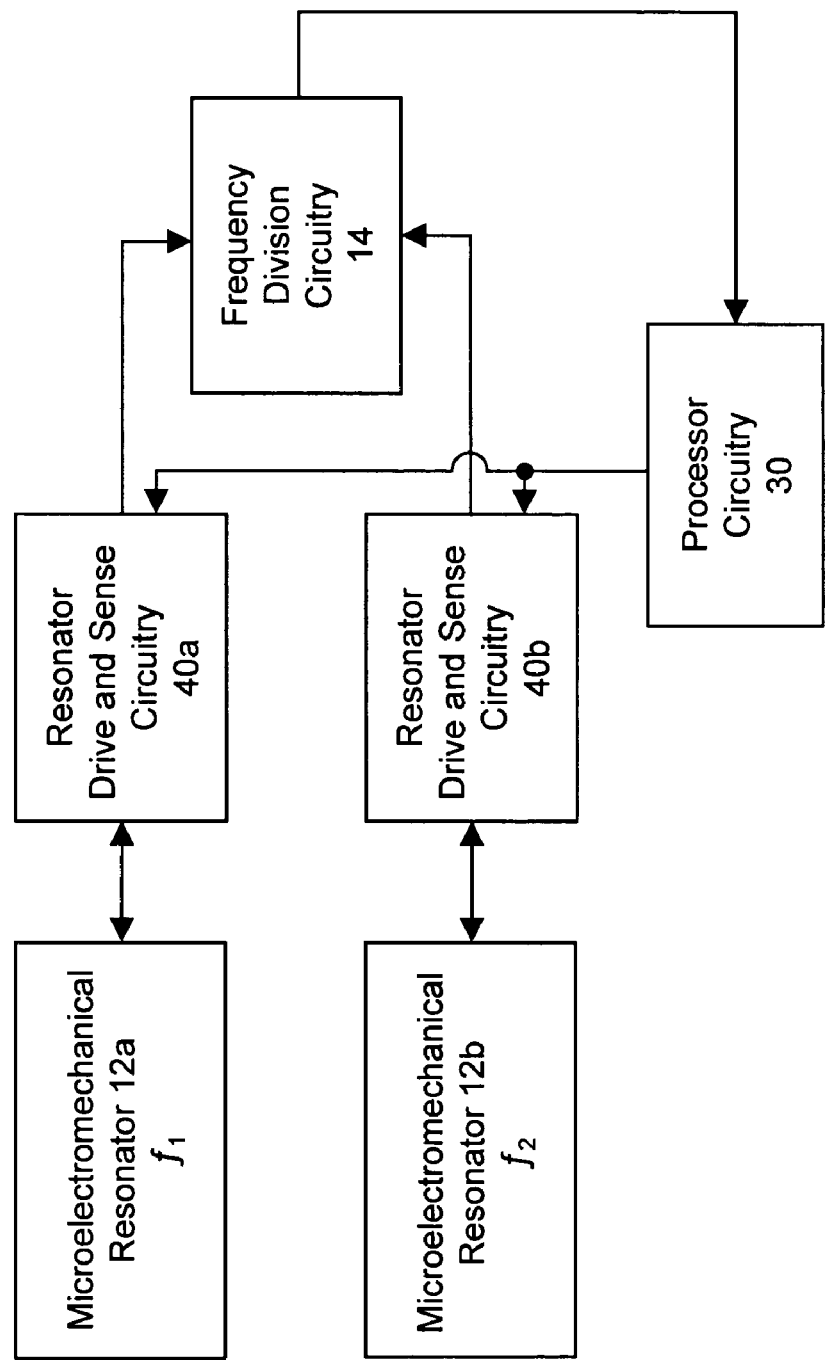
FIG. 10B is a block diagram representation of an exemplary temperature measurement system having two microelectromechanical resonators, frequency division circuitry and processor circuitry configured in a feedback architecture with drive and sense circuitry, according to certain aspects of the present inventions.

With reference to FIG. 10A, as mentioned above, in one embodiment, temperature measurement system 10 employs processor circuitry 30 to interpret, analyze and/or correlate the data provided or generated by frequency division circuitry 14 to an operating temperature. The processor circuitry 30, in one embodiment, employs a look-up table (based on, for example, empirical and/or theoretical data) and/or a predetermined or mathematical relationship to interpret, analyze and/or correlate the data provided by frequency division circuitry 14. The processor circuitry 30 may generate and/or provide temperature sensor data which is representative of the operating temperature to other circuitry (internal/integrated or external).

In another embodiment, processor circuitry 30, in response to the data form frequency division circuitry 14, may adjust and/or control the operation of one or more of the microelectromechanical resonators 12 (via, for example, the associated resonator drive and sense circuitry 40) to compensate, address and/or correct for, for example, variations of the material properties and/or manufacturing variances of the fabrication processes (and/or for changes in operating temperature of microelectromechanical resonators 12). (See, for example, FIG. 10B). In this regard, the actual frequency of the output of one or more microelectromechanical resonators 12 may, for example, require modification and/or adjustment and/or the materials may include differing mechanical properties from anticipated/designed. Accordingly, in one embodiment, processor circuitry 30 may instruct and/or cause resonator drive and sense circuitry 40 to adjust, for example, the bias drive for one or more of microelectromechanical resonators 12. In this way, the characteristics of the output signal (for example, frequency) of one or more of microelectromechanical resonators 12 may be adjusted and/or controlled after fabrication and/or in situ. Notably, this process may be repeated until a predetermined (whether before or after fabrication) and/or more desirable or optimum performance of temperature measurement system 10 is obtained.

Figure 10C:
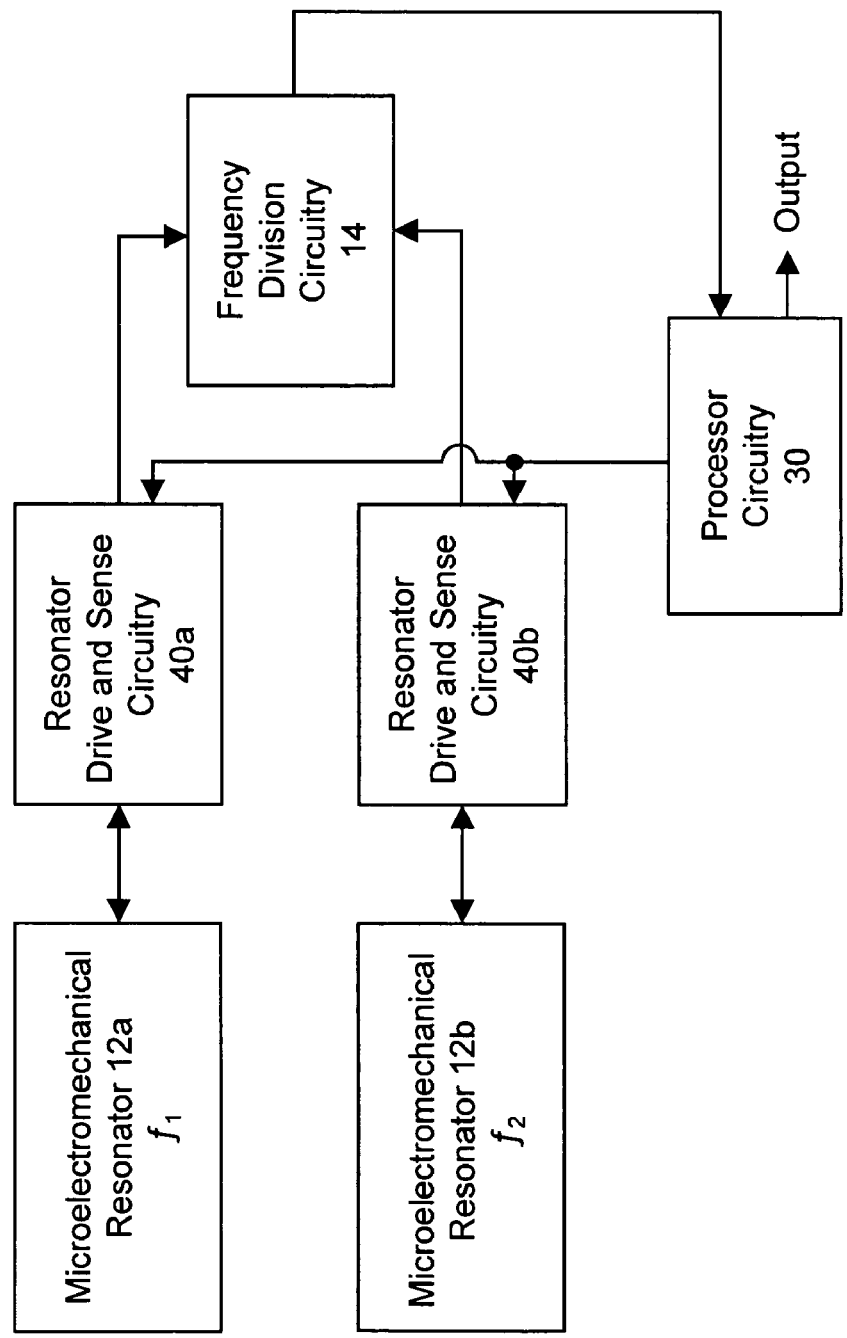
FIG. 10C is a block diagram representation of an exemplary temperature measurement system having two microelectromechanical resonators, frequency division circuitry and processor circuitry to provide, generate and/or output a signal which is representative of an operating temperature as well as to provide control information to drive and sense circuitry, according to certain aspects of the present inventions.

With reference to FIG. 10C, in another embodiment, processor circuitry 30, in addition to adjusting and/or controlling the operation of one or more of microelectromechanical resonators 12 (via, for example, an associated resonator drive and sense circuitry 40) using temperature data from frequency division circuitry 14, may also provide an output signal which is representative of the operating temperature of microelectromechanical resonators 12. In this way, other circuitry may employ the temperature related data to control, adjust and/or change such circuitry in accordance with operating temperature.

The embodiments where processor circuitry 30 adjusts and/or controls the operation of one or more of microelectromechanical resonators 12 may be employed in any of the embodiments described and illustrated herein. For example, with reference to FIG. 10D, in another embodiment, oscillator system 10 includes temperature measurement system 10 which includes processor circuitry 30 to adjust and/or control the operation of one or more of microelectromechanical resonators 12 (via, for example, the associated resonator drive and sense circuitry 40). The clock alignment circuitry 34 generates an output signal, having relatively stable predetermined characteristics (for example, frequency and phase), using the data which is representative of the operating temperature of microelectromechanical resonators 12 (provided or generated by frequency division circuitry 14). In this embodiment, clock alignment circuitry 34 may include circuitry which employs the data which is representative of the operating temperature to adjust the parameters, references (for example, frequency and/or phase), values and/or coefficients employed by clock alignment circuitry 34 in order to generate and/or provide a predetermined, adjusted, corrected and/or controlled output having, for example, a desired, selected and/or predetermined frequency and/or phase (i.e., the function of clock alignment circuitry).

Figure 10D:
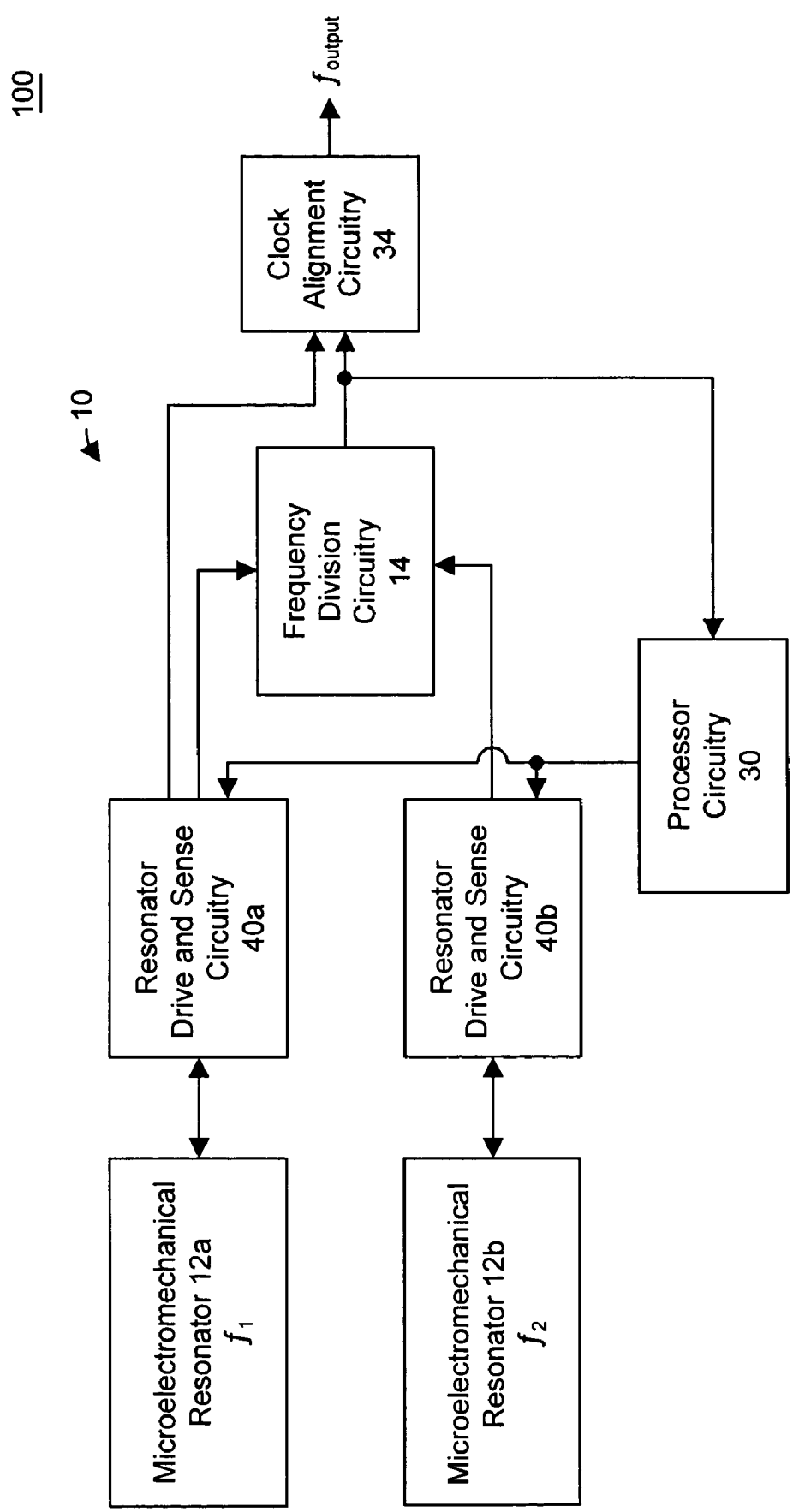
FIG. 10D is a block diagram representation of an exemplary oscillator system including (i) clock alignment circuitry to provide, generate and/or output a signal which is relatively stable over at least a given operating temperature range and (ii) a temperature measurement system having two microelectromechanical resonators, frequency division circuitry, processor circuitry to provide, generate and/or output control information to drive and sense circuitry, according to certain aspects of the present inventions.
Figure 10E:
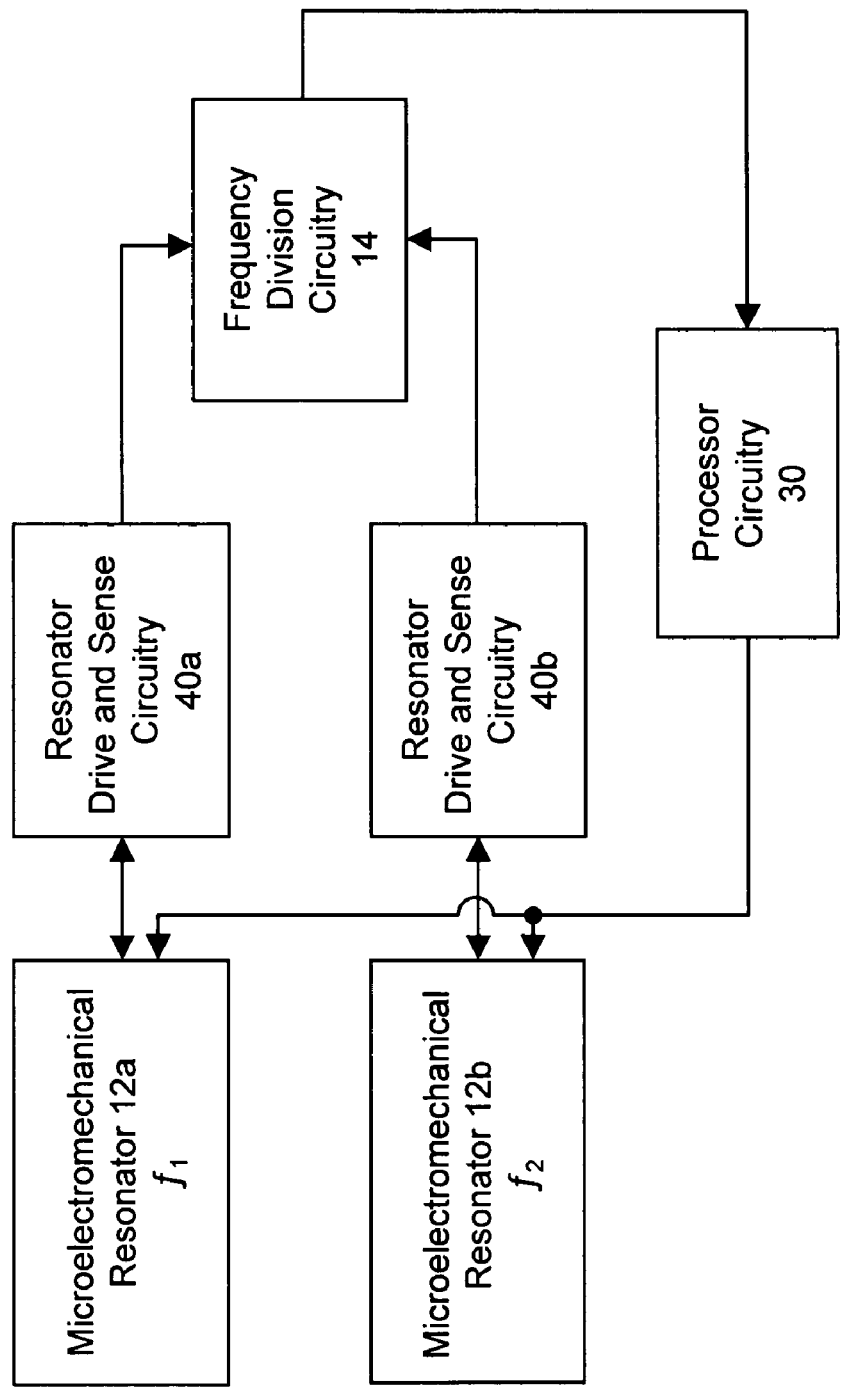
FIG. 10E is a block diagram representation of an exemplary temperature measurement system having two microelectromechanical resonators, frequency division circuitry and processor circuitry to provide, generate and/or output control information to the microelectromechanical resonators, according to aspects of the present inventions.

With continued reference to FIG. 10D, as mentioned above, clock alignment circuitry 34 may include control circuitry which employs the data which is representative of the operating temperature to adjust the parameters, references (for example, frequency and/or phase), values and/or coefficients employed by clock alignment circuitry 34. Alternatively, such control circuitry may be integrated with or disposed in processor circuitry 30. As such, the logic circuitry which interprets, analyzes and/or correlates the output signal of frequency division circuitry 14 to an operating temperature may be condensed, consolidated and/or incorporated into one circuitry block. In this way, there is little to no duplicative circuitry.

Although the discussion above indicates that processor circuitry 30 may provide feedback related information to one or more of resonator drive and sense circuitry 40 in order to adjust and/or control the operation of one or more of microelectromechanical resonators 12 (via the associated resonator drive and sense circuitry 40), the feedback related information may be applied directly to one or more of microelectromechanical resonators 12 to compensate, address and/or correct, for example, variations of the material properties and/or manufacturing variances of the fabrication processes and/or for changes in operating temperature of microelectromechanical resonators 12). (See, for example, FIG. 10E).

Notably, all permutations and combinations of employing the output of frequency division circuitry 14 in conjunction with, for example, processor circuitry 30 and resonator drive and sense circuitry 40, are intended to fall within the scope of the present inventions. For the sake of brevity, such permutations and combinations will not be discussed in detail.

Moreover, as mentioned above, all types and techniques of control and sense, whether now known or later developed, may be employed with respect to one or more of microelectromechanical resonators 12. All such techniques and circuitry are intended to fall within the scope of the present inventions.

Thus, in the embodiments illustrated in FIGS. 10B-10E, processor circuitry 30, among other things, may interpret, analyze and/or correlate the output signal of frequency division circuitry 14 to an operating temperature. The processor circuitry 30, as mentioned above, may employ a look-up table (based on empirical and/or theoretical data) and/or a predetermined or mathematical relationship/model to interpret, analyze and/or correlate the output signal of the frequency division circuitry 14 to an operating temperature of microelectromechanical resonators 12. In response, processor circuitry 30 may (i) adjust, control, correct and/or change the operating characteristics or performance of signal alignment circuitry 34 (as discussed above) and/or (ii) adjust, control, correct and/or change one or more of microelectromechanical resonators 12 to, for example, provide a signal having a frequency within a given, predetermined and/or desired range. For example, processor circuitry 30 may adjust, correct and/or control the frequency of the output of resonator 12*a* and/or the frequency of the output of resonator 12*b*. In this regard, based on the data which is representative of the operating temperature, processor circuitry 30, in one embodiment, may employ a look-up table (based on empirical and/or theoretical data) and/or a predetermined or mathematical relationship to adjust and/or control the operation of one or more of resonator 12*a* and/or the frequency of the output of resonator 12*b*. In this way, processor circuitry 30 may adjust, control and/or change the operating performance, conditions, characteristics and/or environment of resonators 12.

Figure 11A:
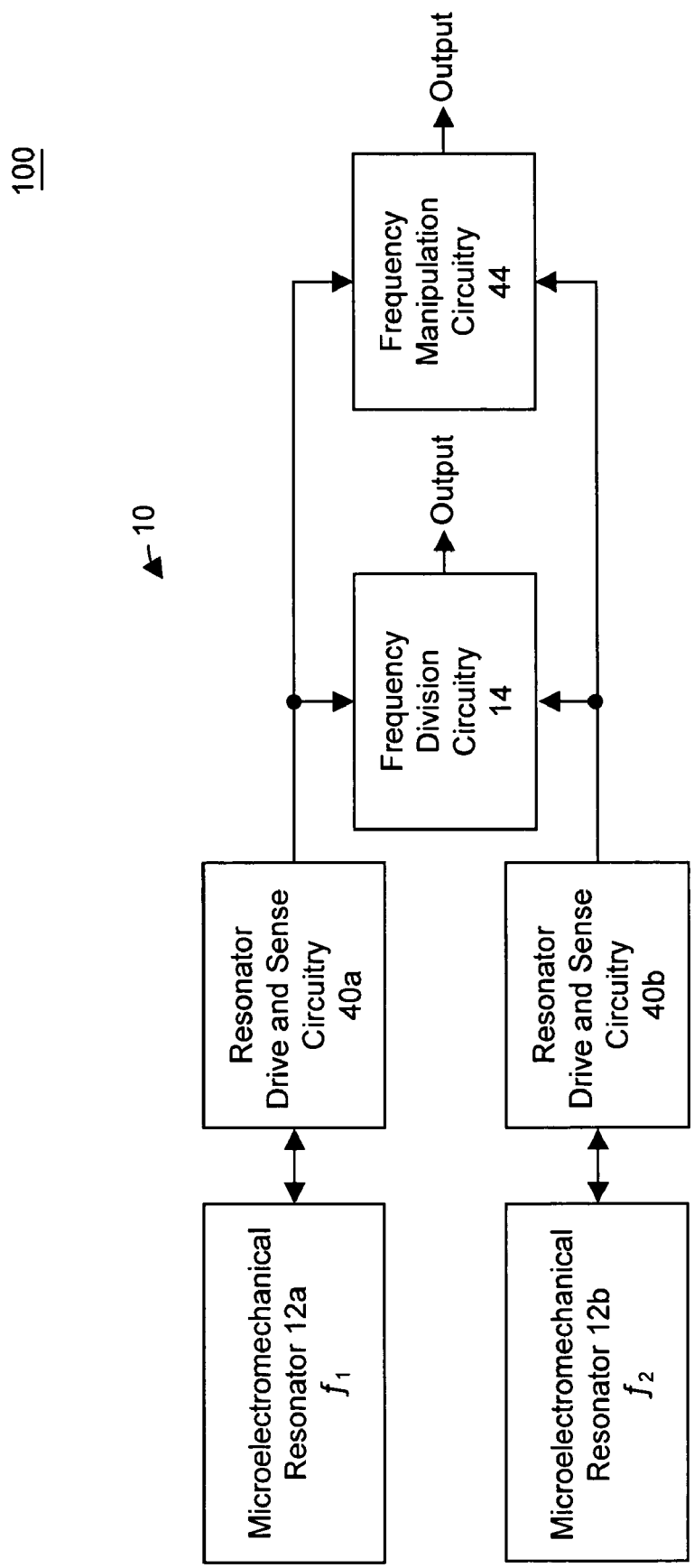
FIG. 11A is a block diagram representation of an exemplary oscillator system including (i) frequency manipulation circuitry and (ii) temperature measurement system having two microelectromechanical resonators and frequency division circuitry, according to certain aspects of the present inventions.

The oscillator system of the present inventions includes temperature measurement system and circuitry to generate (1) at least one output signal having a predetermined frequency that is substantially stable (i.e., constant, substantially constant and/or essentially constant) over temperature (for example, over a given or predetermined temperature range) and/or (2) at least one signal having a substantially stable frequency over a range of temperatures (for example, a predetermined operating temperature range) and is "shaped" to have a desired turn-over frequency. With reference to FIG. 11A, in one exemplary embodiment, oscillator system 100 includes frequency manipulation circuitry 44 which generates (1) at least one output signal having a predetermined frequency that is substantially stable over temperature (for example, over a given or predetermined temperature range) and/or (2) at least one signal having a substantially stable frequency over a range of temperatures (for example, a predetermined operating temperature range) and is "shaped" to have a desired turn-over frequency. The frequency manipulation circuitry 44 is described in detail in U.S. application Ser. No. 11/399,176, (filed on Apr. 6, 2006 by inventor Paul Merritt Hagelin). The inventions described and illustrated in U.S. application Ser. No. 11/399,176, including the discussion of the frequency subtraction circuitry, are incorporated by reference herein in its entirety.

Figure 11B:
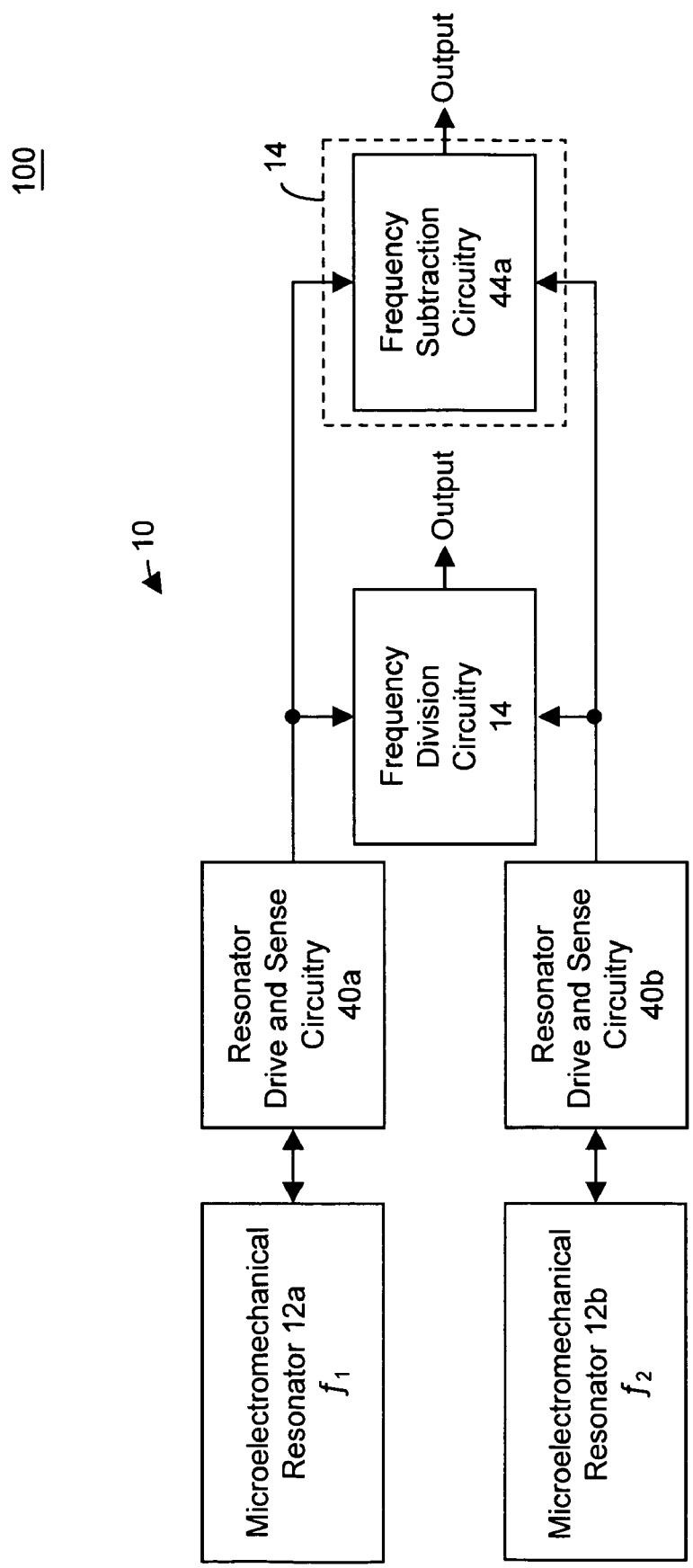
FIGS. 11B and 11C are block diagram representations of exemplary oscillator systems including (i) frequency subtraction circuitry and (ii) temperature measurement systems having two microelectromechanical resonators, and frequency division circuitry, according to certain aspects of the present inventions.

Briefly, in one embodiment, frequency manipulation circuitry 44 may be frequency subtraction circuitry 44*a* (as discussed in U.S. application Ser. No. 11/399,176) which includes circuitry to perform and/or implement subtraction of the frequencies of resonators 12*a* and 12*b* and to generate an output signal having a frequency that is relatively stable over a given or predetermined temperature range and/or that changes over a given or predetermined temperature range in a predetermined manner. (See, for example, FIG. 11B). The frequency subtraction circuitry 44*a* (for example, frequency mixer circuitry, multiplier circuitry or more generally any non-linear circuitry with two or more inputs and at least one output) generates one or more output signals which is/are representative of the difference of the frequencies of resonators 12*a* and 12*b*. That output signal or signals include a frequency or frequencies that is/are relatively stable over a given or predetermined temperature range and/or representative of the operating temperature of microelectromechanical resonators 12*a* and/or 12*b*.

The frequency subtraction circuitry 44*a* may be implemented as digital and/or analog circuitry. As such, the subtraction operations may be performed in the digital domain and/or analog domain. All forms, types and architectures of frequency subtraction circuitry, whether now known or later developed, are intended to fall within the scope of the present inventions.

Notably, frequency subtraction circuitry 44*a* may be implemented in conjunction with any of the embodiments described and illustrated herein. All permutations and combinations are intended to fall within the scope of the present inventions. For the sake of brevity, certain of those embodiments will be discussed briefly below.

Figure 11C:
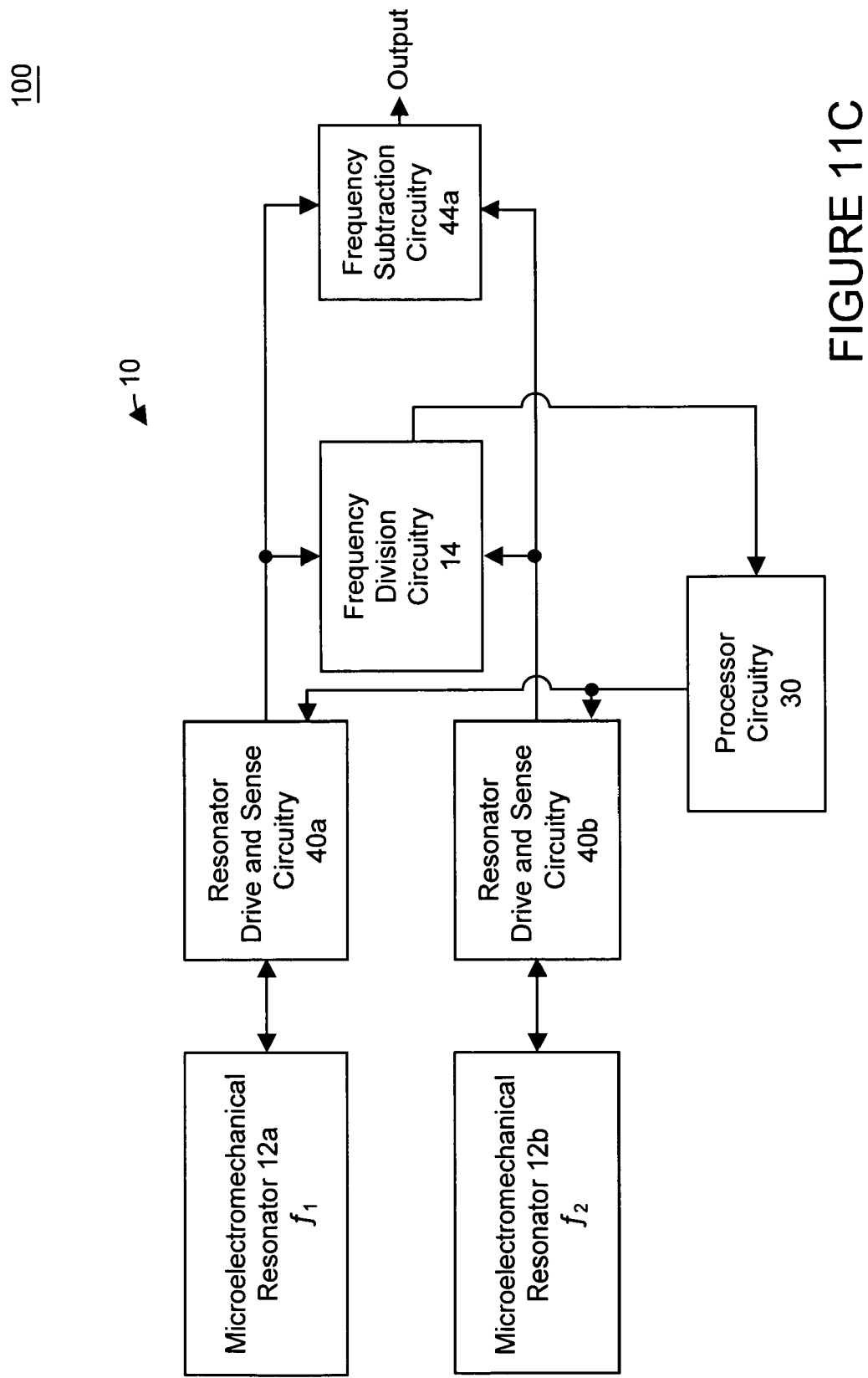

With reference to FIG. 11C, in one embodiment, frequency division circuitry 14 and frequency subtraction circuitry 44*a* each receive the outputs of microelectromechanical resonators 12*a* and 12*b*. The frequency division circuitry 14 generates data which is representative of the operating temperature of resonators 12*a* and 12*b*. The processing circuitry 30 employs that data to adjust, control and/or modify the operating characteristics of microelectromechanical resonators 12*a* and 12*b* (for example, via resonator drive and sense circuitry 40*a* and 40*b*) to, for example, compensate or address for any changes in operating temperature of resonators 12*a* and 12*b*. In this way, the output signals of the resonators 12*a* and 12*b* are more stable over a range of temperatures (for example, a predetermined operating temperature range).

Figure 12A:
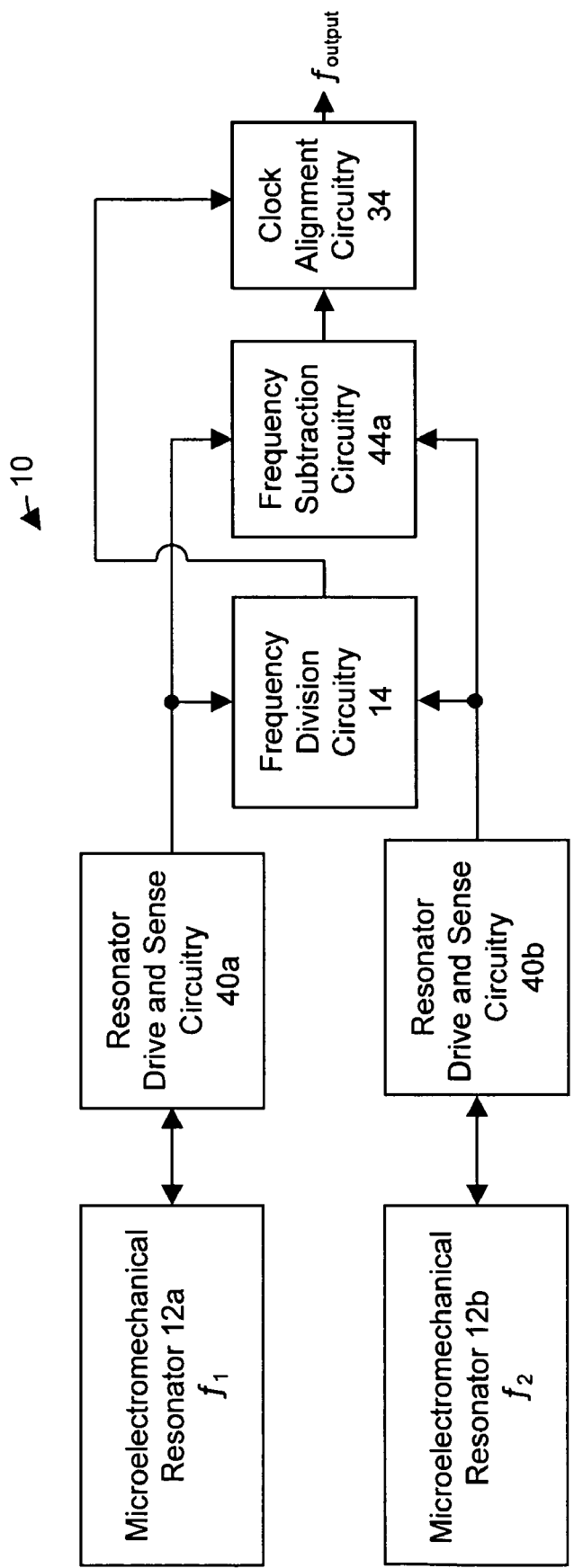
FIGS. 12A-12E are block diagram representations of exemplary oscillator systems including (i) clock alignment circuitry and (ii) temperature measurement systems having two microelectromechanical resonators, frequency division circuitry, in conjunction with other circuitry, according to certain aspects of the present inventions.

With reference to FIG. 12A, in another embodiment, clock alignment circuitry 34 receives the output signal(s) of frequency subtraction circuitry 44*a* which includes a frequency or frequencies that is/are relatively stable over a given or predetermined temperature range of microelectromechanical resonators 12a and/or 12b. The clock alignment circuitry 34 further receives the output of frequency division circuitry 14 and employs the data which is representative of the operating temperature of resonators 12a and 12b to adjust, control and/or modify the operating characteristics of the circuitry therein (for example, one or more PLLs, DLLs, digital/frequency synthesizer, for example, DDS) to enhance the stability of its output signal(s). Thus, in this embodiment, clock alignment circuitry 34 may enhance the stability of its output signal(s) over the given or predetermined temperature range of resonators 12 and/or over a larger predetermined temperature range of resonators 12.

Notably, although not illustrated in detail, clock alignment circuitry 34 may include control circuitry to interpret, analyze and/or correlate the frequency of the output signal of frequency division circuitry 14 to an operating temperature of one or more of resonators 12. The control circuitry, in one embodiment, may employ a look-up table (based on empirical and/or theoretical data) and/or a predetermined or mathematical relationship/model to interpret, analyze and/or correlate the frequency of the output signal to an operating temperature. The control circuitry may generate and/or provide temperature sensor data which is representative of the operating temperature to other circuitry and/or drive and sense circuitry 40 (as mentioned above).

Figure 12B:
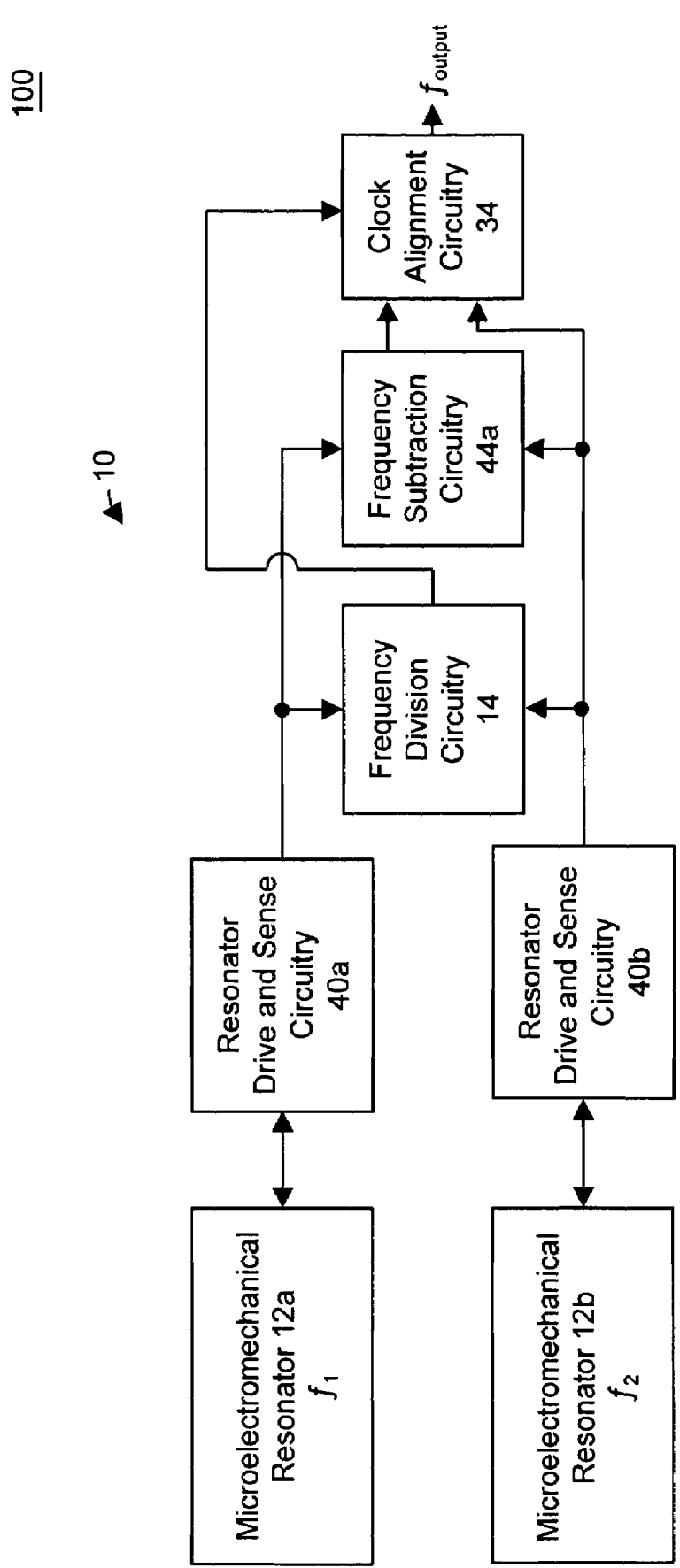

With reference to FIG. 12B, in another embodiment, clock alignment circuitry 34 receives the output signal of microelectromechanical resonator 12b in addition to the output signal(s) of frequency subtraction circuitry 44a which includes a frequency or frequencies that is/are relatively stable over a given or predetermined temperature range of microelectromechanical resonator 12 and 12b. In this embodiment, clock alignment circuitry 34 may also employ the output signal of microelectromechanical resonator 12b to generate one or more output signals having predetermined characteristics (for example, frequency and phase).

Figure 12C:
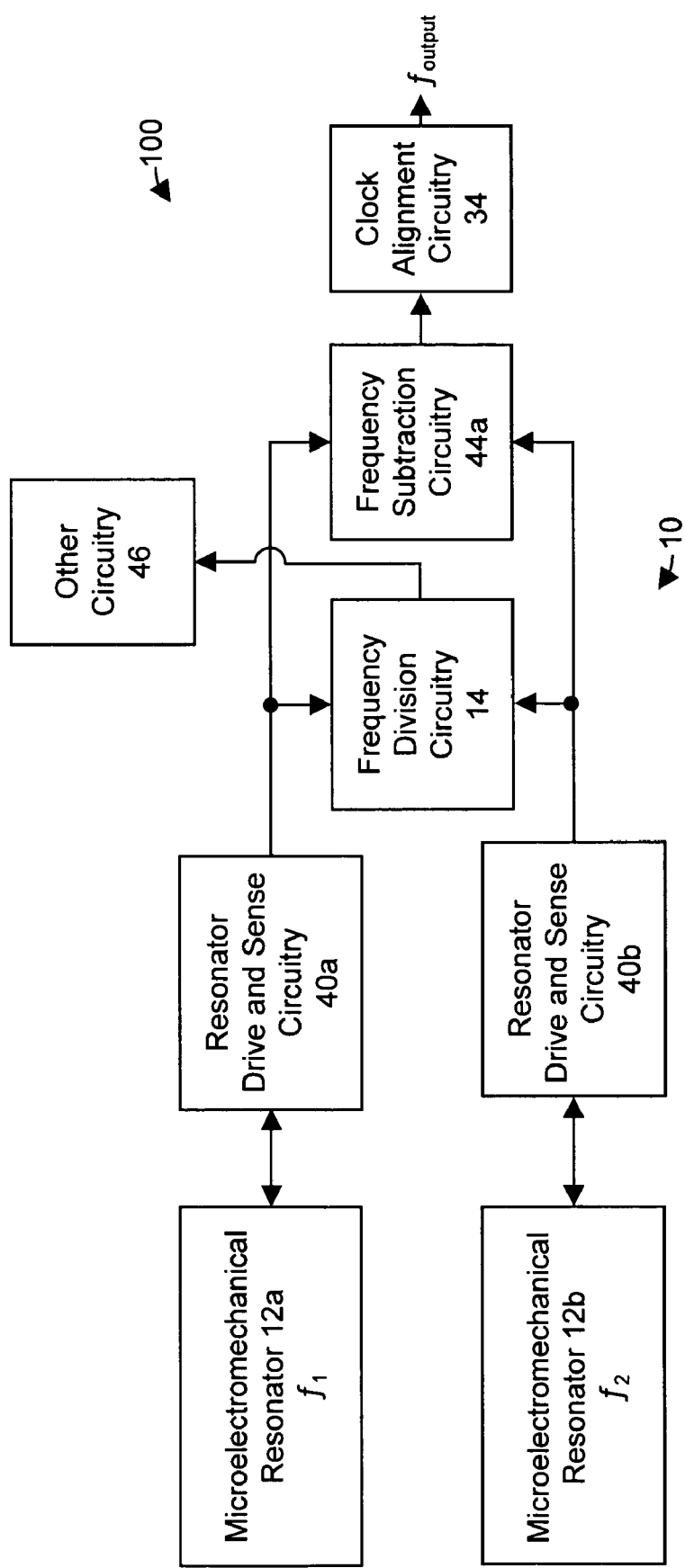
Figure 12D:
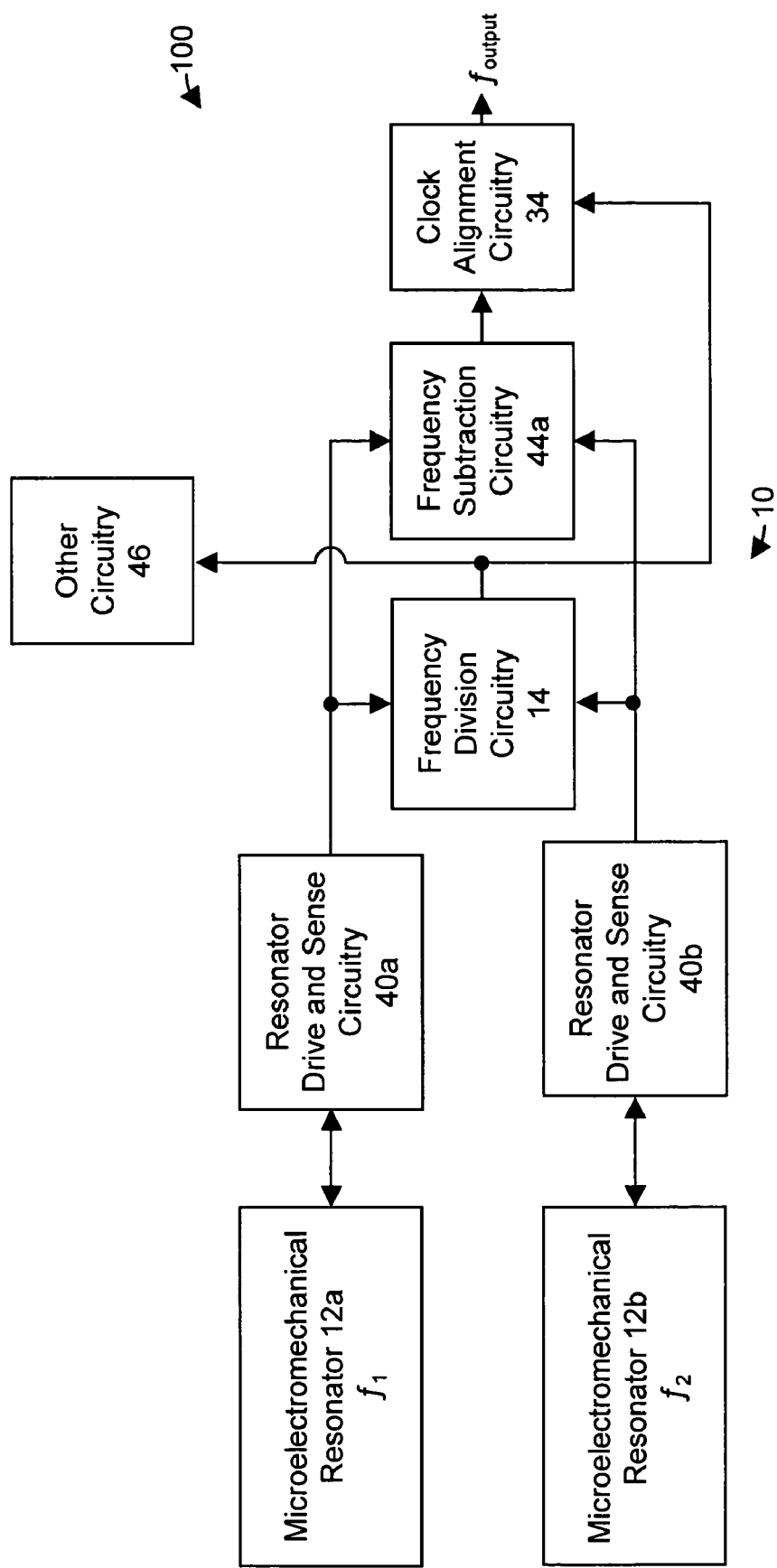
Figure 12E:
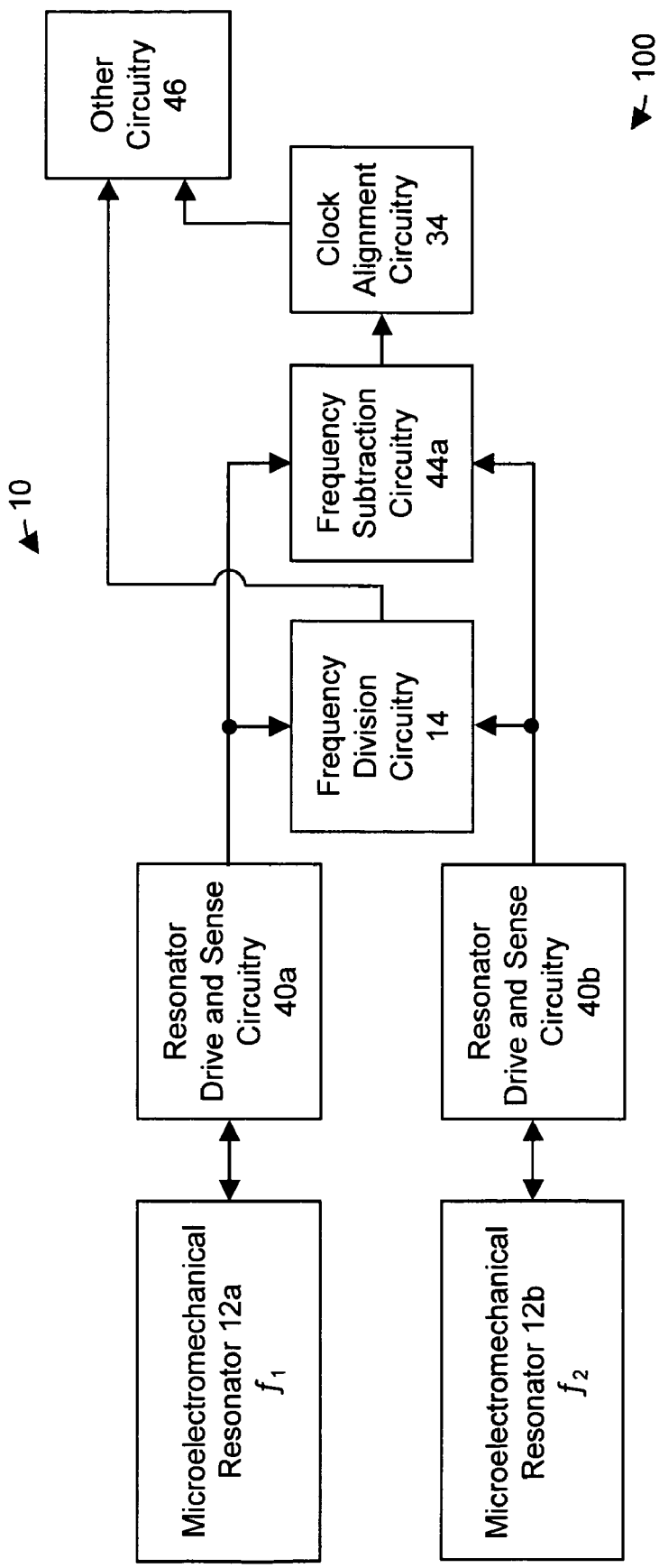
Figure 12F:
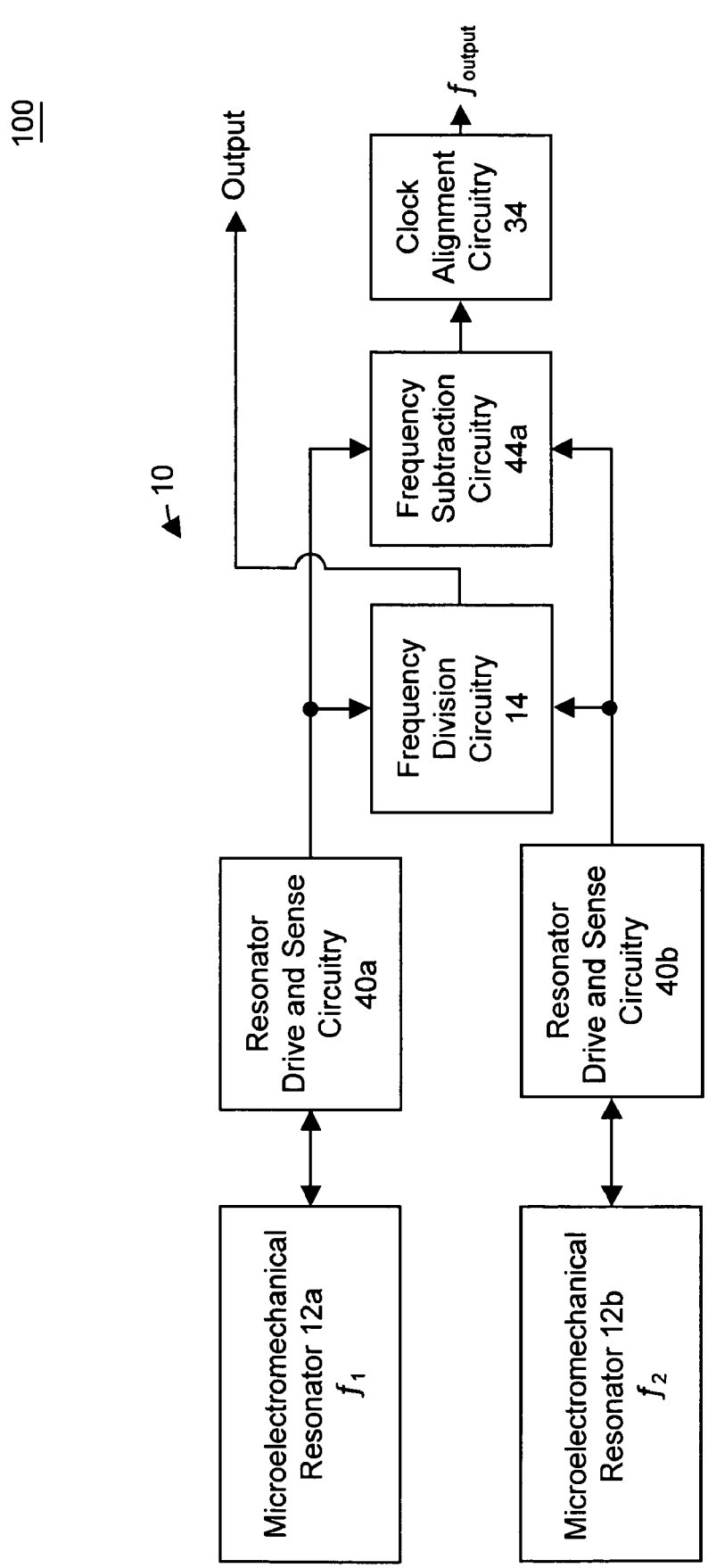
FIG. 12F is a block diagram representation of an exemplary oscillator system including (i) clock alignment circuitry and (ii) temperature measurement systems having two microelectromechanical resonators, wherein the frequency division circuitry generates and/or provides an output signal which is representative of the operating temperature(s) of the microelectromechanical resonators, according to certain aspects of the present inventions.
Figure 13A:
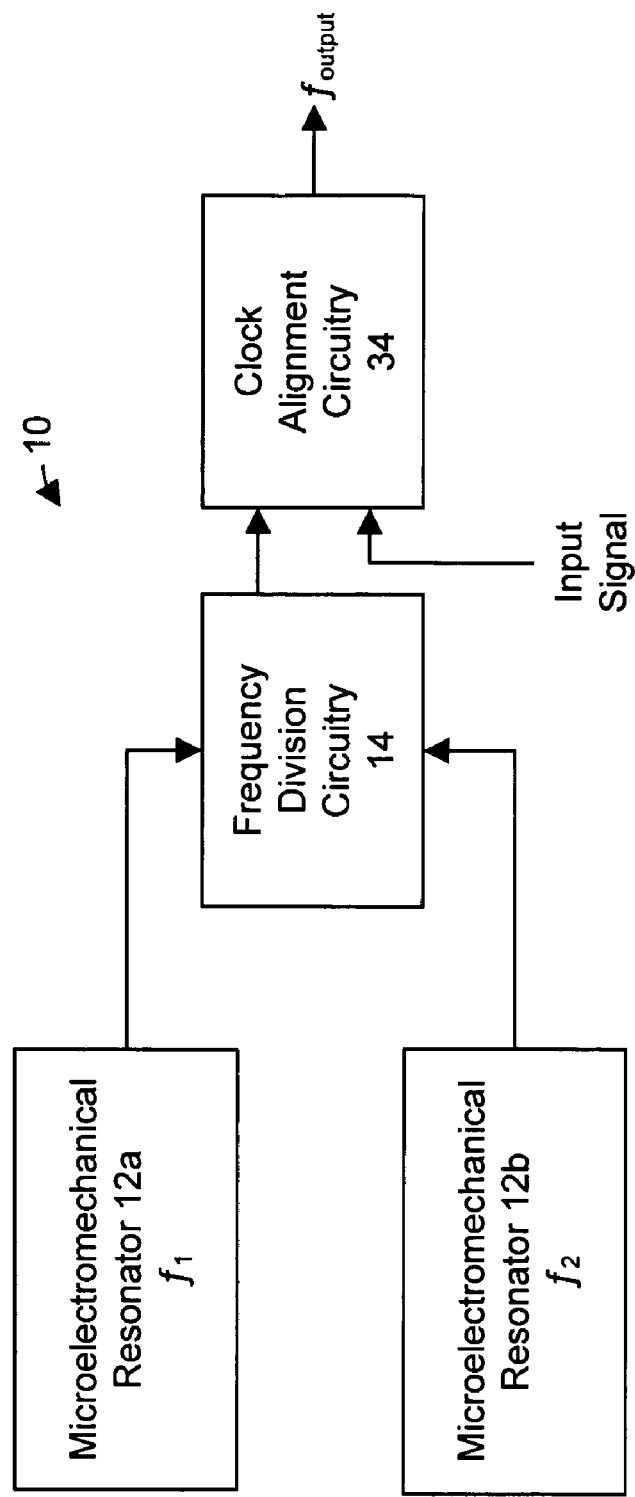
FIGS. 13A-13D are block diagram representations of exemplary microelectromechanical oscillator systems, including (i) clock alignment circuitry and (i) temperature measurement systems having two microelectromechanical resonators and frequency division circuitry, according to certain aspects of the present inventions.
Figure 13B:
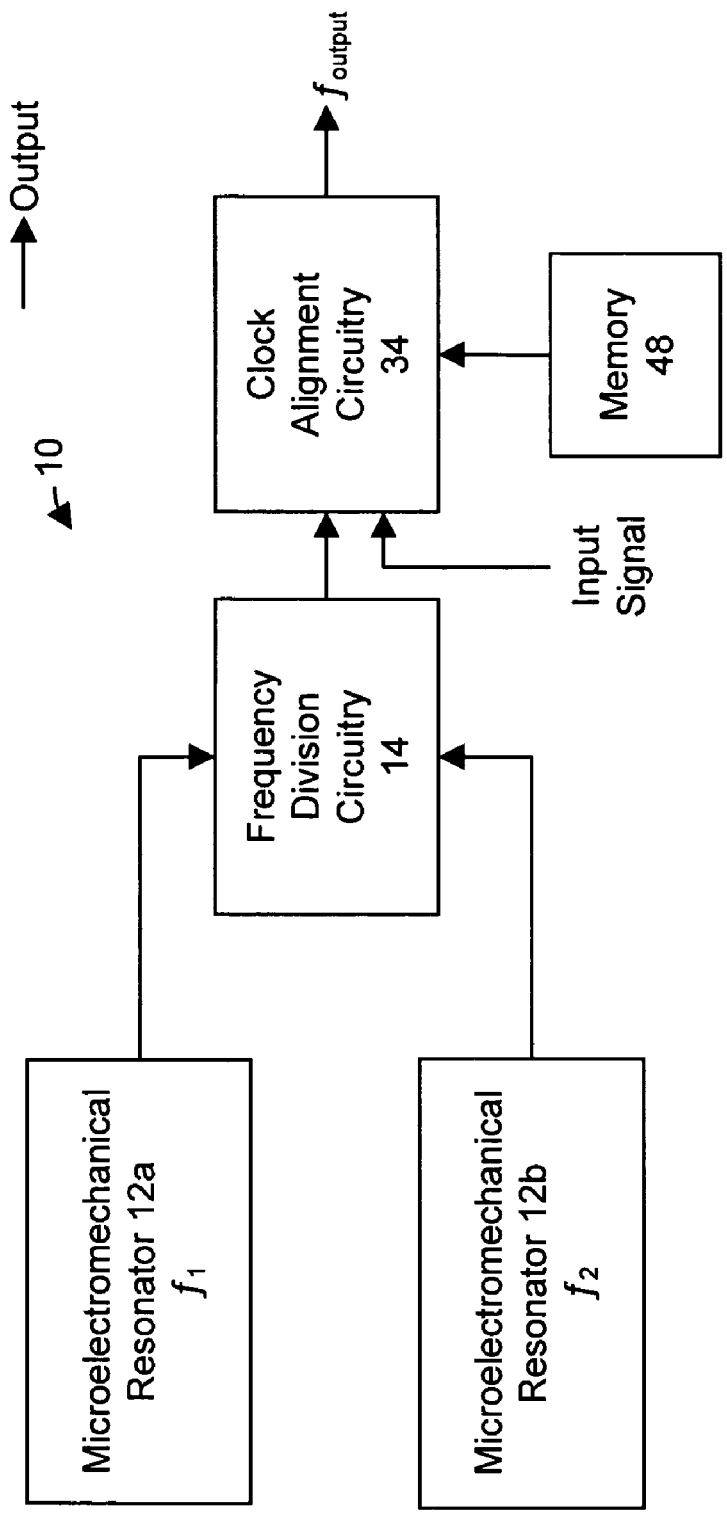
Figure 13C:
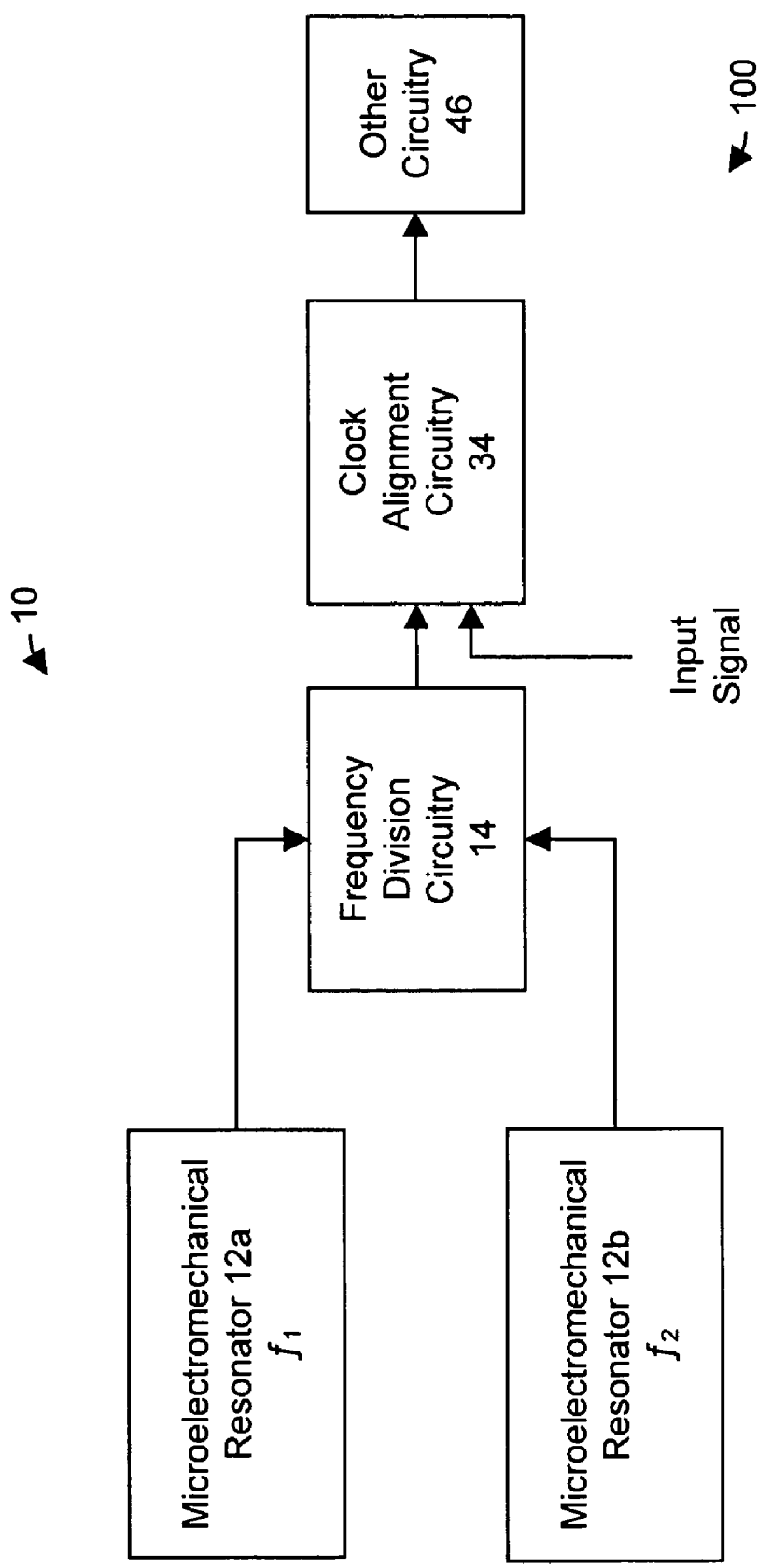
Figure 13D:
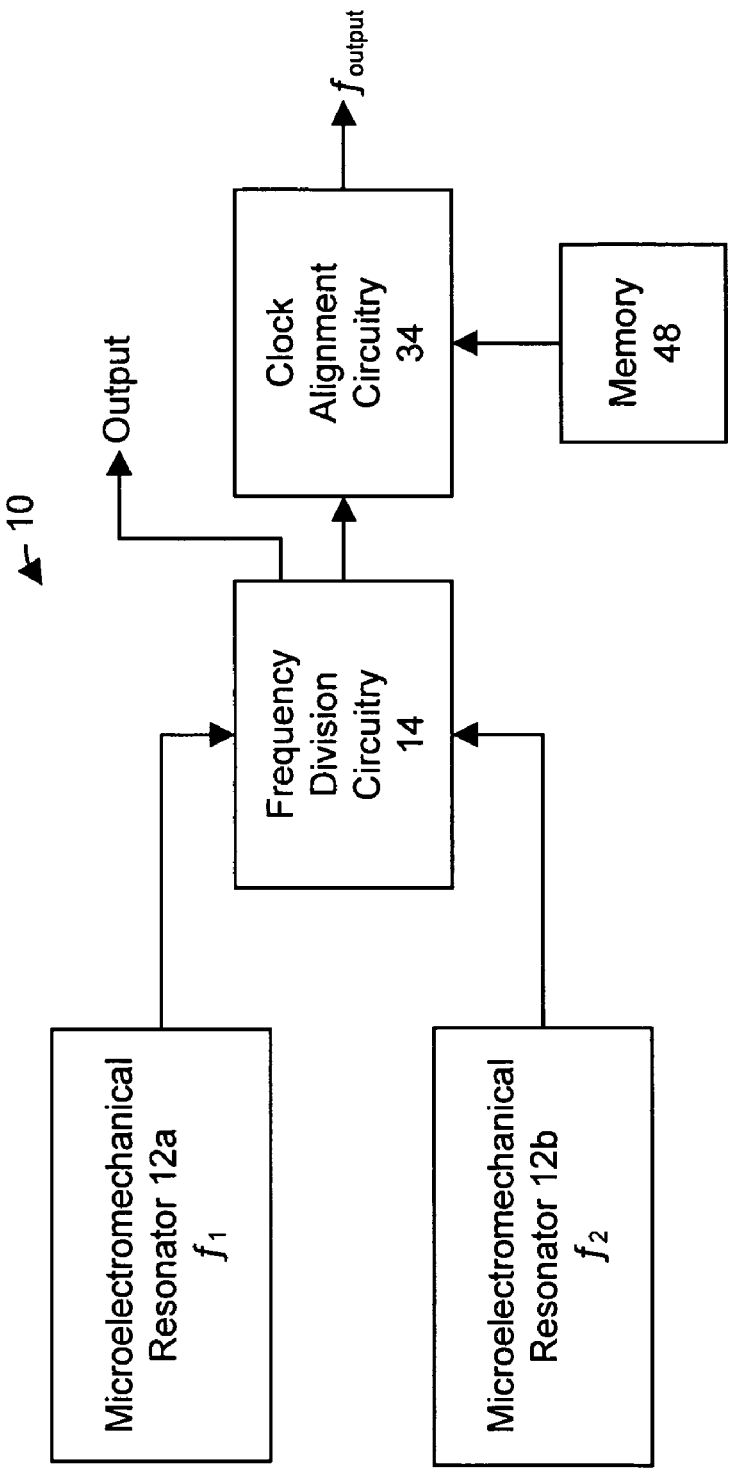

The frequency division circuitry 14 may also provide the data which is representative of the operating temperature of resonators 12a and 12b to other circuitry, such as internal/integrated and/or external circuitry. (See, for example, FIGS. 12C and 12D). Moreover, other circuitry 46 may receive the data which is representative of the operating temperature of resonators 12a and/or 12b as well as the output signal(s) of frequency subtraction circuitry 44a which includes a frequency or frequencies that is/are relatively stable over a given or predetermined temperature range of microelectromechanical resonators 12a and/or microelectromechanical resonator 12b. (See, for example, FIG. 12E). Indeed, temperature measurement system 10 may also output a signal which is representative of the operating temperature of resonators 12a and/or 12b, for example, to an operator. (See, for example, FIG. 12F).

Again, frequency subtraction circuitry 44a, whether in combination with clock alignment circuitry 34 or not, may be implemented in conjunction with any of the embodiments described and illustrated herein. All permutations and combinations are intended to fall within the scope of the present inventions.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims (are possible by one skilled in the art after consideration and/or review of this disclosure). As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present inventions.

Figure 4A:
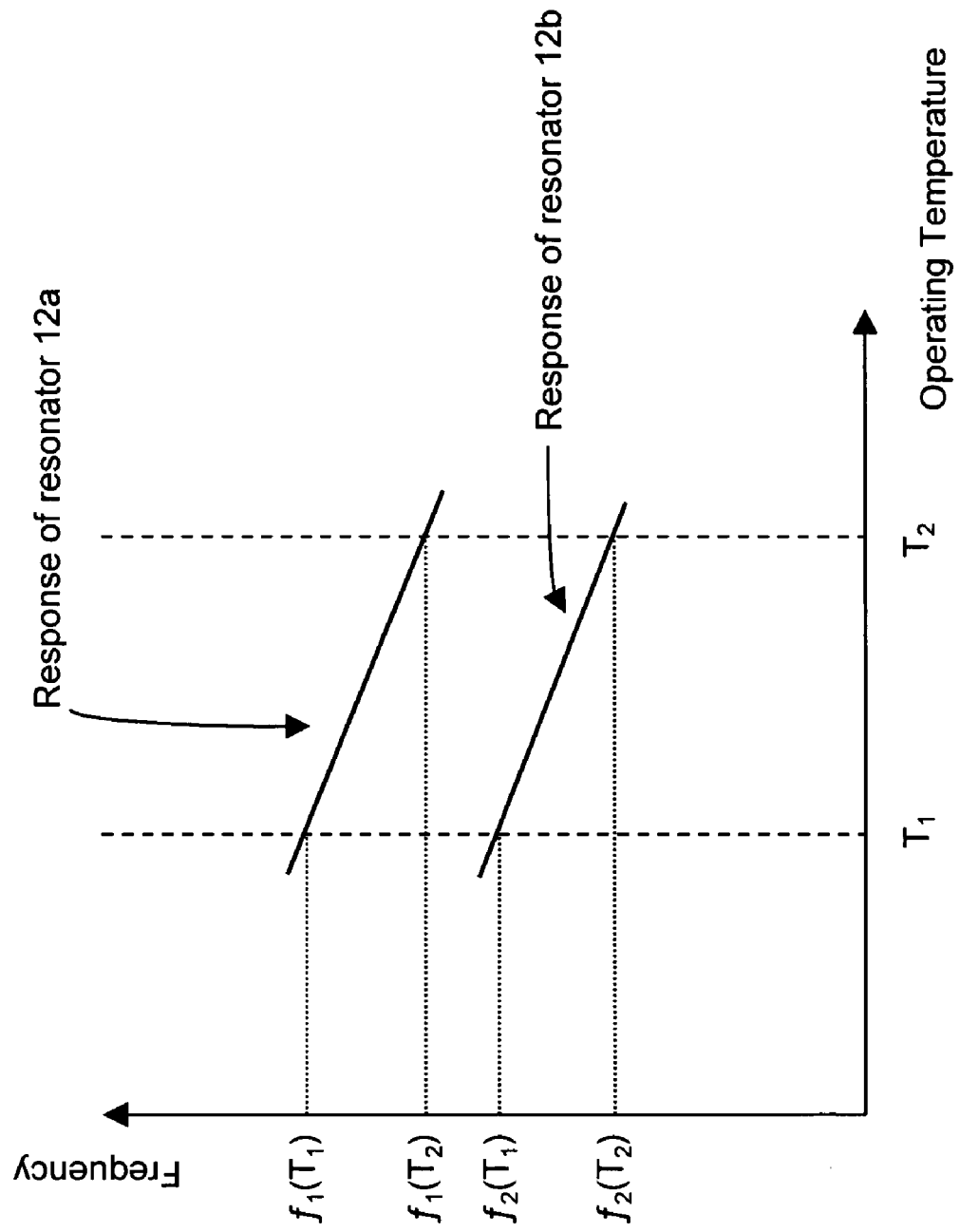
FIGS. 4A-4E are graphical illustrations of exemplary changes of frequency of the output signal of two exemplary microelectromechanical resonators of FIG. 3 over a given/predetermined operating temperature range of $T_1$ to $T_2$.
Figure 4B:
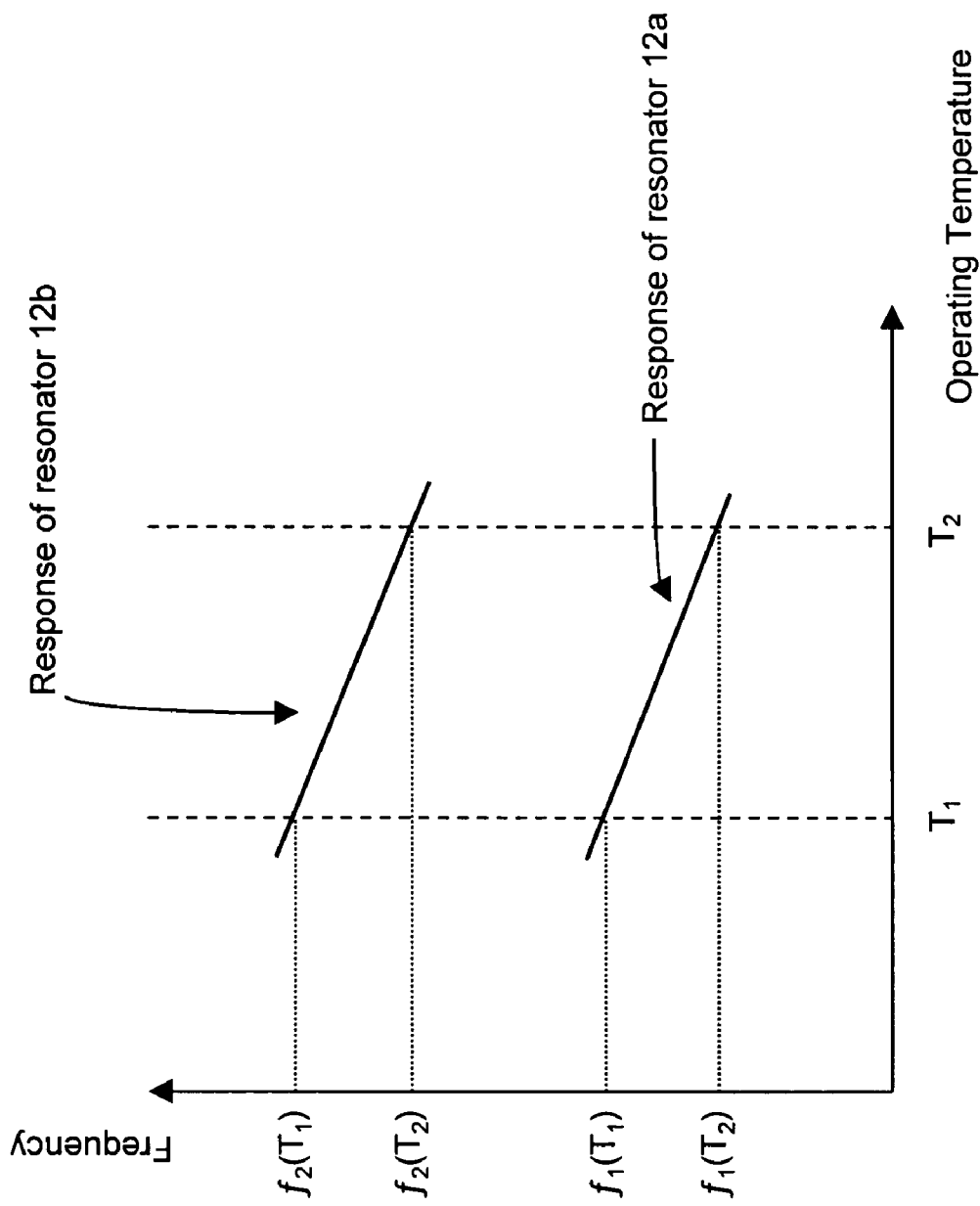
Figure 4C:
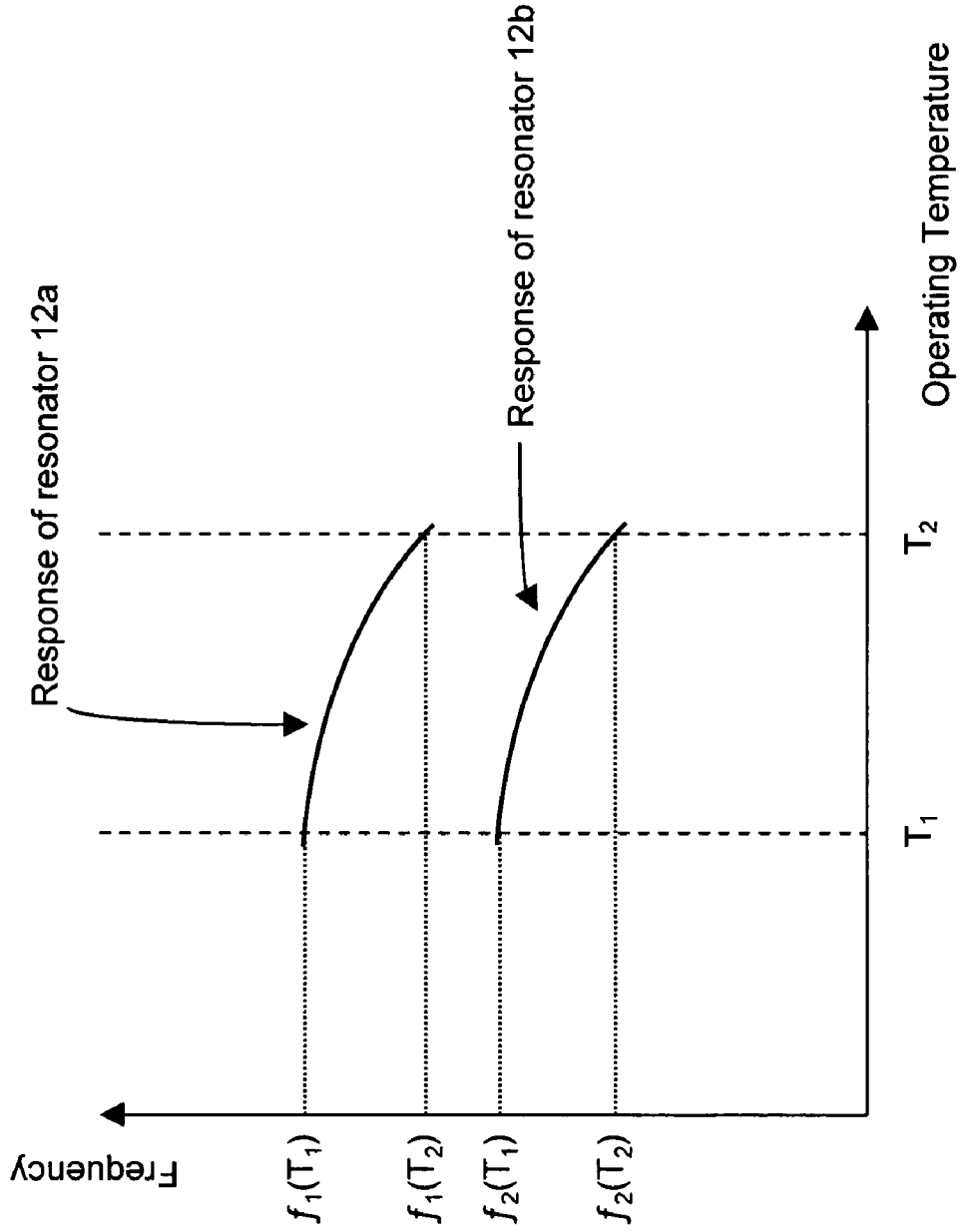
Figure 4D:
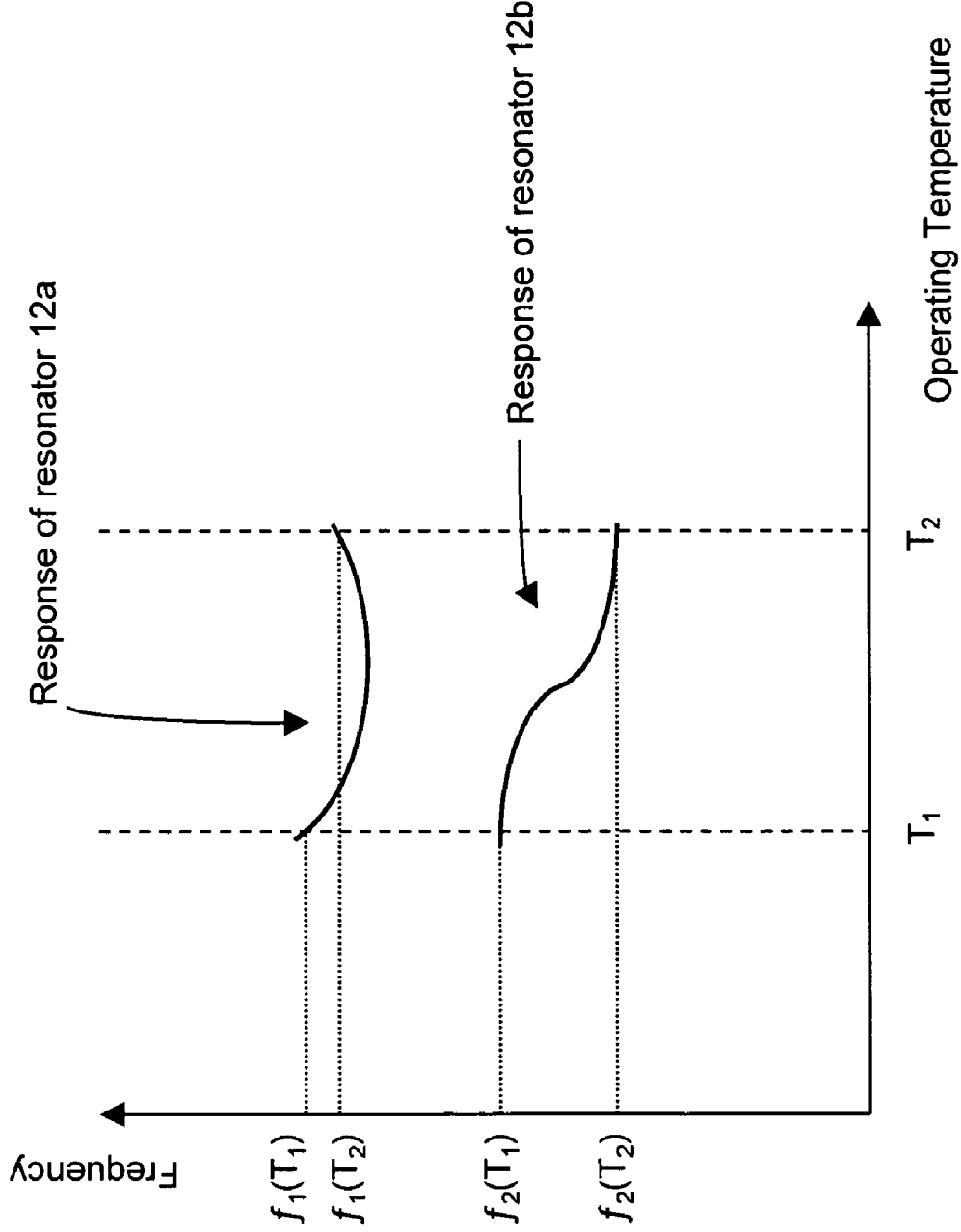
Figure 4E:
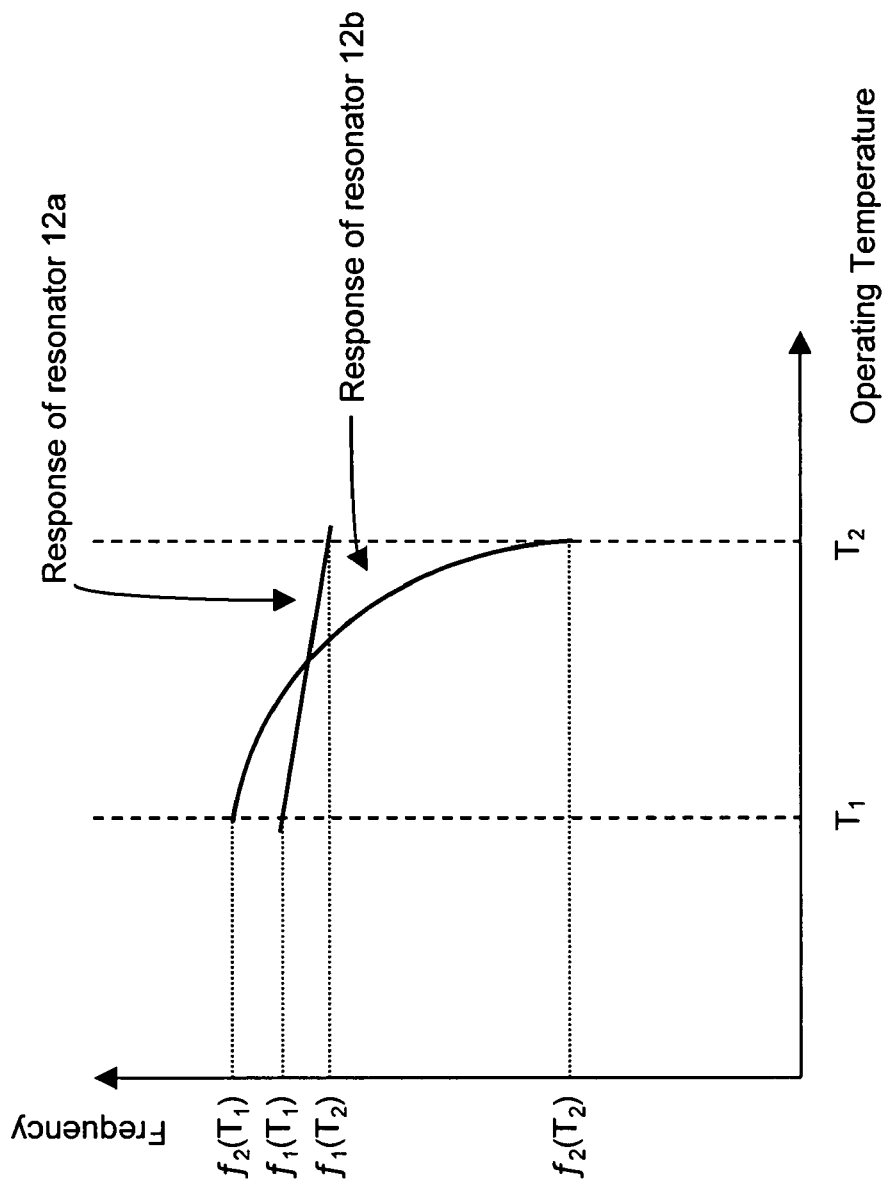
Figure 4F:
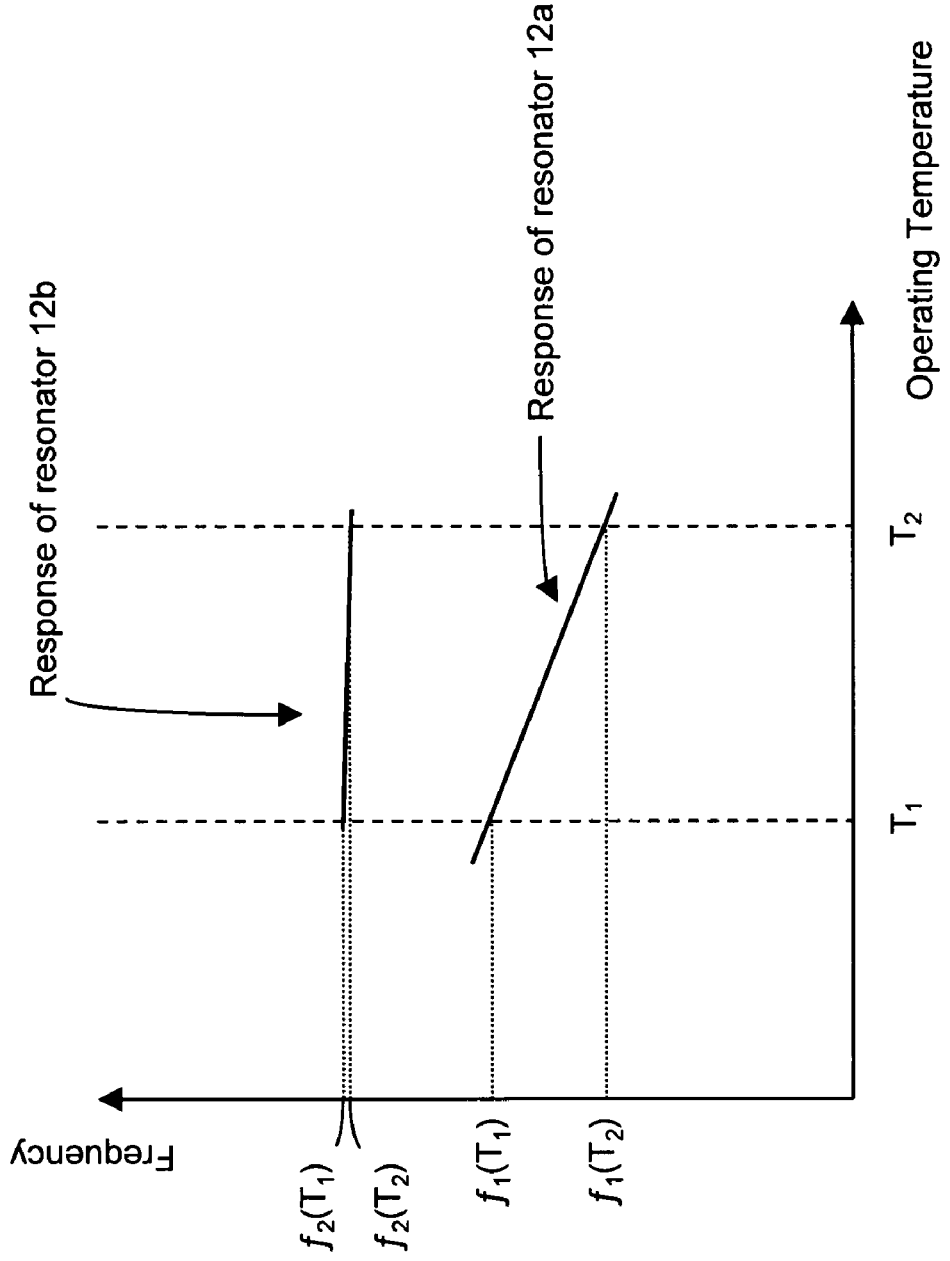
FIGS. 4F and 4G are graphical illustrations of exemplary changes of frequency of the output signal of two exemplary microelectromechanical resonators of FIG. 3 over a given/predetermined operating temperature range of $T_1$ to $T_2$, wherein one of the resonators experiences little to no change (at least relative to the other resonator)
Figure 4G:
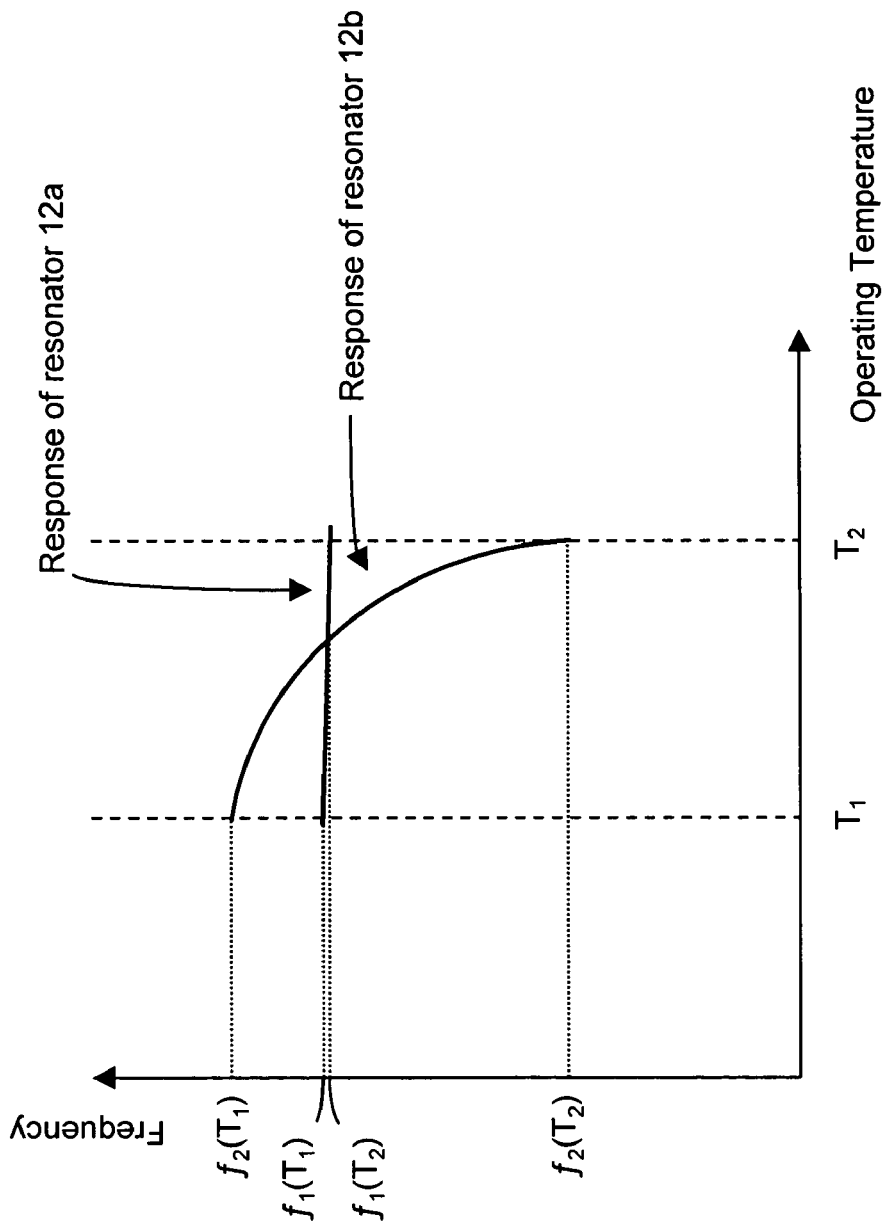

For example, temperature measurement system 10 and/or oscillator system 100 may employ two or more microelectromechanical resonators 12 wherein the frequency of a first resonator 12 changes over operating temperature (i.e., non-zero dE/dT or varying E(T)) and the frequency of another resonator 12 does not change (or has little to no change relative to the first resonator 12). (See, for example, FIGS. 4F and 4G).

Further, there are many types, designs and/or configurations of frequency division circuitry 14, frequency converter circuitry 16, analysis circuitry 18, clock alignment circuitry 34 and subtraction circuitry 44a, including digital and/or analog implementations; all implementations of such circuitry, whether now known of later developed, are intended to fall within the scope of the present inventions.

Indeed, as mentioned above, frequency converter circuitry 16 may include ADC circuitry, counter circuitry, pulse width modulation circuitry, amplitude or threshold detection circuitry and/or frequency to voltage converter circuitry. In one embodiment, frequency converter circuitry 16 is ADC circuitry that is shared between resonators 12. In another embodiment, frequency division circuitry 14 includes first ADC circuitry which is dedicated or associated with resonator 12a and second ADC circuitry which is dedicated to resonator 12b.

Further, similar to the programmability/re-programmability of values of "m" and/or "n", the ADC circuitry may be programmed to output a predetermined number of bits according to operating conditions. That is, in a first operating condition, the ADC may output, generate or provide a first number of bits which are representative of the frequency of resonator 12, and in a second operating condition, the ADC may output, generate or provide a second number of bits which are representative of the frequency of resonator 12. For example, at start-up, during initialization or re-synchronization, it may be advantageous to employ a technique that facilitates rapid acquisition of temperature related data. In this regard, the number of bits output or generated by the ADC circuitry may be fewer at, for example, start-up, during initialization or re-synchronization, and/or during significant or large temperature fluctuations/changes relative to a more steady state temperature environment and/or during normal operation. In this way, the system may more rapidly acquire temperature related data in order to attain a suitable, predetermined or functional operating condition. Thereafter, the number of output bits representative of the frequency of resonator 12 may be increased to enhance the resolution and/or degree of accuracy of the temperature related data.

Further, certain control and/or processing circuitry may be disposed in frequency division, frequency subtraction and/or clock alignment circuitry. It may be advantageous to concentrate such circuitry separately from or in one or more of frequency division circuitry 14, clock alignment circuitry 34 and/or frequency subtraction circuitry 44a. For example, certain control or processing operations of processor circuitry 30 may be located separately from or in frequency division circuitry 14, clock alignment circuitry 34 and/or frequency subtraction circuitry 44a.

Notably, as mentioned above, processor circuitry 30 (for example, a microprocessor, microcontroller, discrete logic (for example, CMOS logic), state machine, PGA (for example, a field programmable gate array), computer and/or look-up table architecture (for example, a ROM having a look-up table whose output is designated by the output or outputs of frequency division circuitry 14)) receives the output of the frequency division circuitry 14 and, based thereon, may estimate, calculate, determine and/or provide (hereinafter collectively "determine") an operating temperature of, for example, the plurality of microelectromechanical resonators 12, the temperature of the system and/or portions thereof.

In one embodiment, processing circuitry 30 may adjust, correct and/or control certain operating or performance characteristics of clock alignment circuitry 34. In this regard, processing circuitry 30 may employ the data which is representative of the operating temperature to adjust the parameters, references (for example, frequency and/or phase), values and/or coefficients of clock alignment circuitry 34. In this way, clock alignment circuitry 34 may generate and/or provide a predetermined, adjusted, corrected and/or controlled output having, for example, a desired, selected and/or predetermined frequency and/or phase (i.e., the function of clock alignment circuitry) over a given operating temperature range.

In addition thereto, or in lieu thereof, processor circuitry 30 may adjust, correct and/or control one or more of microelectromechanical resonators 12 to, for example, provide a signal having a frequency within a given, predetermined and/or desired range. In this regard, in one embodiment, processor circuitry 30 may instruct and/or cause resonator drive and sense circuitry 40 to adjust, for example, the bias voltage and/or drive amplitude for one or more of microelectromechanical resonators 12. In this way, processor circuitry 30 may "force" the characteristics of the output signal (for example, frequency) of one or more of microelectromechanical resonators 12 to adjust the output signal of frequency division circuitry 14, clock alignment circuitry 34, and/or frequency subtraction circuitry 44a to provide a desired and/or predetermined frequency (for example, where the frequency of the output is substantially stable or includes a desired and/or predetermined response over a given operating temperature range).

The processor circuitry 30 may adjust and/or control resonator drive and sense circuitry 40 and/or resonators 12 in situ. Notably, all operations and/or functions described above with respect to processor circuitry 30 are applicable to this embodiment. For the sake of brevity, those discussions will not be repeated.

As noted above, microelectromechanical resonators 12 may employ any type of microelectromechanical resonator design, architecture and/or control, whether now known or later developed. Indeed, microelectromechanical resonators 12 may be components or portions of the same physical structure (see, for example, FIG. 7C) and/or microelectromechanical resonators 12 may be the same component or portion of the same physical structure that resonate in multiple, different modes of operation, for example, in-plane and out-of-plane (see, for example, FIG. 7D). Further, microelectromechanical resonators 12 may be fabricated and/or packaged using any fabrication and/or packaging techniques, whether now known or later developed. As such, all such fabrication and/or packaging techniques are intended to fall within the scope of the present inventions.

Moreover, microelectromechanical resonators 12 may include and/or be fabricated from, for example, materials in column IV of the periodic table, for example silicon, germanium, carbon; also combinations of these, for example silicon germanium, or silicon carbide; also of III-V compounds for example gallium phosphide, aluminum gallium phosphide, or other II-V combinations; also combinations of II, IV, V, or VI materials, for example silicon nitride, silicon oxide, aluminum carbide, or aluminum oxide; also metallic silicides, germanides, and carbides, for example nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Indeed, as mentioned above, "different" materials may also be obtained by employing different doping concentrations of the "same" material and/or crystalline structure. In this regard, the same starting material(s) may be doped with an impurity at differing amounts/ratios or differing impurity types thereby providing "different" materials. For example, microelectromechanical resonator 12a may be fabricated in or from an undoped monocrystalline silicon and microelectromechanical resonator 12 may be fabricated in or from a monocrystalline silicon which is doped with phosphorus, arsenic, antimony, and/or boron.

The microelectromechanical resonators 12 may or may not include control circuitry that monitors, alters, controls and/or adjusts the operating temperature of microelectromechanical resonators 12 and/or frequency of the output signal of resonators 12. All techniques for altering, controlling and/or adjusting the operation of microelectromechanical resonators 12, whether now known or later developed, are intended to be within the present inventions.

The output signal of clock alignment circuitry 34 and/or frequency subtraction circuitry 44a may be single ended or double ended (i.e., differential signaling). The "shape" of the output signal (for example, square, pulse, sinusoidal or clipped sinusoidal) may be predetermined and/or programmable. In this regard, information which is representative of the "shape" of the output signal may be stored or programmed in memory (which is resident in clock alignment circuitry 34 and/or frequency subtraction circuitry 44a during fabrication, test, calibration and/or operation). In this way, clock alignment circuitry 34 and/or frequency subtraction circuitry 44a may access resident memory 48 (which may be integrated on the substrate with clock alignment circuitry 34) to obtain such information during start-up/power-up, initialization, re-initialization and/or during normal operation of frequency division circuitry 14 and/or clock alignment circuitry 34. (See, for example, FIGS. 13A-13D).

Figure 14A:
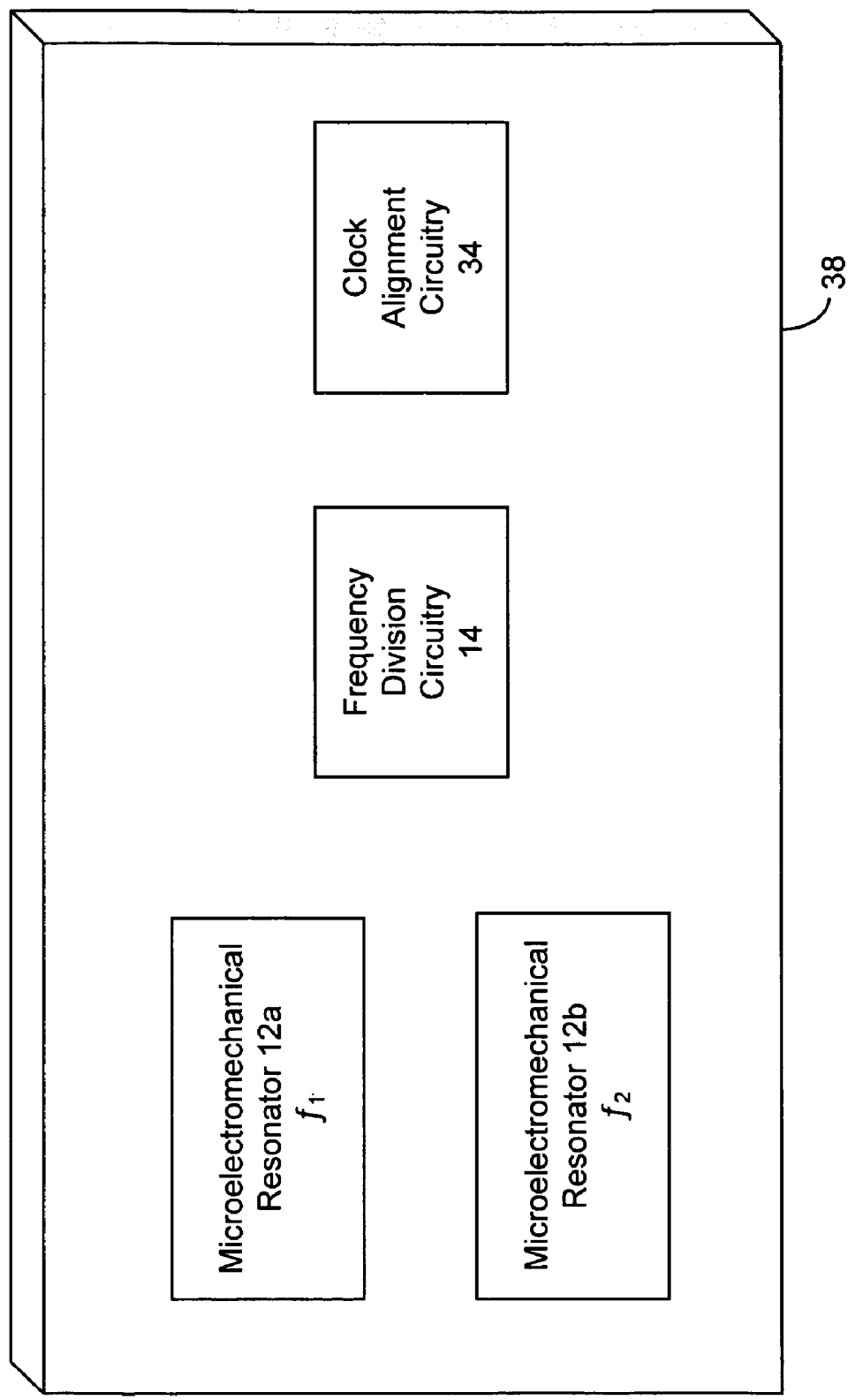
FIGS. 14A and 14B illustrate three-dimensional block diagram representations of a plurality of exemplary embodiments of the microelectromechanical oscillator having (i) microelectromechanical resonators and frequency division circuitry and (ii) signal or clock alignment circuitry integrated on/in a common and/or different substrates, according to certain aspects of the present inventions.
Figure 14B:
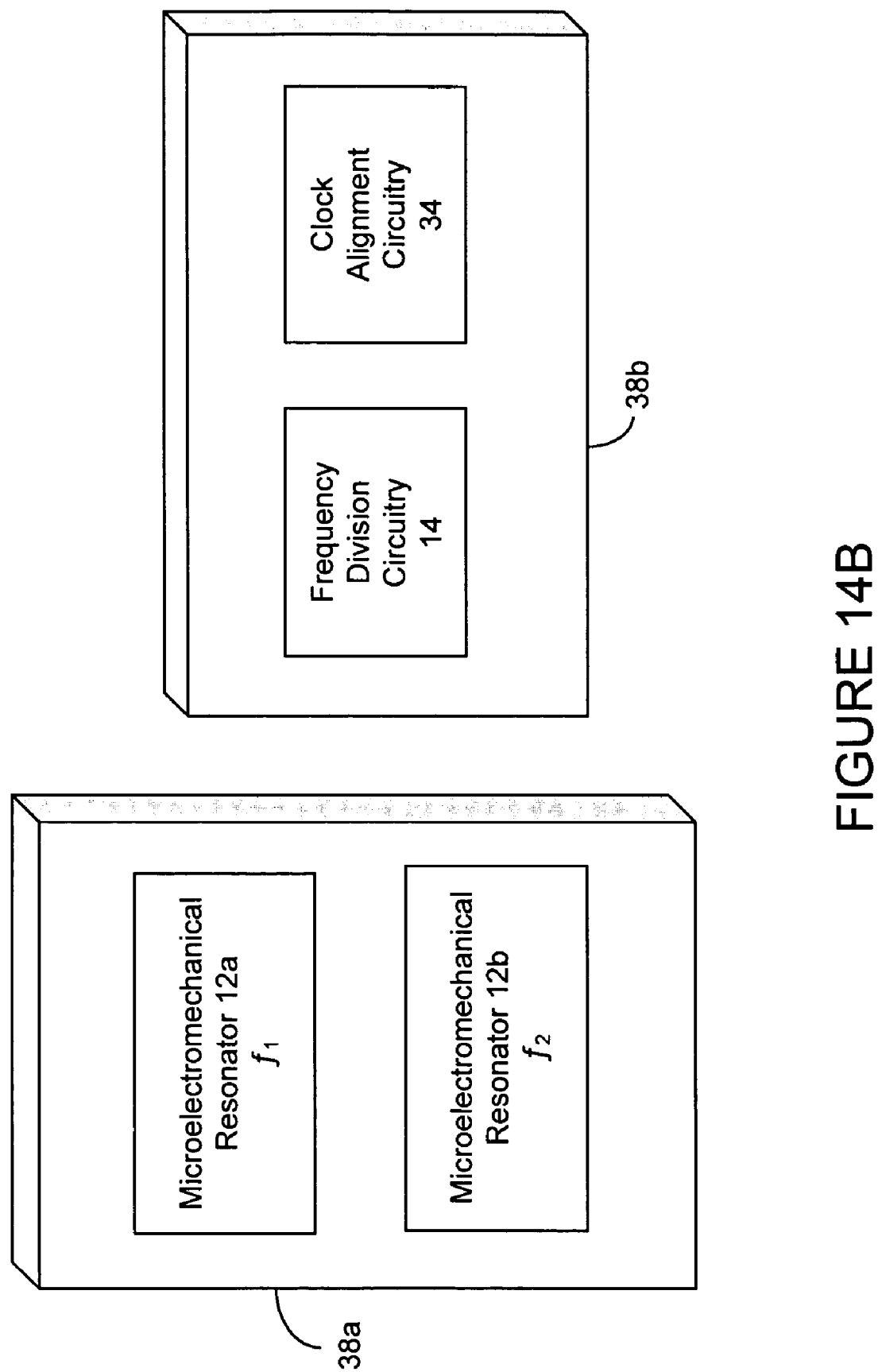
Figure 14C:
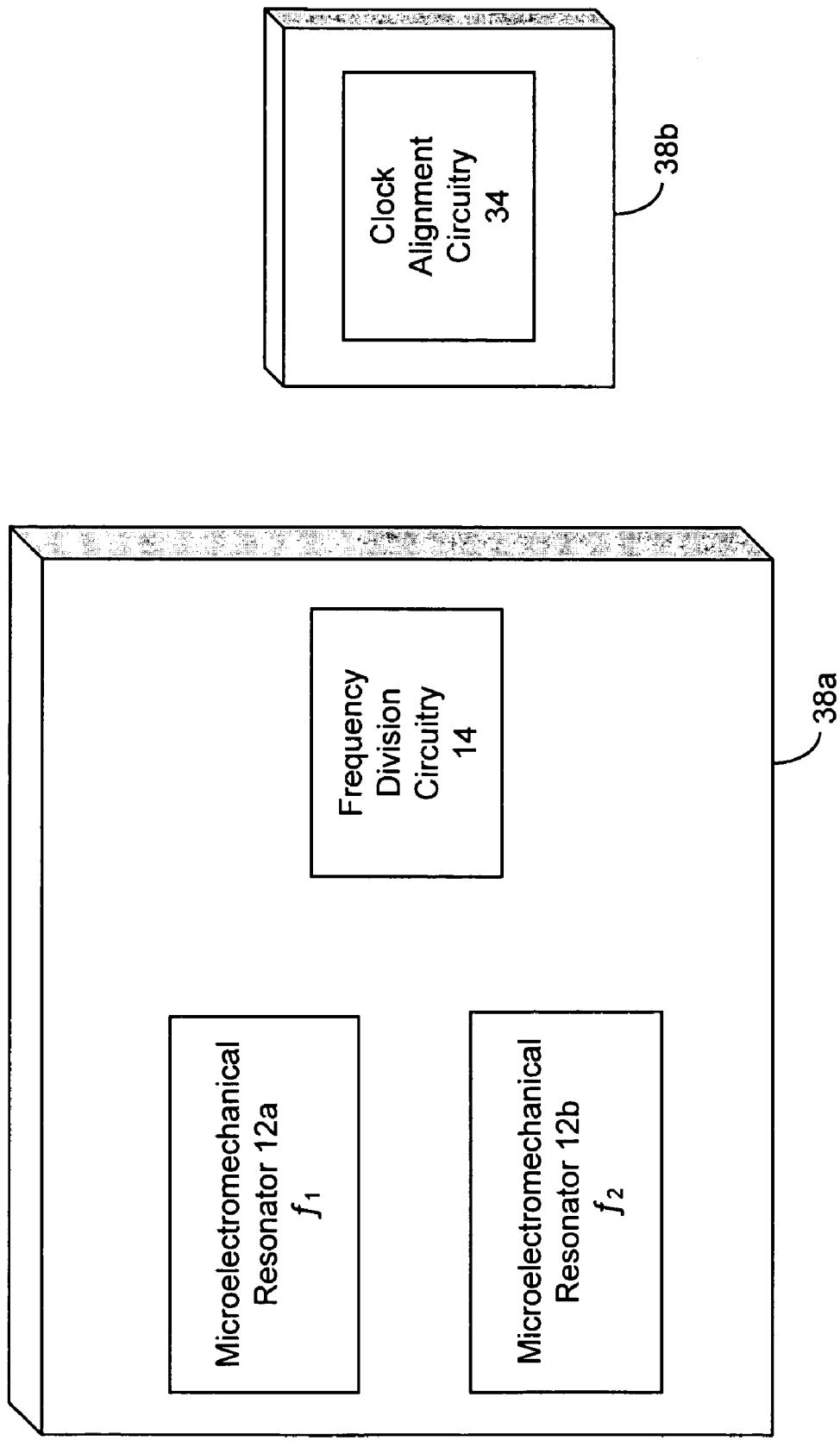
FIG. 14C illustrates a three-dimensional block diagram representation of an exemplary embodiment of the microelectromechanical oscillator having microelectromechanical resonators and frequency division circuitry integrated on/in a common and signal or clock alignment circuitry integrated on/in a different substrate.
Figure 15A:
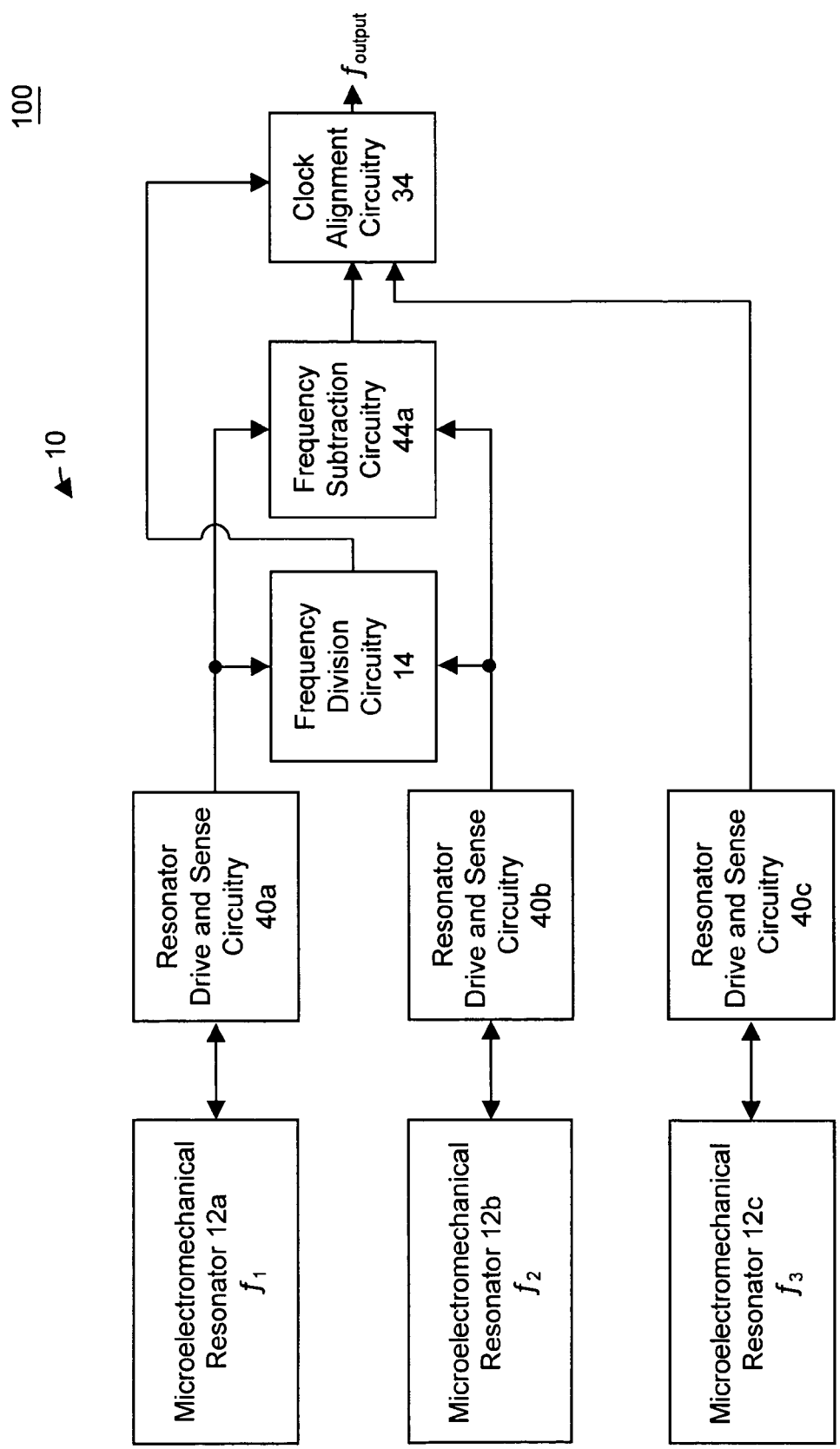
FIGS. 15A-15D are block diagram representations of exemplary microelectromechanical oscillator systems, including, among other things, clock alignment circuitry, three microelectromechanical resonators and frequency division circuitry, according to certain aspects of the present inventions.
Figure 15B:
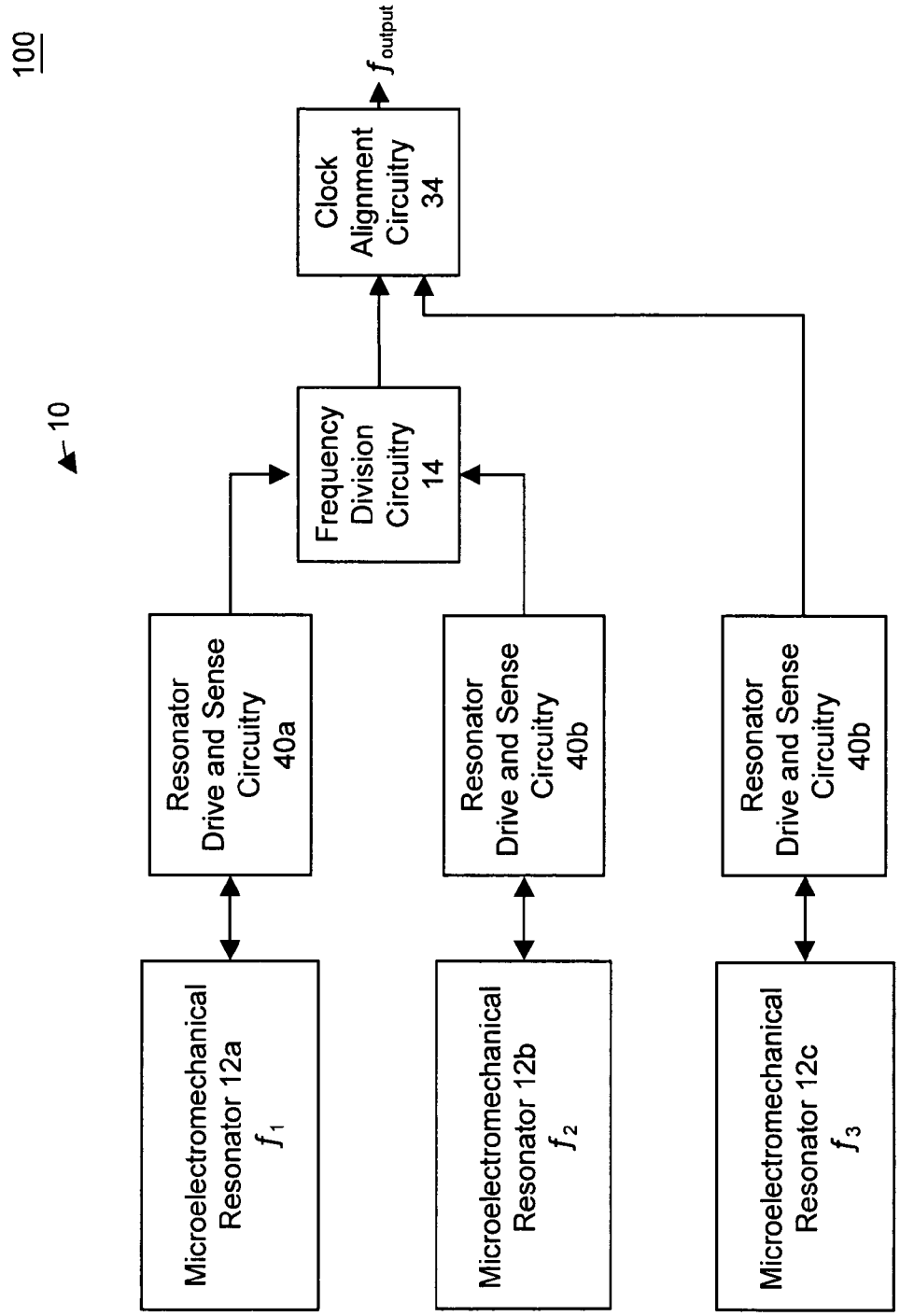
Figure 15C:
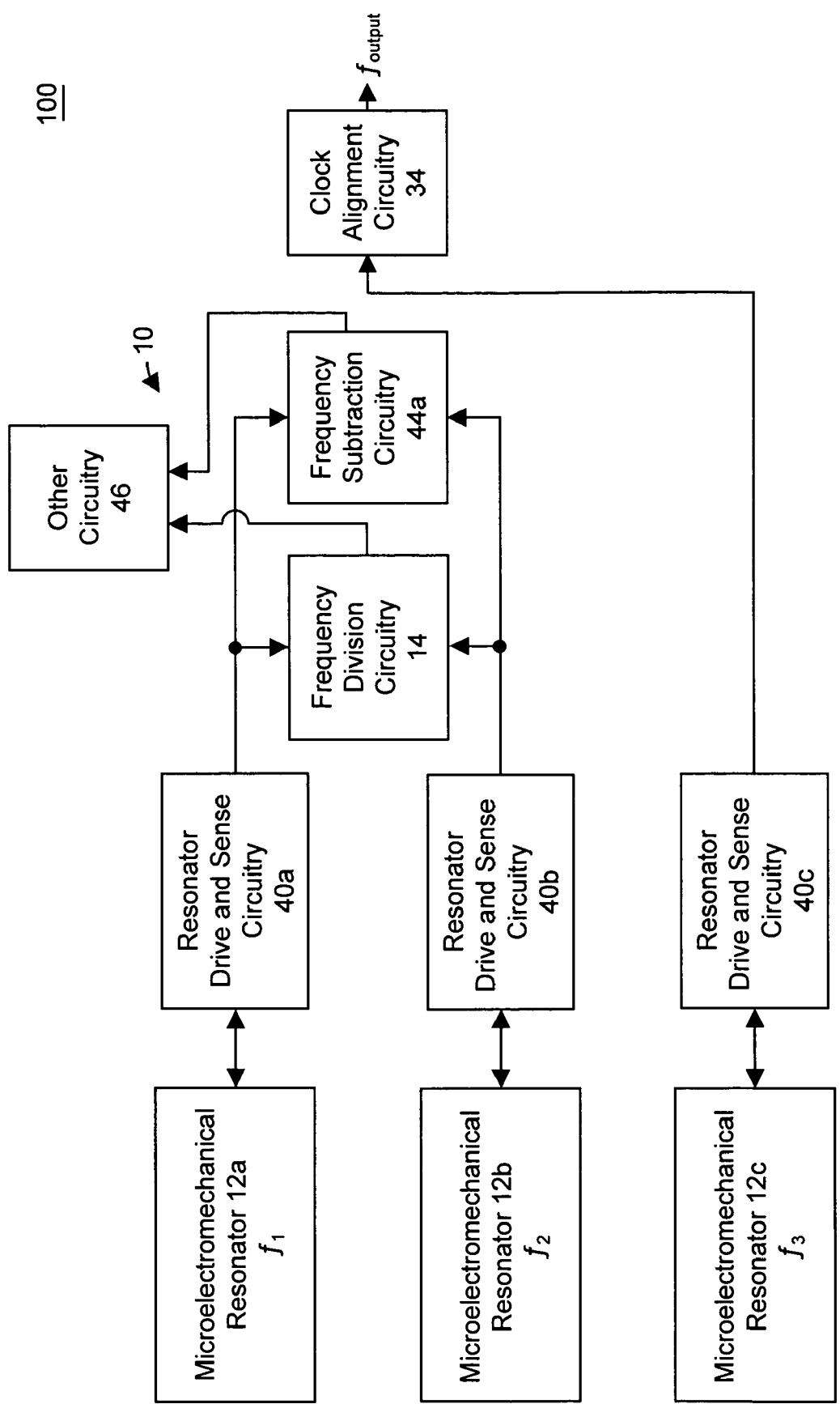
Figure 15D:
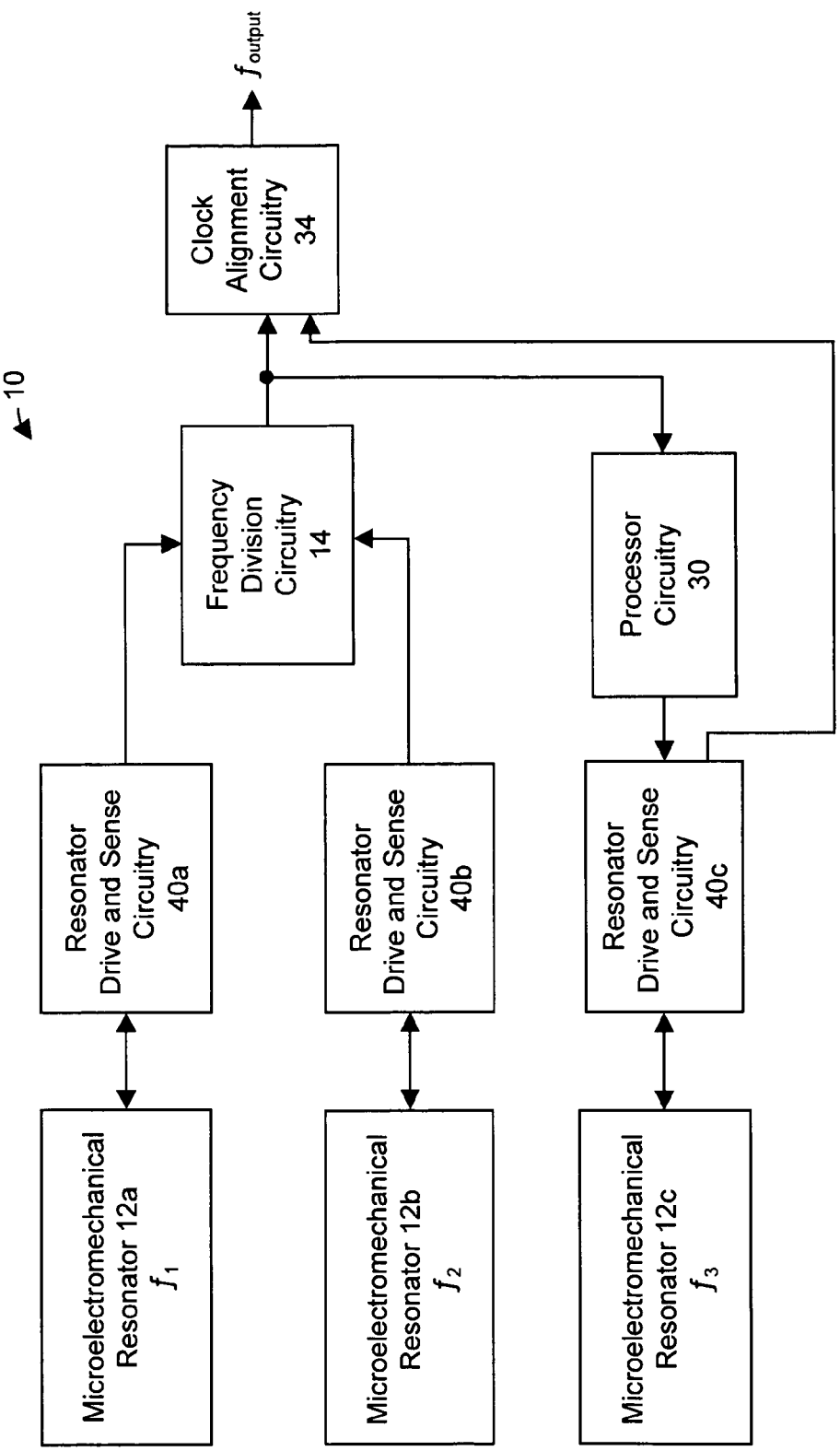
Figure 15E:
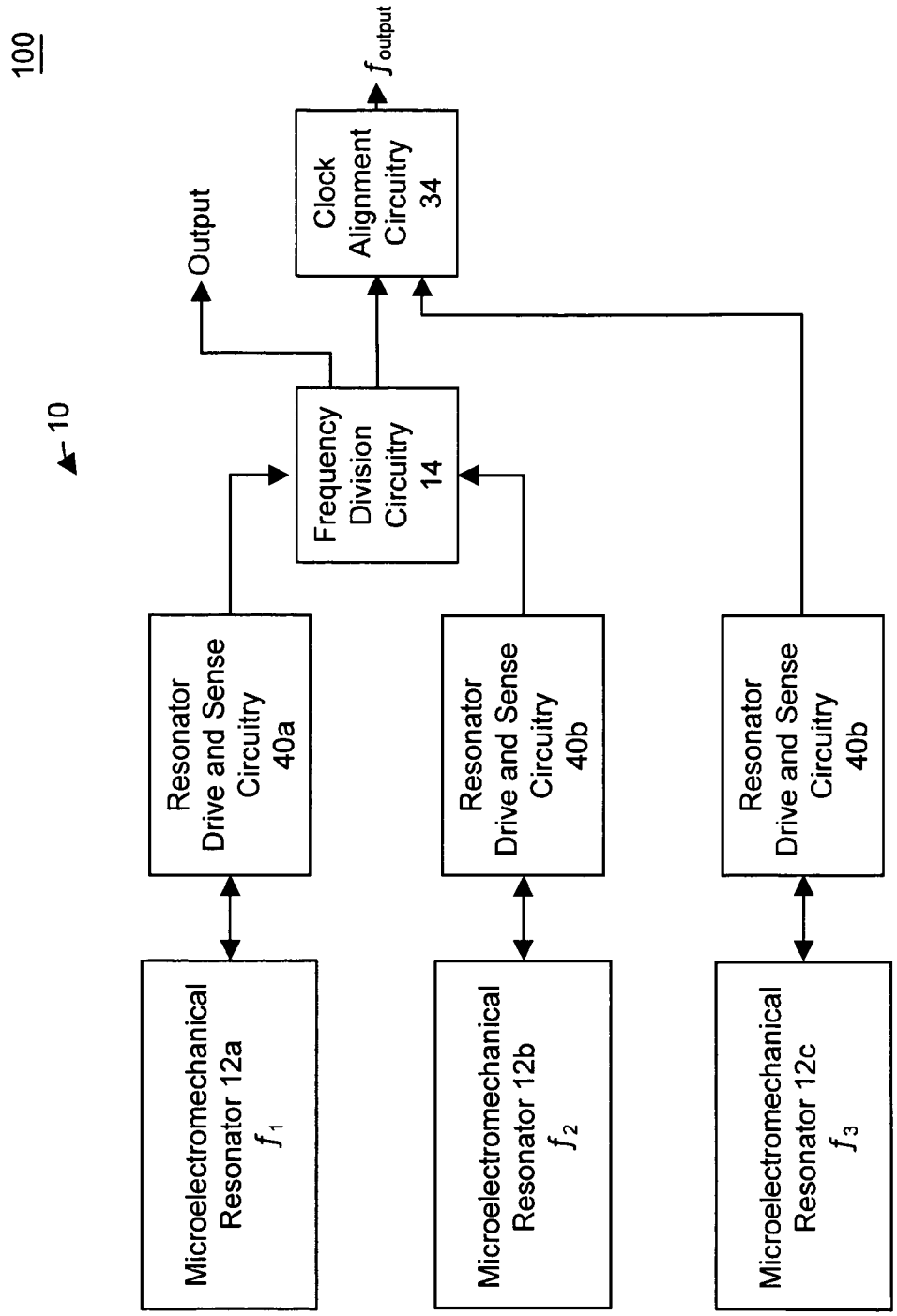
FIG. 15E is a block diagram representation of an exemplary oscillator system including clock alignment circuitry and three microelectromechanical resonators, wherein the frequency division circuitry of the temperature measurement system generates and/or provides an output signal which is representative of the operating temperature(s) of at least one of the microelectromechanical resonators, according to certain aspects of the present inventions.

The clock alignment circuitry 34 and/or frequency subtraction circuitry 44a may be disposed on/in the same substrate or on/in different substrates as microelectromechanical resonators 12 and/or frequency division circuitry 14. (See, for example FIGS. 14A-14C). All permutations and combinations thereof are intended to fall within the scope of the present inventions. Moreover, the present inventions may employ any interconnect or interconnection technique/architecture whether now known or later developed; all such techniques/architectures are intended to fall within the scope of the present inventions.

In another embodiment, temperature measurement system 10 and/or oscillator system 100 may include three or more microelectromechanical resonators 12. For example, with reference to FIGS. 15A-15D, temperature measurement system 10 and/or oscillator system 100 may include microelectromechanical resonators 12a-12c wherein resonators 12a and 12b are employed by frequency division circuitry 14, as discussed above, to generate and/or provide data which is representative of the operating temperature of resonators 12a and 12b. The microelectromechanical resonator 12c is employed by clock alignment circuitry 34 as, for example, a reference signal having a predetermined frequency (for example, a frequency (and/or frequency response over a predetermined temperature) which is selected based on the system application, architecture, operation and/or desired output signal ($f_{output}$) of clock alignment circuitry 34).

Notably, each of the embodiments described and illustrated herein may be employed in combination with three or more microelectromechanical resonators 12. For example, with reference to FIG. 15D, in one embodiment, frequency division circuitry 14, using any of the circuitry and/or techniques described herein, generates data which is representative of the operating temperature of resonators 12a and/or 12b. The processing circuitry 30 employs that data to adjust, control and/or modify the operating characteristics of microelectromechanical resonator 12c (for example, via resonator drive and sense circuitry 40a and 40b) and compensate for any changes in the operating temperature of resonator 12c. In this way, the stability of the frequency of the output signal of resonator 12c, over a range of temperatures (for example, a predetermined operating temperature range), may be enhanced. Thus, in this embodiment, the output signal of resonator 12c, which includes a frequency that is relatively stable at a predetermined temperature or over a predetermined temperature range, is employed by clock alignment circuitry 34 as, for example, a reference clock signal (having, for example, a predetermined frequency) to generate output signal ($f_{output}$).

Indeed, heating or cooling mechanisms (not illustrated) may be responsive to processing circuitry 30 to maintain and/or control the operating temperature of microelectromechanical resonator 12c at a predetermined temperature or within a predetermined temperature range in order to provide an output signal having certain characteristics. Notably, the embodiments pertaining to controlling the operating characteristics of resonators 12 may employ in addition or in lieu of active compensation via, for example, changing or modifying the operating or performance characteristics of resonator drive and sense circuitry 40, heating or cooling mechanisms to maintain and/or control the operating temperature of one or more microelectromechanical resonators 12 at a predetermined temperature or within a predetermined temperature range.

Again, each of the embodiments described and illustrated herein may employ three or more microelectromechanical resonators 12. For the sake of brevity, the discussion of such permutations and combinations will not be separately set forth herein. For example, temperature measurement system 10 and/or oscillator system 100 may also output a signal which is representative of the operating temperature(s) of resonators 12a and/or 12b, for example, to an operator. (See, for example, FIG. 15F).

Figure 16A:
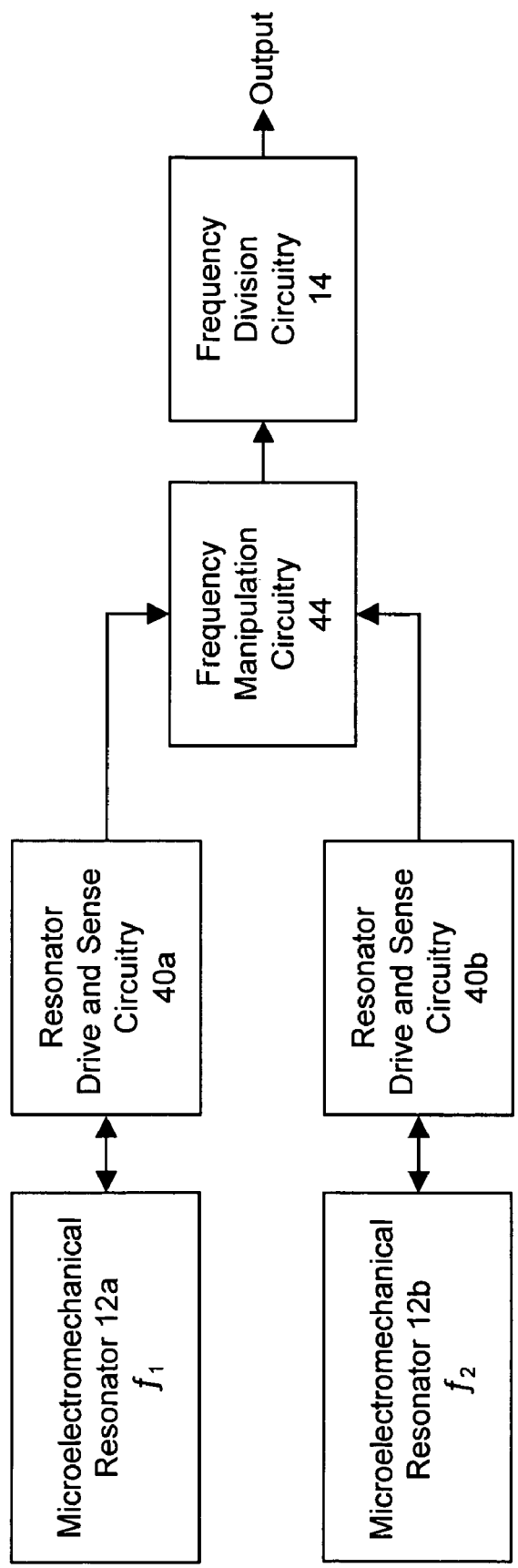
FIGS. 16A and 16B are block diagram representations of exemplary temperature measurement systems, including, among other things, frequency manipulation circuitry and frequency division circuitry, according to certain aspects of the present inventions.

As mentioned above, temperature measurement system 10 and/or oscillator system 100 employs frequency division circuitry 14 to generate and/or provide at least one output signal which is representative of the operating temperature of one, some or all of microelectromechanical resonators. The frequency division circuitry 14 may divide the frequency of the output signal of microelectromechanical resonator 12a by the frequency of the output signal of microelectromechanical resonator 12b. The frequency division circuitry may also divide relationship(s) between the frequencies of the output signals of microelectromechanical resonators 12a and 12b. For example, in one embodiment, with reference to FIG. 16A, frequency division circuitry 14 receives the output of signal of frequency manipulation circuitry 44 which includes a signal having a frequency of the "difference" between the frequencies of the signals from microelectromechanical resonators 12 (the "frequency difference component") and a signal that includes a frequency of the "sum" of the frequencies of the signals from microelectromechanical resonators 12 (the "frequency sum component"), as discussed in detail in U.S. application Ser. No. 11/399,176, (which as mentioned above, is incorporated by reference herein in its entirety). The frequency division circuitry 14 may employ such signals and generate and/or provide at least one output signal which is representative of the operating temperature of one, some or all of microelectromechanical resonators 12. In one embodiment, the operation may be characterized as follows:

$$\text{Output} = \frac{f_1 + f_2}{f_1 - f_2}$$

Figure 16B:
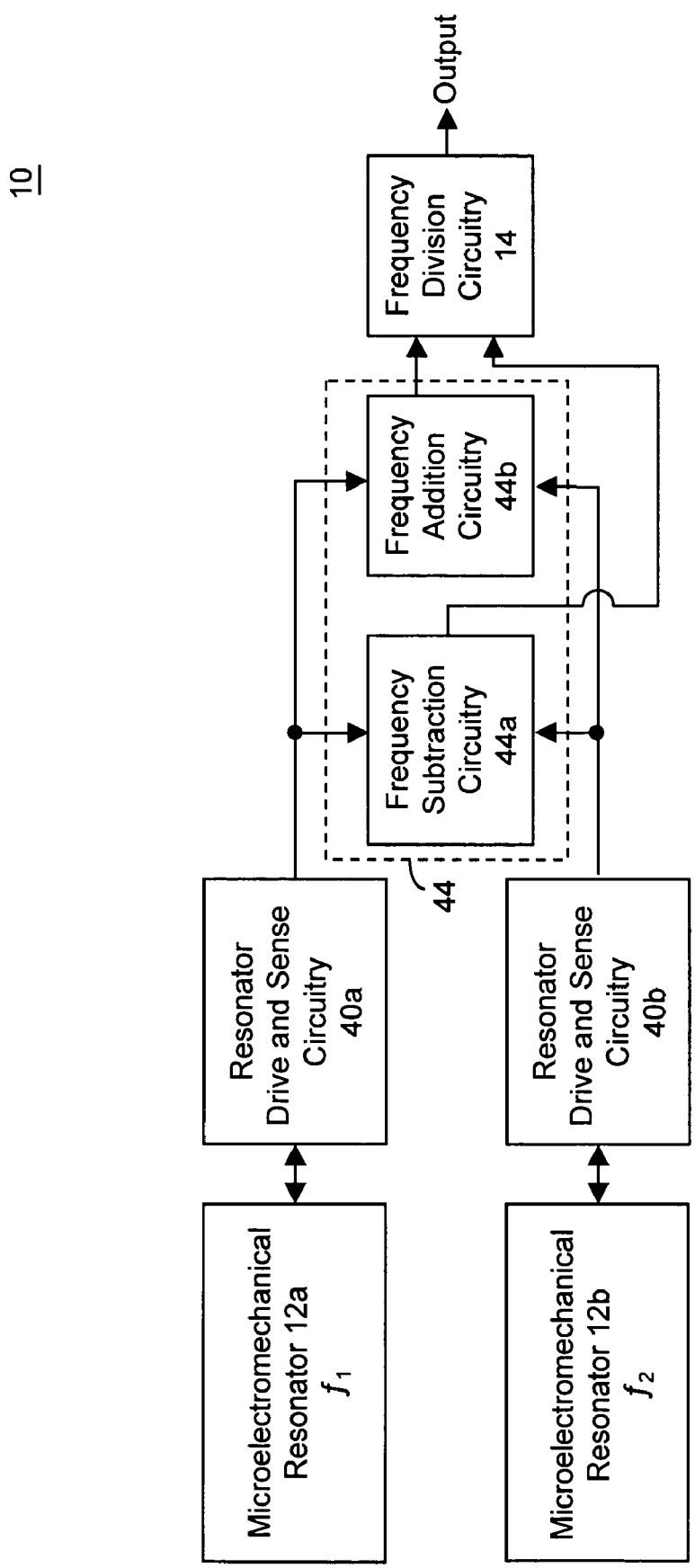

FIG. 16B illustrates a more detailed embodiment. The frequency subtraction circuitry 44a and frequency addition circuitry 44b may be implemented using frequency mixer circuitry. Notably, as discussed in detail in U.S. application Ser. No. 11/399,176, frequency mixer circuitry is well known circuitry which provides, generates and/or produces a signal that includes a frequency of the "difference" between the frequencies of the two input signals (the "frequency difference component") and a signal that includes a frequency of the "sum" of the frequencies of the two input signals (the "frequency sum component"). The frequency mixer circuitry may be current based or voltage based. Indeed, all forms, types and architectures of frequency mixer circuitry, whether now known or later developed, are intended to fall within the scope of the present inventions.

In another set of embodiments, in addition to, or in lieu of signals/data that are representative of the frequency of the output signal of microelectromechanical resonators 12, the signals/data provided to analysis circuitry 18 may be representative of the period of the output signal of microelectromechanical resonators 12. In this set of embodiments, frequency converter circuitry 16 generates an analog and/or digital representation of the period of the output signal of microelectromechanical resonators 12. Accordingly, the operation of frequency division circuitry 14 may be characterized as follows:

$$\text{Output} = \frac{p_1}{p_2}$$

Notably, all of the embodiments discussed herein are entirely applicable to this set of embodiments. For the sake of brevity those discussions will not be repeated.

Moreover, for the purposes of the claims, dividing representations of the frequency of the output signal of microelectromechanical resonators 12 shall mean both dividing representations of the frequency of the output signal of microelectromechanical resonators 12 and/or dividing representations of the period of the output signal of microelectromechanical resonators 12.

In addition, where one of the input signals of analysis circuitry 18 is representative of the period of the output signal of microelectromechanical resonator 12 (for example, resonator 12a) and another signal is representative of the frequency of the output signal of microelectromechanical resonator 12 (for example, resonator 12b), analysis circuitry 18 may obtain, generate and/or output a signal that is representative of the temperature via multiplying such signals. In this way, the output of analysis circuitry 18 is representative of the operating temperature of one, some or all of microelectromechanical resonators 12. Thus, in this embodiment, frequency division circuitry 14, via analysis circuitry 18, generates, provides and/or outputs the product of (i) the period of the output signal of a first microelectromechanical resonator 12 and (ii) the frequency of the output signal of a second microelectromechanical resonator 12.

Figure 17:
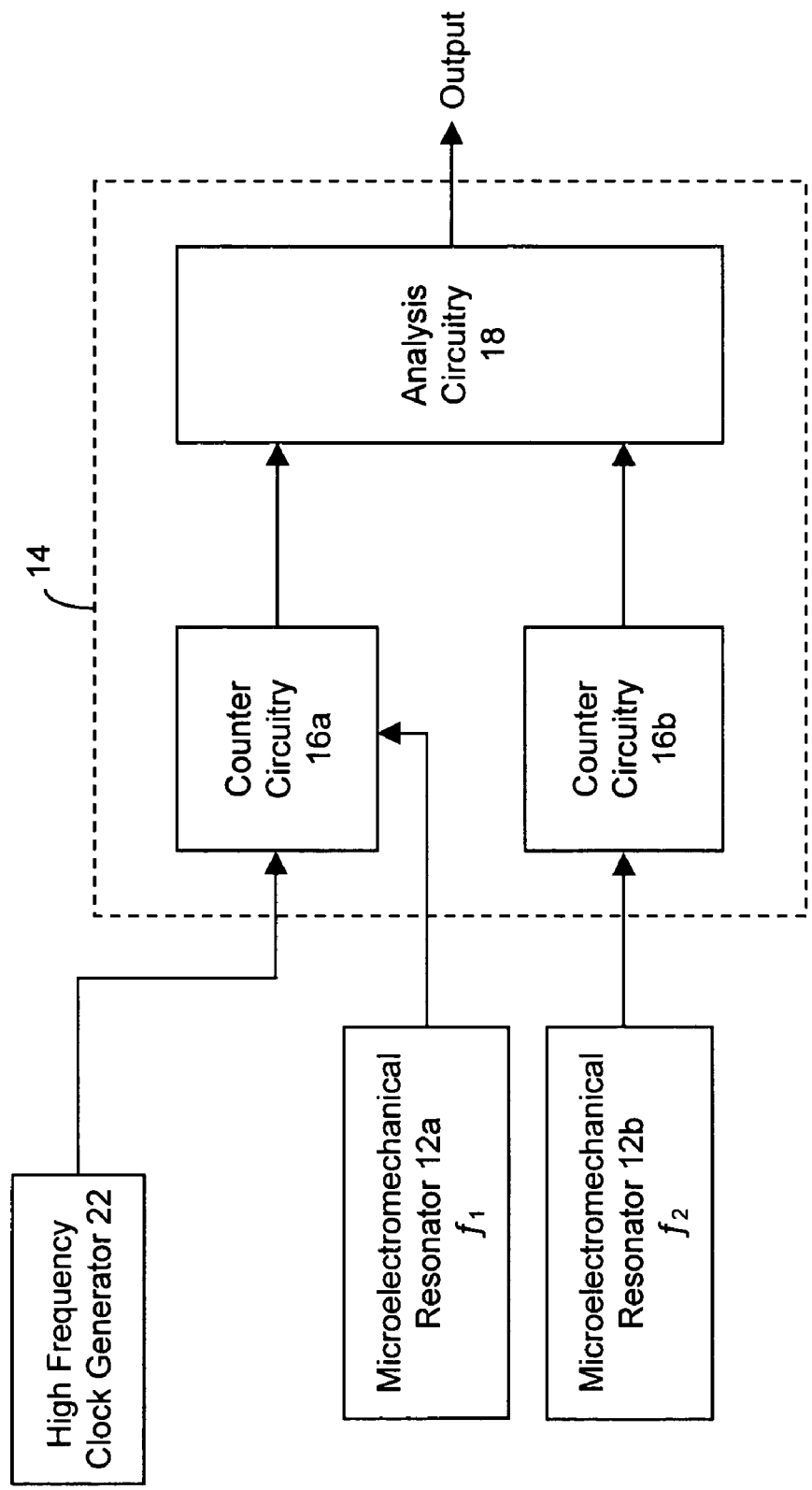
FIG. 17 is a block diagram representation of an exemplary embodiment of a temperature measurement system wherein the analysis circuitry generates an output signal which is representative of an operating temperature by multiplying data which is representative of the period of the output signal of microelectromechanical resonator 12a by data which is representative of the frequency of the output signal of microelectromechanical resonator 12b, according to certain aspects of the present inventions.

For example, with reference to FIG. 17, counter circuitry 16a generates data which is representative of the period of the output signal of microelectromechanical resonator 12a. The counter circuitry 16b generates data which is representative of the frequency of the output signal of microelectromechanical resonator 12b. The analysis circuitry 18 generates and/or outputs a signal that is representative of the temperature of microelectromechanical resonators 12 by multiplying the data from counter circuitry 16a and 16b. Accordingly, the operation of frequency division circuitry 14 may be characterized as follows:

Output=$p_1 \times f_2$

There are many circuits, architectures and/or techniques to generate, obtain, determine, measure and/or calculate data which is representative of the period of the output signal of one or more microelectromechanical resonator 12. All such circuits, architectures and/or techniques, whether now known or later developed, are inteded to fall within the scope of the present inventions.

With reference to FIGS. 18A-18M, temperature measurement system 10 and/or oscillator system 100 may include one or more electronic/electrical resonator circuits 50. For example, where temperature measurement system 10 includes two electronic/electrical resonator circuits 50a and 50b, each resonator system includes one or more material or design properties that respond differently to temperature (relative to the other resonator circuit). The output of electronic/electrical resonator circuit 50, having a frequency which varies temperature, may be applied to frequency division circuitry 14 to generate an output signal having a predetermined frequency that is substantially stable over temperature. The frequency division circuitry 14 may, in addition to or in lieu thereof, generate an output signal having a predetermined frequency that changes over temperature in a predetermined manner.

Figure 18A:
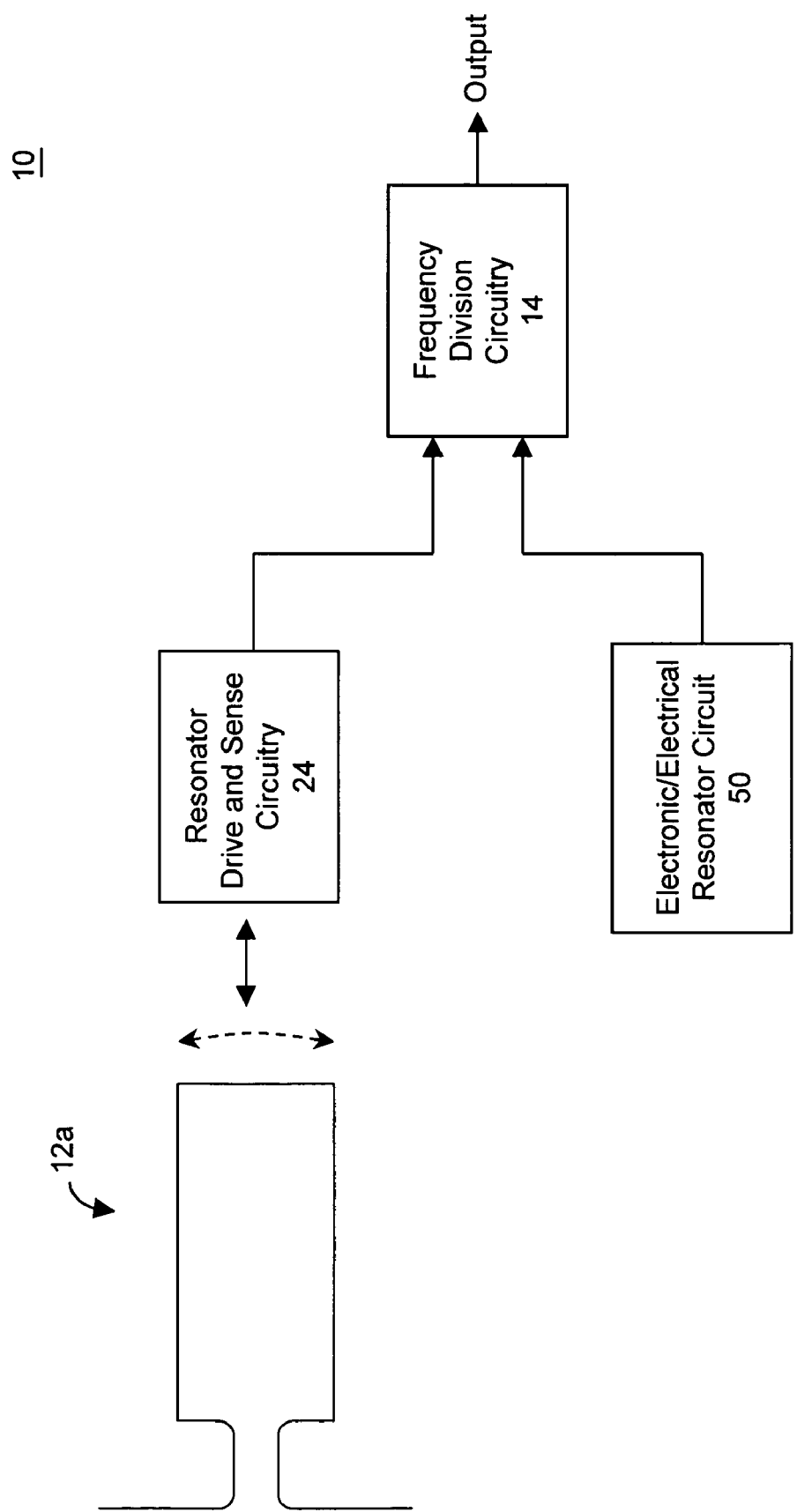
FIGS. 18A-18K are block diagram illustrations of exemplary oscillator systems according to aspects and/or embodiments of the present inventions wherein one or more electronic/electrical resonators each provide an output signal to the frequency division circuitry, according to certain aspects and/or embodiments of the present inventions.
Figure 18B:
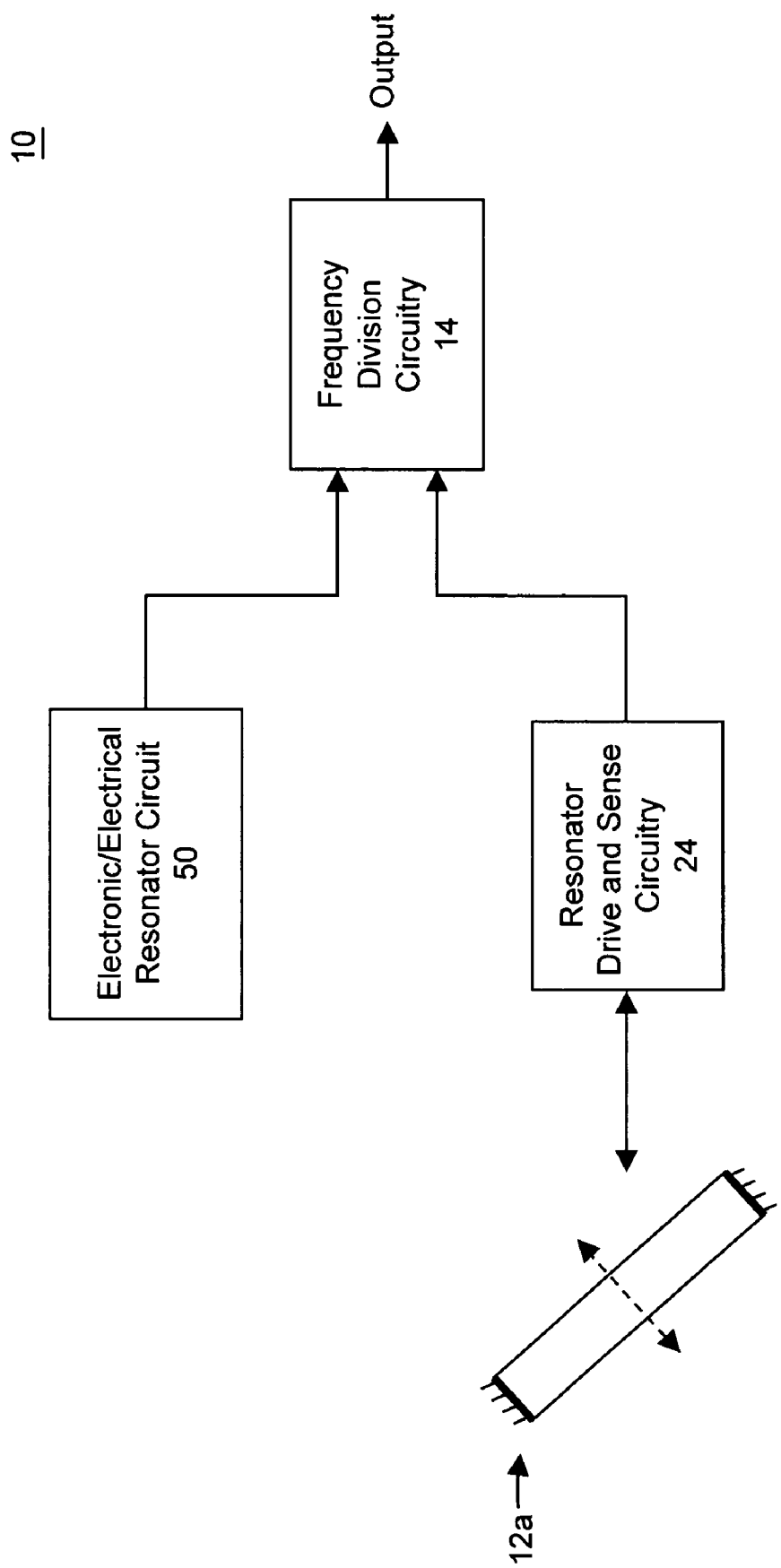
Figure 18C:
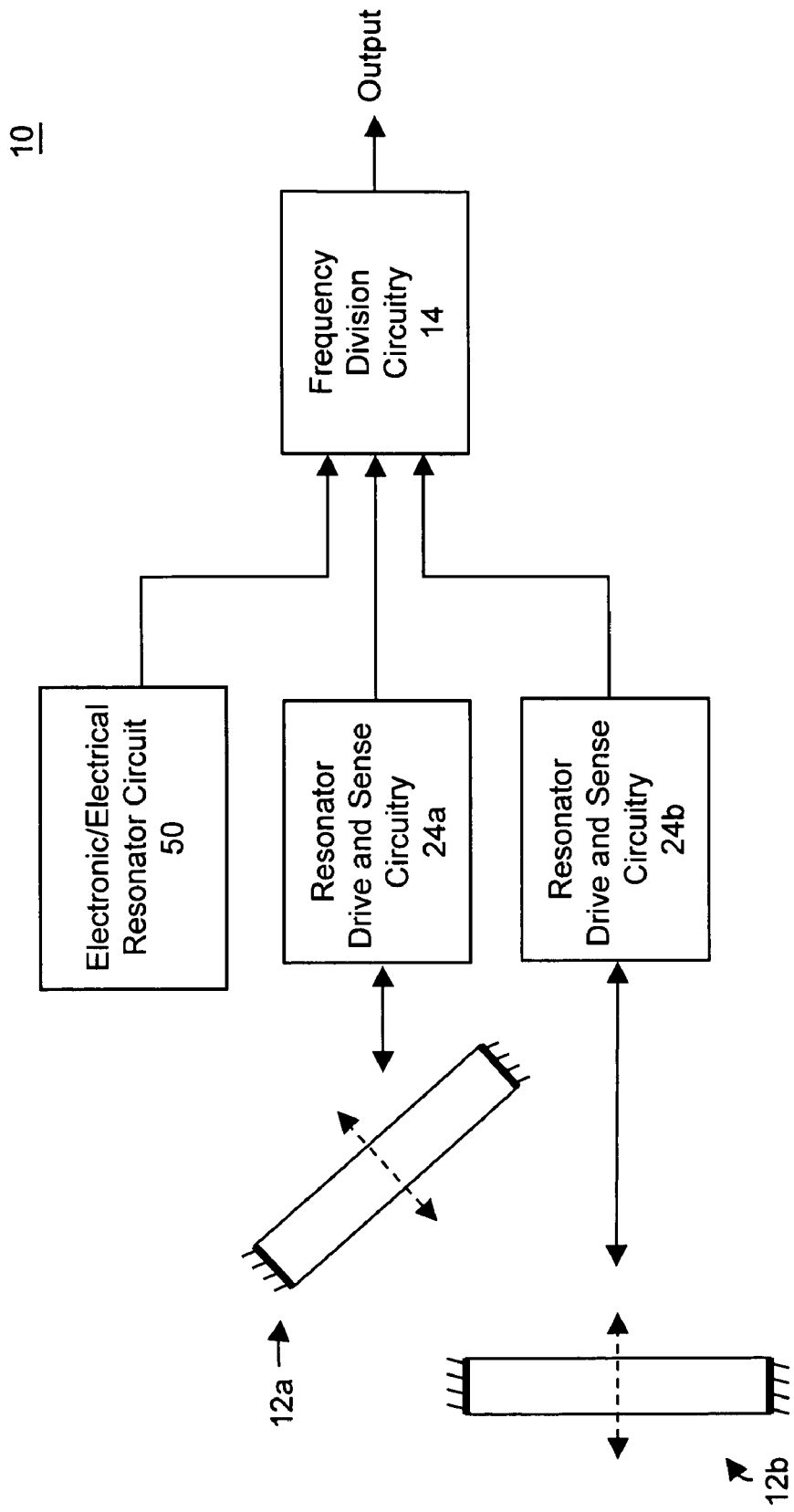
Figure 18D:
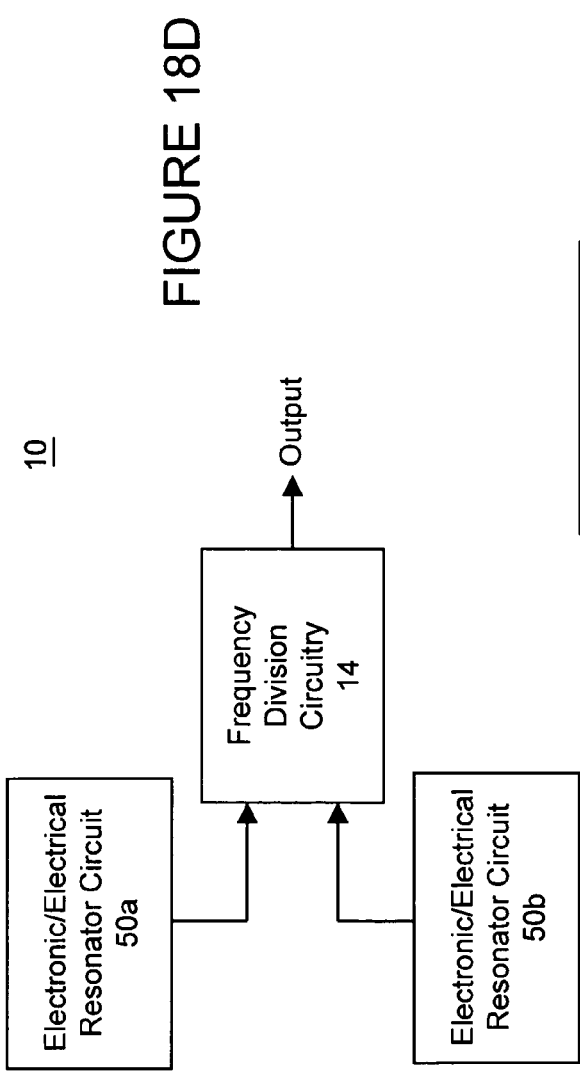
Figure 18E:
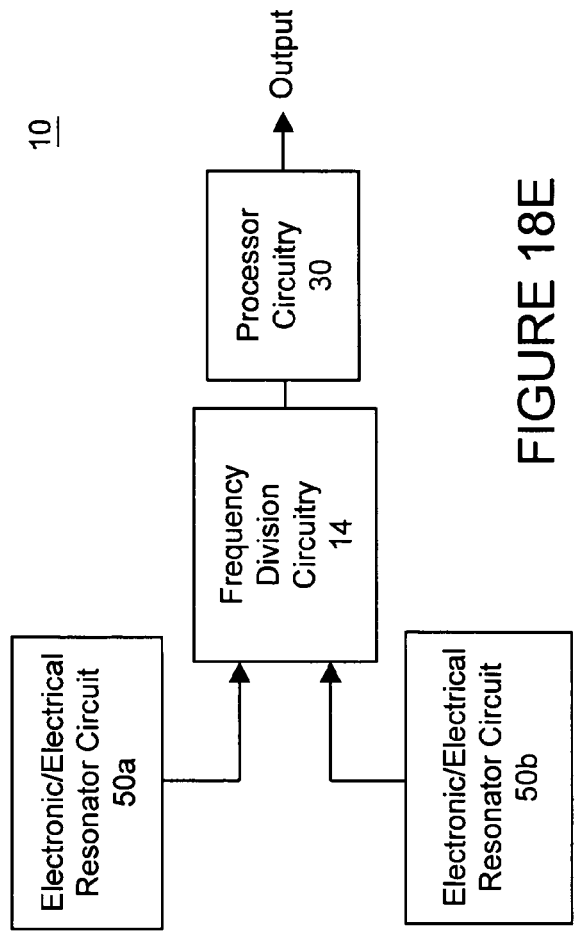
Figure 18F:
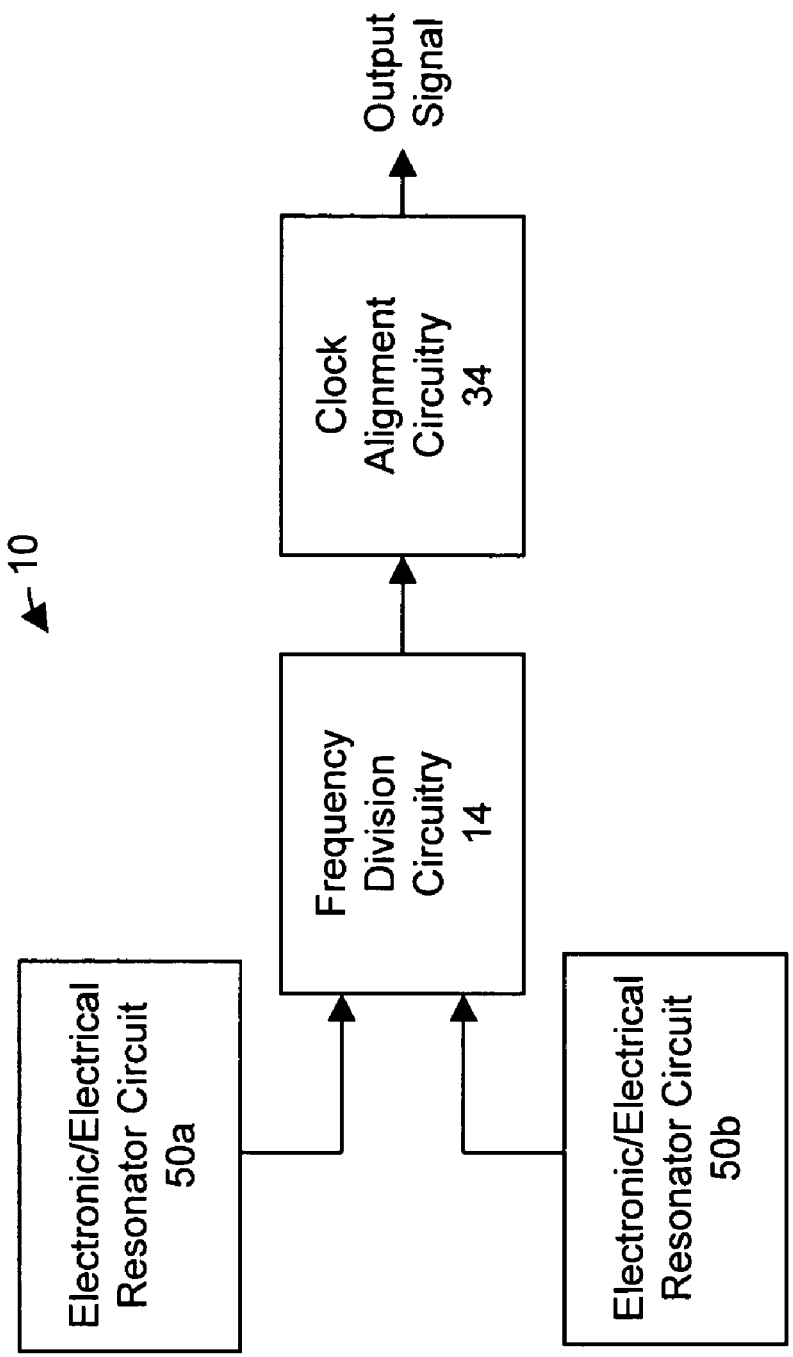
Figure 18G:
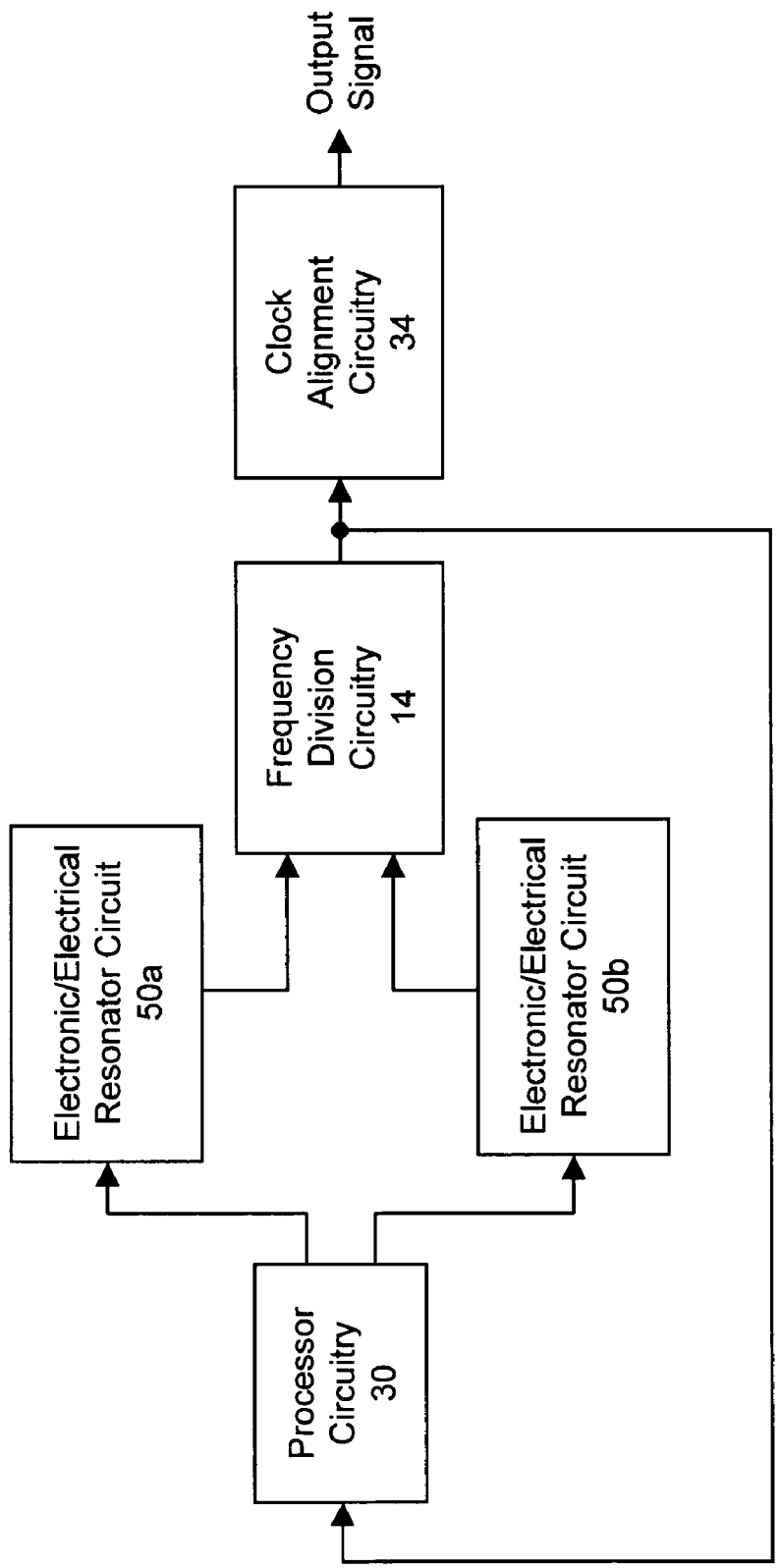
Figure 18H:
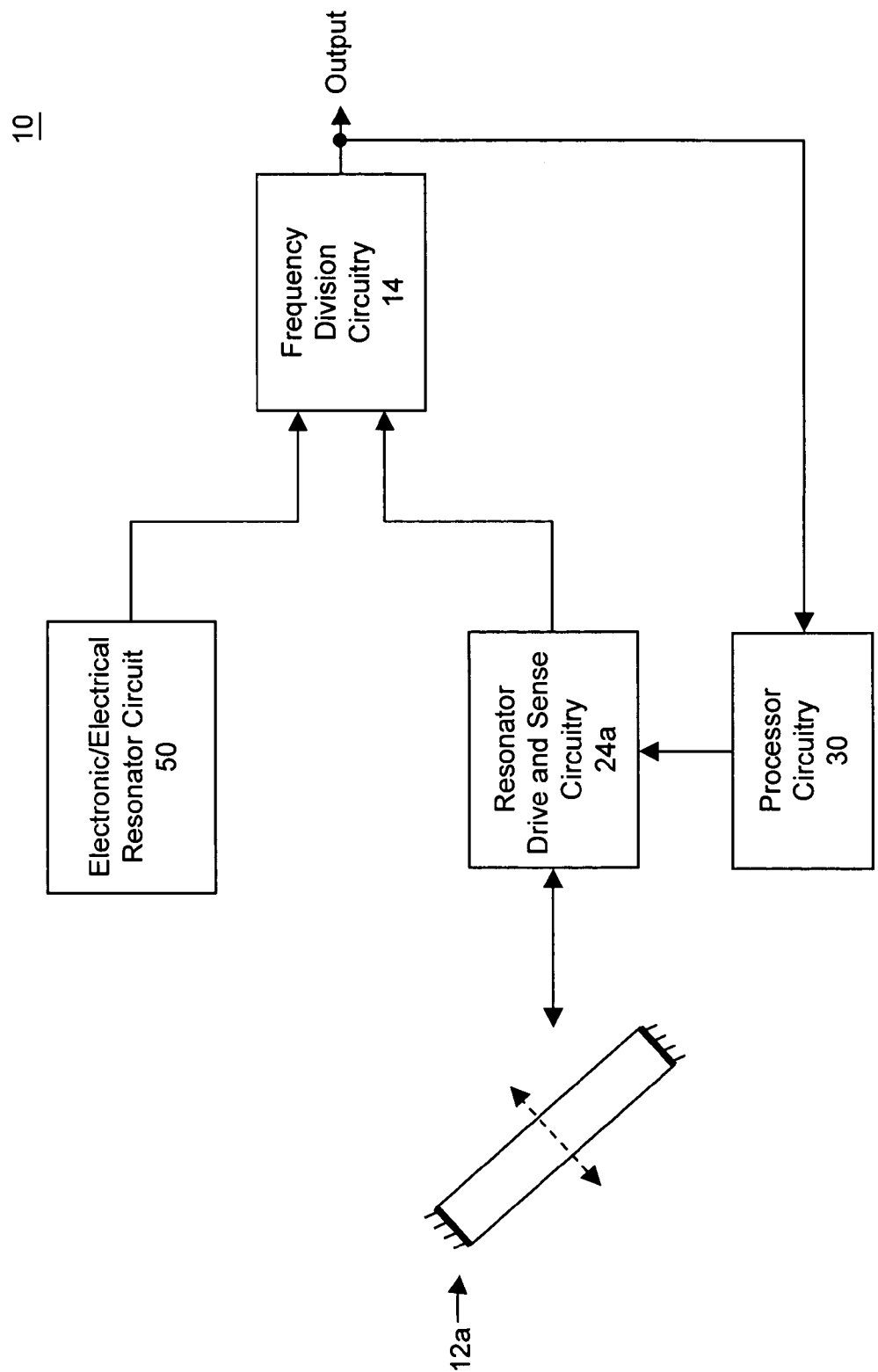
Figure 18I:
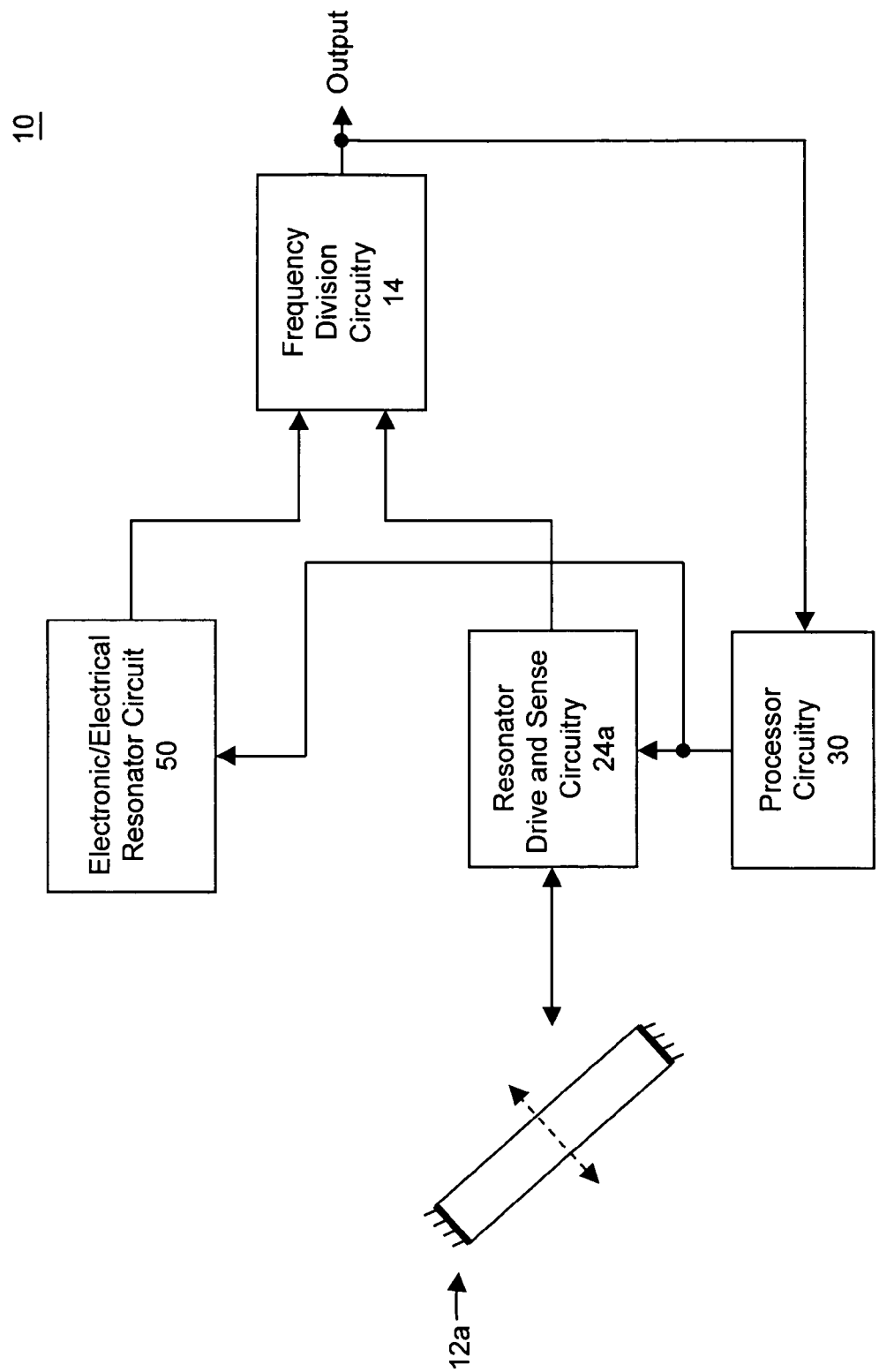
Figure 18J:
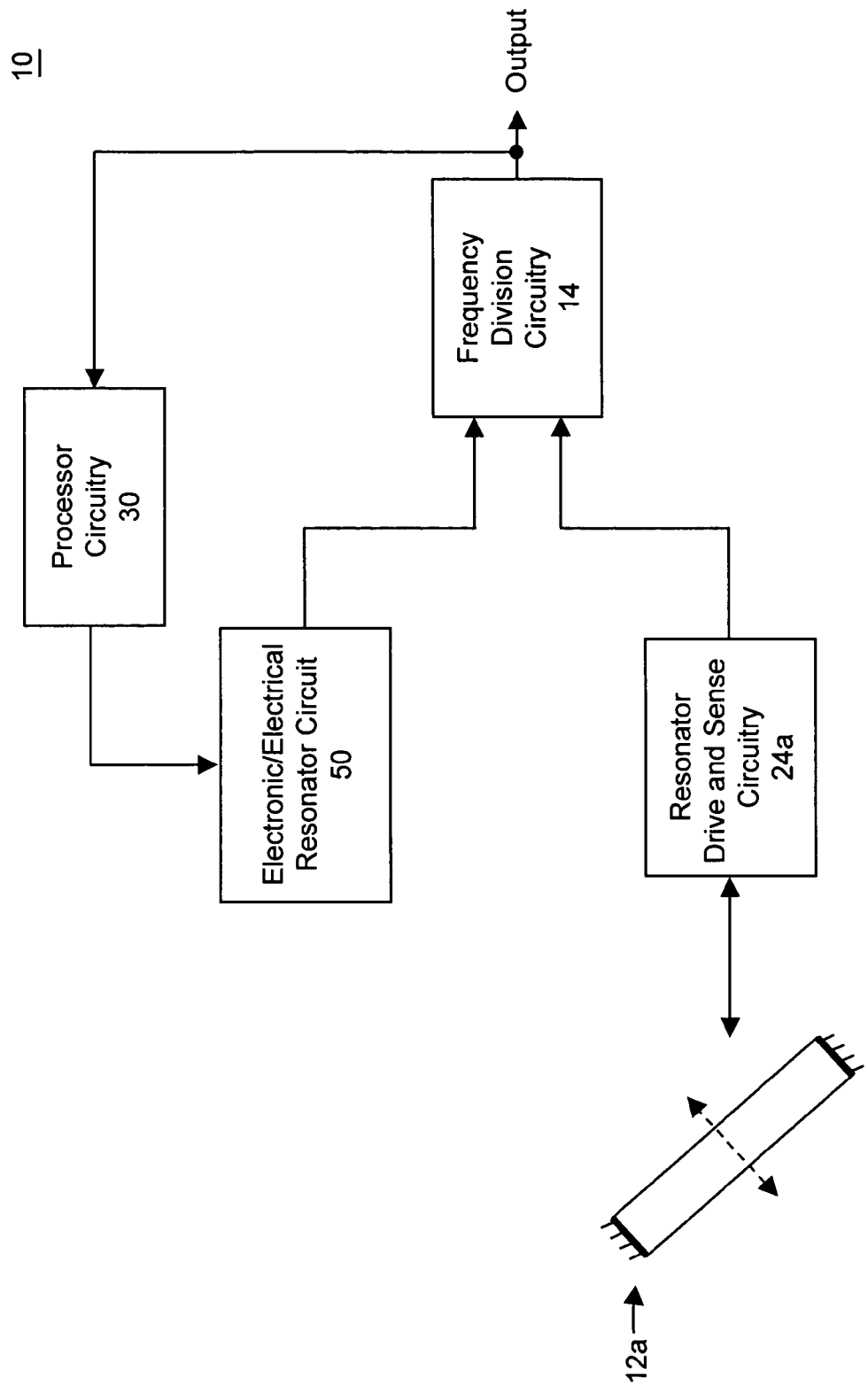
Figure 18K:
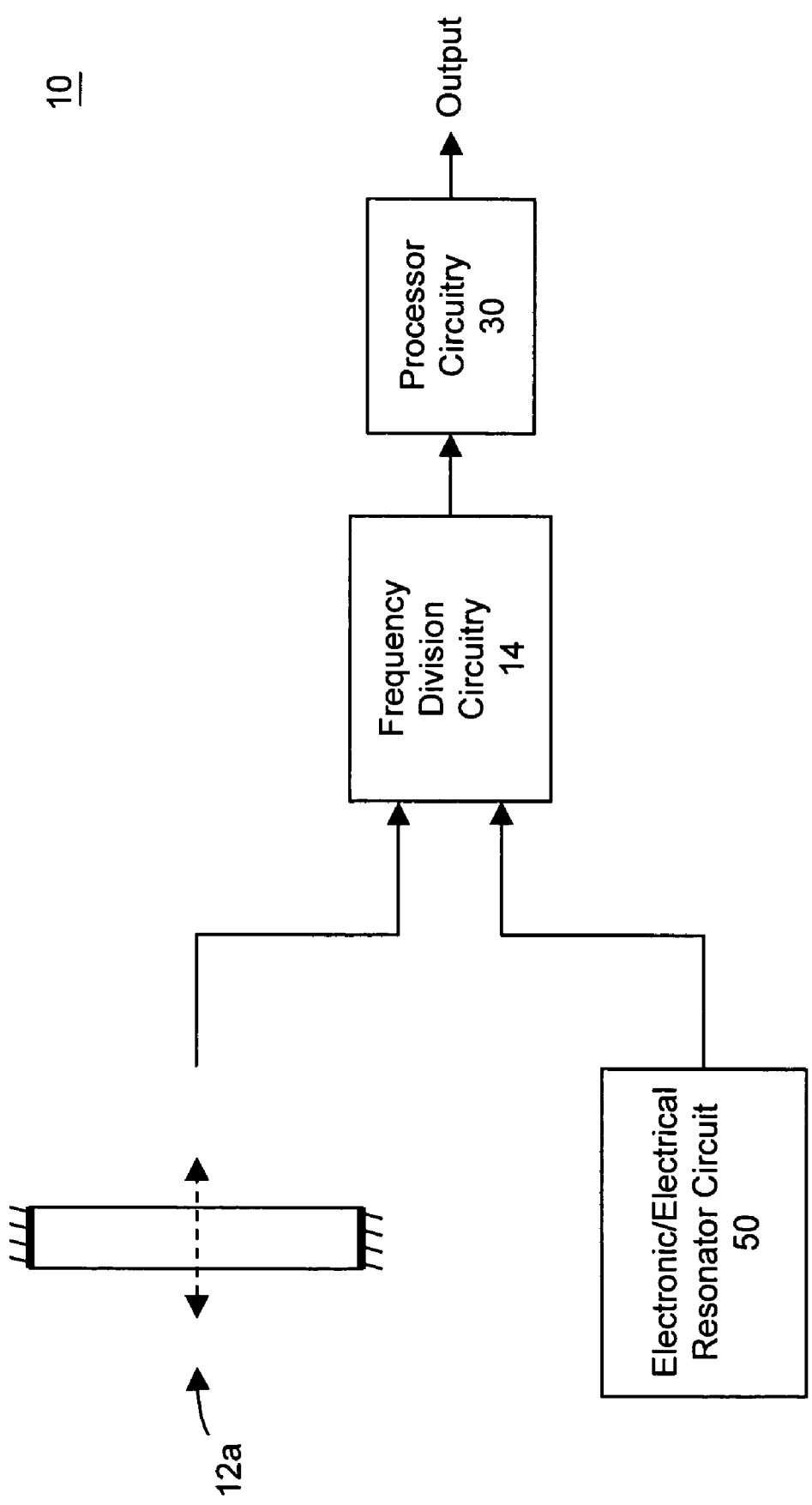

In one embodiment, one or more of microelectromechanical resonators 12 may be "replaced" by an electronic or electrical resonator circuit (for example, a capacitor/inductor circuit that, when stimulated/activated, resonates at a given or predetermined frequency). In this regard, with reference to FIGS. 18A, 18B and 18C, in one exemplary embodiment, electronic/electrical resonator circuit 50 provides a signal having a frequency that depends on the operating temperature of the elements of electronic/electrical resonator circuits 50, the design of resonator circuits 50, and the properties of the material comprising such elements. With reference to FIGS. 18D and 18E, in one exemplary embodiment, electronic/electrical resonator circuits 50a and 50b each provide a signal having a frequency that depends on the operating temperature of the elements of electronic/electrical resonator circuit 50 and the design and properties of the material comprising such elements.

Similar to the embodiments described and illustrated above, oscillator system 100 may be configured to provide and/or generate one or more output signals having a predetermined frequency over temperature, for example, (1) an output signal having a substantially stable frequency over a predetermined range of operating temperatures and/or (2) an output signal having a frequency that is dependent on the operating temperature from which the operating temperature may be determined (for example, an estimated operating temperature based on a empirical data and/or a mathematical relationship).

Like the other embodiments described above in the context of microelectromechanical resonators 12, in one embodiment of this aspect of the inventions, the output signal (of frequency division circuitry 14) having the substantially stable frequency over temperature may be employed as an output signal and/or may be applied to clock alignment circuitry 34. (See, for example, FIGS. 18F and 18G). In this way, the clock signal may include a predetermined frequency that is higher or lower in frequency than the frequency of the output signal of the oscillator system. Indeed, the clock alignment circuitry 34 may provide a plurality of output signals that are higher and/or lower in frequency than the frequency of the output signal of the oscillator system.

In one embodiment, the signal which is representative of the operating temperature of temperature measurement system 10 may be applied to processor circuitry 30 to interpret, analyze and/or correlate the frequency of the signal which is the dependent on the operating temperature. (See, for example, FIGS. 18H-18J). Notably, all operations and/or functions described above with respect to processor circuitry 30 are applicable to this embodiment. Moreover, all permutations and combinations employing processor circuitry 30 and/or resonator drive and sense circuitry 40, in conjunction with one or more electronic/electrical resonator circuits 50, are intended to fall within the scope of the present inventions. (See, for example, FIGS. 18H-18K). For the sake of brevity, those discussions will not be repeated.

Notably, each of the aspects of the present inventions, and/or embodiments thereof, may be employed alone or in combination with one or more of such aspects and/or embodiments. For the sake of brevity, those permutations and combinations will not be discussed separately herein. As such, the present inventions are not limited to any single aspect or embodiment thereof nor to any combinations and/or permutations of such aspects and/or embodiments.

While the present inventions have been described in the context of microelectromechanical systems including micromechanical resonators, the present inventions are not limited in this regard. Rather, the inventions described herein are applicable to gyroscopes, resonators, temperature sensors, accelerometers and/or other transducers as well as other electromechanical systems including, for example, nanoelectromechanical systems. Moreover, the oscillator system of the present inventions may be employed and/or embedded in any electrical device, for example, in which the oscillator output is used to coordinate or synchronize operations and/or provide one or more clock signals (for example, in a wired, wireless, or optical fiber network communication system, in which transmit and receive circuits synchronize with each other, or synchronization of multiple oscillators on a high-speed electronics chip designed to minimize clock signal skew, or synchronizing components across a board or a communication bus) and/or in any electrical device in which temperature related information is employed.

It should be further noted that the term "circuit" may mean, among other things, a single component (for example, electrical/electronic and/or microelectromechanical) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, PGA, one or more processors implementing software, or a combination of one or more circuits (whether integrated or otherwise), one or more state machines, one or more PGAs, one or more processors, and/or one or more processors implementing software. The term "data" may mean, among other things, a current or voltage signal(s) whether in an analog or a digital form.

The term "frequency function of temperature" of a microelectromechanical resonator may mean, among other things, the change in frequency of a resonator due to a change in Young's modulus over temperature of the microelectromechanical resonator, the change in thermal coefficient of expansion of the microelectromechanical resonator over temperature, the change in mass of the microelectromechanical resonator over temperature, and/or the change in stress/strain conditions of the microelectromechanical resonator, the substrate and/or the housing.

The invention claimed is:

1. An oscillator system, comprising:
a temperature measurement system including:
a first microelectromechanical resonator to generate a first output signal having a frequency that varies with operating temperature, wherein the first microelectromechanical resonator includes a frequency function of temperature;
a second microelectromechanical resonator to generate a second output signal having a frequency that varies with operating temperature, wherein the second microelectromechanical resonator includes a frequency function of temperature;
frequency division circuitry, coupled to the first and second microelectromechanical resonators, to determine data which is representative of the operating temperature of the first and/or second microelectromechanical resonator using (i) data which is representative of the frequency of the first output signal and (ii) data which is representative of the frequency of the second output signal;
frequency manipulation circuitry, coupled to the first and second microelectromechanical resonators, to generate a third output signal using the first and second output signals; and
clock alignment circuitry, coupled to the temperature measurement system and frequency manipulation circuitry, to generate an output signal having frequency which is substantially stable over a predetermined operating temperature using (i) the third output and (ii) the data which is representative of the operating temperature of the first and/or second microelectromechanical resonator.

2. The oscillator system of claim 1 wherein the frequency manipulation circuitry includes frequency subtraction circuitry.

3. The oscillator system of claim 2 wherein the frequency subtraction circuitry includes digital or analog circuitry.

4. The oscillator system of claim 1 wherein the frequency division circuitry includes circuitry to divide the frequency of the first output signal by the frequency of the second output signal in a digital domain.

5. The oscillator system of claim 4 wherein the frequency division circuitry includes counter circuitry and/or analog-to-digital converter circuitry.

6. The oscillator system of claim 4 wherein the frequency division circuitry further includes:
means for generating the data which is representative of the frequency of the first output signal;
means for generating the data which is representative of the frequency of the second output signal; and
means for dividing the data which is representative of the frequency of the first output signal by the data which is representative of the frequency of the second output signal.

7. The oscillator system of claim 1 wherein the frequency division circuitry includes circuitry to divide the frequency of the first output signal by the frequency of the second output signal in an analog domain.

8. The oscillator system of claim 7 wherein the frequency division circuitry further includes:
means for generating the data which is representative of the frequency of the first output signal;
means for generating the data which is representative of the frequency of the second output signal; and
divider circuitry, coupled to the first and second counter circuitry, to determine the data which is representative of the operating temperature of the first and/or second microelectromechanical resonator using (i) the data which is representative of the frequency of the first output signal and (ii) the data which is representative of the frequency of the second output signal.

9. The oscillator system of claim 4 wherein the clock alignment circuitry generates the output signal having frequency which is substantially stable over a predetermined operating temperature using one or more phase locked loops, delay locked loops, frequency locked loops and/or digital/frequency synthesizers.

10. The oscillator system of claim 4 wherein the clock alignment circuitry generates the output signal having frequency which is substantially stable over a predetermined operating temperature using (i) the third output signal and (ii) one or more phase locked loops, delay locked loops, frequency locked loops and/or digital/frequency synthesizers.

11. The oscillator system of claim 1 wherein the first and the second microelectromechanical resonators are the same physical structure.

12. The oscillator system of claim 1 wherein the first microelectromechancal resonator and the second microelectromechanical resonator include different crystalline orientations, or directions in and/or on the same substrate.

13. An oscillator system, comprising:
a temperature measurement system including:
a first microelectromechanical resonator to generate a first output signal having a frequency that varies with temperature, wherein the first microelectromechanical resonator includes a frequency function of temperature;
a second microelectromechanical resonator to generate a second output signal having a frequency that varies with temperature, wherein the second microelectromechanical resonator includes a frequency function of temperature;

frequency division circuitry, coupled to the first and second microelectromechanical resonators, wherein the frequency division circuitry includes:
circuitry to generate (i) data which is representative of the frequency of the first output signal, and (ii) data which is representative of the frequency of the second output signal; and
analysis circuitry to determine data which is representative of the operating temperature of the first and/or second microelectromechanical resonator by dividing: (i) the data which is representative of the frequency of the first output signal by the data which is representative of the frequency of the second output signal or (ii) the data which is representative of the frequency of the second output signal by the data which is representative of the frequency of the first output signal;
frequency subtraction circuitry, coupled to the first and second microelectromechanical resonators, to generate a third output signal having frequency which is substantially stable over a predetermined operating temperature using the first and second output signals; and
clock alignment circuitry to generate an output signal using the (i) data which is representative of the operating temperature of the first and/or second microelectromechanical resonator, and (ii) the third output signal.

14. The oscillator system of claim 13 wherein the frequency subtraction circuitry includes frequency mixer circuitry.

15. The oscillator system of claim 13 wherein the output signal of the clock alignment circuitry includes a frequency which is substantially stable over a predetermined operating temperature and wherein the clock alignment circuitry generates the output signal using one or more phase locked loops, delay locked loops, frequency locked loops and/or digital/frequency synthesizers.

16. The oscillator system of claim 13 wherein the clock alignment circuitry further includes processor circuitry, coupled to the frequency division circuitry, to determine the operating temperature of the first and/or second microelectromechanical resonator using the data which is representative of the operating temperature of the first and/or second microelectromechanical resonator.

17. The oscillator system of claim 16 wherein:
(i) the clock alignment circuitry generates the output signal having frequency which is substantially stable over a predetermined operating temperature using one or more phase locked loops, delay locked loops, frequency locked loops and/or digital/frequency synthesizers; and
(ii) the processor circuitry, in response to determining a change in operating temperature, changes one or more coefficients of one or more phase locked loops, delay locked loops, frequency locked loops and/or digital/frequency synthesizers of the clock alignment circuitry.

18. The oscillator system of claim 13 wherein the first and the second microelectromechanical resonators are the same physical structure.

19. The oscillator system of claim 13 wherein the first microelectromechanical resonator and the second microelectromechanical resonator include different crystalline orientations, or directions in and/or on the same substrate.

20. An oscillator system, comprising:
a temperature measurement system including:
a first microelectromechanical resonator to generate a first output signal having a frequency that varies with operating temperature, wherein the first microelectromechanical resonator includes a frequency function of temperature;
a second microelectromechanical resonator to generate a second output signal having a frequency that varies with operating temperature, wherein the second microelectromechanical resonator includes a frequency function of temperature;
frequency division circuitry, coupled to the first and second microelectromechanical resonators, to determine data which is representative of the operating temperature of the first and/or second microelectromechanical resonator using (i) data which is representative of the frequency of the first output signal and (ii) data which is representative of the frequency of the second output signal;
frequency mixer circuitry, coupled to the plurality of microelectromechanical resonators, to generate an output signal having frequency that is substantially stable over an operating temperature using the first and second output signals;
clock alignment circuitry, coupled to the temperature measurement system and the frequency mixer circuitry, to generate an output signal using (i) the data which is representative of the operating temperature of the first and/or second microelectromechanical resonator, and (ii) the third output signal; and
wherein the first and second microelectromechanical resonators are disposed on and/or in the same substrate and the frequency division circuitry, the frequency mixer circuitry and the clock alignment circuitry are disposed on and/or in the same substrate.

21. The oscillator system of claim 20 wherein:
(i) the clock alignment circuitry generates the output signal having frequency which is substantially stable over a predetermined operating temperature using one or more phase locked loops, delay locked loops, frequency locked loops and/or digital/frequency synthesizers;
(ii) the clock alignment circuitry further includes circuitry, coupled to the frequency division circuitry, to determine the operating temperature of the first and/or second microelectromechanical resonator using the data which is representative of the operating temperature of the first and/or second microelectromechanical resonator; and
(iii) the circuitry to determine the operating temperature of the first and/or second microelectromechanical resonator, in response to determining a change in operating temperature, changes one or more coefficients of one or more phase locked loops, delay locked loops, frequency locked loops and/or digital/frequency synthesizers of the clock alignment circuitry.

22. The oscillator system of claim 20 wherein the first and second microelectromechanical resonators, frequency division circuitry, frequency mixer circuitry and clock alignment circuitry are disposed on and/or in the same substrate.

23. The oscillator system of claim 20 wherein the frequency mixer circuitry further includes filter circuitry, coupled to the frequency mixer circuitry, to receive an output of the frequency mixer circuitry and to attenuate a frequency difference component or frequency sum component of the output of the frequency mixer circuitry.

24. The oscillator system of claim 23 wherein the frequency mixer circuitry includes digital or analog circuitry.

25. The oscillator system of claim 20 wherein the frequency division circuitry generates data which is representative of the operating temperature of the first and/or second microelectromechanical resonator by dividing (i) the data which is representative of the frequency of the first output signal by the data which is representative of the frequency of the second output signal or (ii) the data which is representative of the frequency of the second output signal by the data which is representative of the frequency of the first output signal.

26. The oscillator system of claim 20 wherein the frequency division circuitry includes counter circuitry and/or analog-to-digital converter circuitry.

27. The oscillator system of claim 20 wherein the first and second microelectromechanical resonators are the same physical structure.

28. The oscillator system of claim 20 wherein the output signal of the clock alignment circuitry includes a frequency which is substantially stable over a predetermined operating temperature and wherein the clock alignment circuitry generates the output signal using (i) one or more phase locked loops, delay locked loops, frequency locked loops and/or digital/frequency synthesizers and (ii) the first output signal.

29. The oscillator system of claim 28 wherein the one or more digital/frequency synthesizers include one or more direct digital synthesizers, frequency synthesizers, fractional synthesizers and/or numerically controlled oscillators.

30. The oscillator system of claim 28 wherein the one or more phase locked loops, delay locked loops, digital/frequency synthesizer and/or frequency locked loops include fractional and/or fine-fractional type phase locked loops, delay locked loops, digital/frequency synthesizer and/or frequency locked loops.

* * * * *